US012604598B2

(12) United States Patent
Hiramatsu et al.

(10) Patent No.: US 12,604,598 B2
(45) Date of Patent: Apr. 14, 2026

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Tomoki Hiramatsu, Kanagawa (JP); Hideaki Togashi, Kanagawa (JP); Nobuhiro Kawai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 368 days.

(21) Appl. No.: 18/043,969

(22) PCT Filed: Sep. 15, 2021

(86) PCT No.: PCT/JP2021/033897
§ 371 (c)(1),
(2) Date: Mar. 3, 2023

(87) PCT Pub. No.: WO2022/065153
PCT Pub. Date: Mar. 31, 2022

(65) Prior Publication Data
US 2023/0403871 A1 Dec. 14, 2023

(30) Foreign Application Priority Data

Sep. 25, 2020 (JP) ................................. 2020-161366

(51) Int. Cl.
*H10K 39/32* (2023.01)
*H10F 39/00* (2025.01)
*H10F 39/18* (2025.01)

(52) U.S. Cl.
CPC ......... *H10K 39/32* (2023.02); *H10F 39/1825* (2025.01); *H10F 39/8027* (2025.01);
(Continued)

(58) Field of Classification Search
CPC ...... H10K 39/32; H10K 30/81; H10K 39/601; H10F 39/1825; H10F 39/8027;
(Continued)

(56) References Cited

U.S. PATENT DOCUMENTS 11,817,466 B2 * 11/2023 Togashi ................ G01J 1/0488
12,035,063 B2 * 7/2024 Shiina .................. H04N 25/766
(Continued)

FOREIGN PATENT DOCUMENTS

EP          3678180 A1      7/2020
JP        2016-063156       4/2016
(Continued)

OTHER PUBLICATIONS

International Search Report and Written Opinion prepared by the Japan Patent Office on Nov. 19, 2021, for International Application No. PCT/JP2021/033897, 3 pgs.

*Primary Examiner* — Bitew A Dinke
(74) *Attorney, Agent, or Firm* — SHERIDAN ROSS P.C.

(57) ABSTRACT

The quantum efficiency can be improved. A solid-state imaging device according to an embodiment includes: a plurality of pixels arranged in a matrix, in which each of the pixels includes a first semiconductor layer, a photoelectric conversion section disposed on the first semiconductor layer on a side of a first surface, an accumulation electrode disposed on the first semiconductor layer close to a side of a second surface on a side opposite to the first surface, a wiring extending from the second surface of the first semiconductor layer, a floating diffusion region connected to the first semiconductor layer via the wiring, and a first gate electrode disposed close to the wiring.

20 Claims, 42 Drawing Sheets

(52) U.S. Cl.
      CPC ..... *H10F 39/8037* (2025.01); *H10F 39/8053*
      (2025.01); *H10F 39/807* (2025.01); *H10F*
      *39/811* (2025.01)

(58) Field of Classification Search
      CPC ............. H10F 39/8037; H10F 39/8053; H10F
      39/807; H10F 39/811; H10F 39/192;
      H10F 39/184; H10F 39/199; H10F
      39/802; H10F 39/812; H10F 39/806
      See application file for complete search history.

(56) References Cited

U.S. PATENT DOCUMENTS

| | | | | |
|---|---|---|---|---|
| 2010/0026865 | A1* | 2/2010 | Tivarus | H10F 39/1847 |
| | | | | 348/308 |
| 2012/0188397 | A1* | 7/2012 | Ohta | H10F 39/199 |
| | | | | 348/222.1 |
| 2018/0219046 | A1 | 8/2018 | Yamaguchi et al. | |
| 2019/0019835 | A1 | 1/2019 | Tanaka et al. | |
| 2019/0096932 | A1* | 3/2019 | Hseih | G01J 1/16 |
| 2019/0110686 | A1* | 4/2019 | Kato | A61B 1/043 |
| 2019/0148457 | A1* | 5/2019 | Lee | H10F 39/182 |
| | | | | 257/40 |
| 2019/0189696 | A1* | 6/2019 | Yamaguchi | G02B 5/201 |
| 2019/0214417 | A1 | 7/2019 | Matsuo | |
| 2019/0378867 | A1* | 12/2019 | Park | H10F 39/184 |
| 2020/0105815 | A1* | 4/2020 | Huang | H10F 39/8053 |
| 2020/0127030 | A1* | 4/2020 | Ogawa | H10F 39/024 |
| 2021/0020857 | A1* | 1/2021 | Hirata | H10F 39/011 |
| 2021/0082987 | A1 | 3/2021 | Kawai et al. | |
| 2021/0104564 | A1* | 4/2021 | Kawai | H10F 39/8057 |
| 2021/0233948 | A1* | 7/2021 | Joei | H10F 39/812 |
| 2021/0249474 | A1* | 8/2021 | Togashi | H10K 39/32 |
| 2021/0288111 | A1* | 9/2021 | Joei | H10F 39/812 |
| 2021/0327939 | A1* | 10/2021 | Togo | H10F 39/811 |
| 2022/0045117 | A1* | 2/2022 | Huang | H10F 39/8067 |
| 2023/0230999 | A1* | 7/2023 | Hiramatsu | H10F 39/8023 |
| 2024/0055465 | A1* | 2/2024 | Murata | H10K 39/15 |
| 2025/0221142 | A1* | 7/2025 | Hirata | H10K 39/32 |

FOREIGN PATENT DOCUMENTS

| | | | | |
|---|---|---|---|---|
| JP | 2017-037952 | | 2/2017 | |
| JP | 2017-157816 | | 9/2017 | |
| JP | 2018046039 | A | 3/2018 | |
| JP | 2019057704 | A | 4/2019 | |
| KR | 20200043999 | A | 4/2020 | |
| KR | 20200097243 | A | 8/2020 | |
| TW | 202015207 | A | 4/2020 | |
| WO | WO 2017/126326 | | 7/2017 | |
| WO | WO 2018/047517 | | 3/2018 | |
| WO | WO-2019035254 | A1 * | 2/2019 | ............. H10K 39/32 |
| WO | WO 2019/044103 | | 3/2019 | |
| WO | WO 2019/058994 | | 3/2019 | |
| WO | WO-2019058994 | A1 * | 3/2019 | ............. H10K 39/32 |
| WO | WO 2019/124136 | | 6/2019 | |
| WO | WO-2019124136 | A1 * | 6/2019 | ............. H04N 25/76 |
| WO | WO 2019/151049 | | 8/2019 | |
| WO | WO-2019181456 | A1 * | 9/2019 | ............. H10K 30/20 |
| WO | WO-2019225250 | A1 * | 11/2019 | ............. H04N 25/76 |
| WO | WO-2019240121 | A1 * | 12/2019 | ............. H04N 25/70 |
| WO | WO-2020017330 | A1 * | 1/2020 | ............. H04N 25/76 |
| WO | WO-2020022462 | A1 * | 1/2020 | ............. H04N 25/76 |
| WO | WO-2020166309 | A1 * | 8/2020 | ....... H10F 39/80373 |

\* cited by examiner

FD   TG    MEM    TX    ASE    SLD
=    =     =     =     =     =
OFF   ON   OFF   ON   OFF

FD   TG    MEM    TX    ASE    SLD
=    =     =     =     =     =
OFF   ON   OFF   OFF   OFF

FD  TG  MEM  TX  ASE  SLD
=   =   =    =   =    =
OFF  ON  OFF  ON  OFF

FD  TG  MEM  TX  ASE  SLD
=   =   =    =   =    =
OFF  OFF  OFF  ON  OFF

FD   TG   MEM   TX   ASE   SLD
      ||    ||    ||    ||    ||
     OFF   ON    ON   OFF   OFF

FD   TG   MEM   TX   ASE   SLD
      ||    ||    ||    ||    ||
     ON   OFF   OFF   ON   OFF

Figure 56:
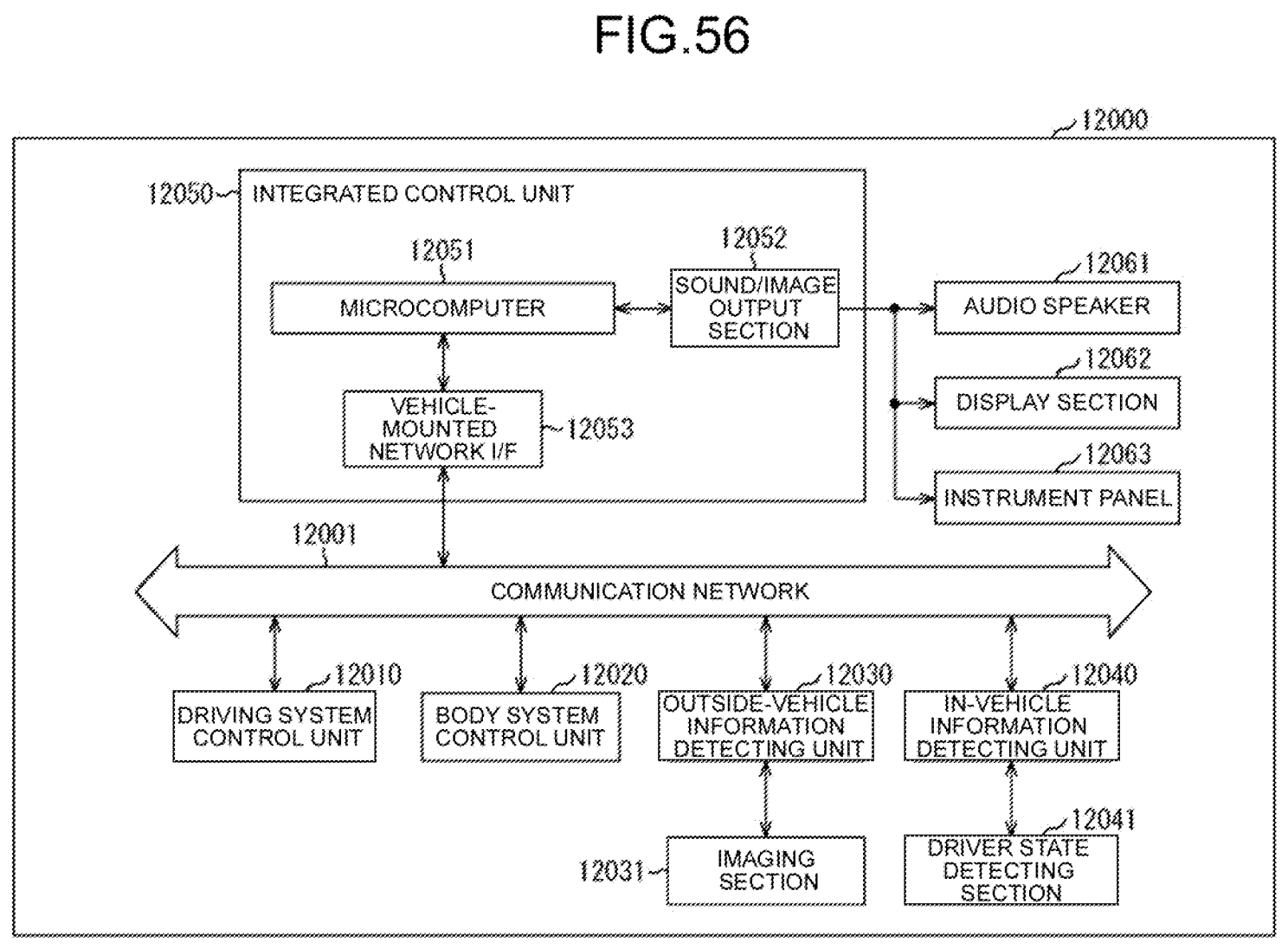

INTEGRATED CONTROL UNIT 12050

MICROCOMPUTER 12051

VEHICLE-MOUNTED NETWORK I/F 12053

SOUND/IMAGE OUTPUT SECTION 12052

AUDIO SPEAKER 12061

DISPLAY SECTION 12062

INSTRUMENT PANEL 12063

COMMUNICATION NETWORK 12001

DRIVING SYSTEM CONTROL UNIT 12010

BODY SYSTEM CONTROL UNIT 12020

OUTSIDE-VEHICLE INFORMATION DETECTING UNIT 12030

IMAGING SECTION 12031

IN-VEHICLE INFORMATION DETECTING UNIT 12040

DRIVER STATE DETECTING SECTION 12041

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2021/033897, having an international filing date of 15 Sep. 2021, which designated the United States, which PCT application claimed the benefit of Japanese Patent Application No. 2020-161366, filed 25 Sep. 2020, the entire disclosures of each of which are incorporated herein by reference.

FIELD

The present disclosure relates to a solid-state imaging device and an electronic apparatus.

BACKGROUND

In recent years, a stacked-type image sensor in which a plurality of photoelectric conversion elements is stacked in a substrate thickness direction of a semiconductor substrate has been proposed. For example, Patent Literature 1 proposes, as a method for solving false colors, a stacked-type solid-state imaging device in which photoelectric conversion regions that photoelectrically convert light of respective wavelengths of green, blue, and red are stacked in the longitudinal direction of the same pixel, and the green photoelectric conversion region is constituted by an organic photoelectric conversion film. In addition, Patent Literature 2 proposes a structure in which charges generated by photoelectric conversion and accumulated on the upper side of the accumulation electrode are transferred in the longitudinal direction to a collection electrode installed below the accumulation electrode.

CITATION LIST

Patent Literature

Patent Literature 1: JP 2017-157816 A
Patent Literature 2: JP 2016-63156 A

SUMMARY

Technical Problem

However, in the conventional stacked-type solid-state imaging device, there is a problem that the charges generated in the organic photoelectric conversion film cannot be efficiently stored in the semiconductor layer positioned below the organic photoelectric conversion film, decreasing the quantum efficiency.

Therefore, the present disclosure proposes a solid-state imaging device and an electronic apparatus capable of improving quantum efficiency.

Solution to Problem

To solve the problems described above, a solid-state imaging device according to an embodiment of the present disclosure includes: a plurality of pixels arranged in a matrix, wherein each of the pixels includes a first semiconductor layer, a photoelectric conversion section disposed on the first semiconductor layer on a side of a first surface, an accumulation electrode disposed on the first semiconductor layer close to a side of a second surface on a side opposite to the first surface, a wiring extending from the second surface of the first semiconductor layer, a floating diffusion region connected to the first semiconductor layer via the wiring, and a first gate electrode disposed close to the wiring.

BRIEF DESCRIPTION OF DRAWINGS

FIG. 56 is a block diagram depicting an example of schematic configuration of a vehicle control system.

DESCRIPTION OF EMBODIMENTS

Figure 1:
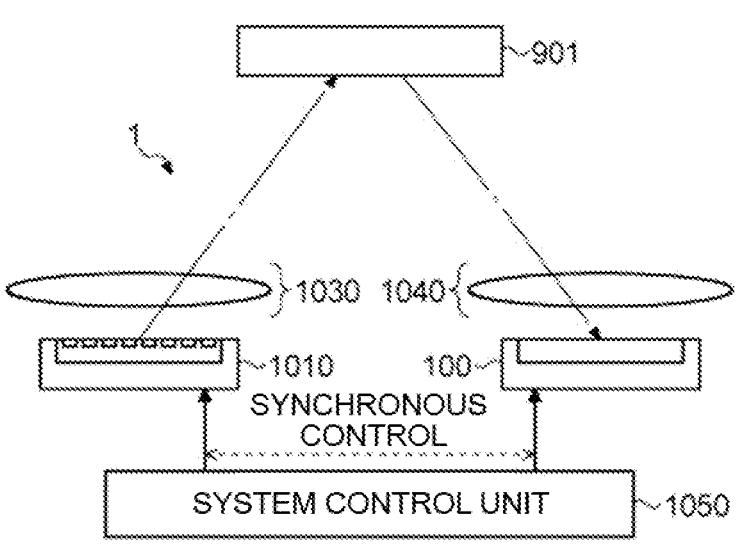
FIG. 1 is a schematic diagram depicting a schematic configuration example of an electronic apparatus according to one embodiment.

Hereinafter, embodiments of the present disclosure will be described in detail with reference to the drawings. Note that, in each of the following embodiments, the same parts are denoted by the same reference numerals, and redundant description will be omitted.

In addition, the present disclosure will be described according to the following item order.

1. One embodiment
1.1 System configuration example
1.2 Configuration example of solid-state imaging device
1.3 Stacked structure example of solid-state imaging device
1.4 Configuration example of unit pixel
1.5 Circuit configuration example of unit pixel
1.5.1 Modification of circuit configuration
1.6 Cross-sectional structure example of unit pixel
1.7 Material of each layer
1.8 Modification of unit pixel
1.8.1 Configuration example of unit pixel
1.8.2 Circuit configuration example of unit pixel
1.8.3 Cross-sectional structure example of unit pixel
1.9 Improvement of quantum efficiency
1.9.1 First example
1.9.2 Second example
1.9.3 Third example
1.9.4 Fourth example
1.9.5 Fifth example
1.9.6 Sixth example 1.9.7 Seventh example
1.9.8 Eighth example
1.9.9 Ninth example
1.9.10 10th example
1.9.11 11th example
1.9.12 12th example
1.9.13 13th example
1.9.14 14th example
1.9.15 15th example
1.9.16 16th example
1.9.17 17th example
1.9.18 18th example
1.9.19 19th example
1.9.20 20th example
1.10 Pixel drive example
1.10.1 First drive example
1.10.2 Second drive example
1.10.3 Third drive example
1.11 Summary
2. Variation of cross-sectional structure
2.1 First variation
2.2 Second variation
3. Configuration example of imaging device
4. Application example to mobile body
5. Application example to endoscopic surgery system

1. One Embodiment

First, a solid-state imaging device (hereinafter, referred to as an image sensor), an electronic apparatus, and a recognition system according to one embodiment will be described in detail with reference to the drawings. Note that, in the present embodiment, a case where the technology according to the present embodiment is applied to a complementary metal-oxide semiconductor (CMOS) image sensor will be exemplified, but the present invention is not limited to this. For example, the technology according to the present embodiment can be applied to various sensors including a photoelectric conversion element, such as a charge-coupled device (CCD) image sensor, a time-of-flight (ToF) sensor, and a synchronous type or an asynchronous type event visio sensor (EVS). Note that the CMOS image sensor may be an image sensor created by applying or partially using a CMOS process.

1.1 System Configuration Example

Figure 2:
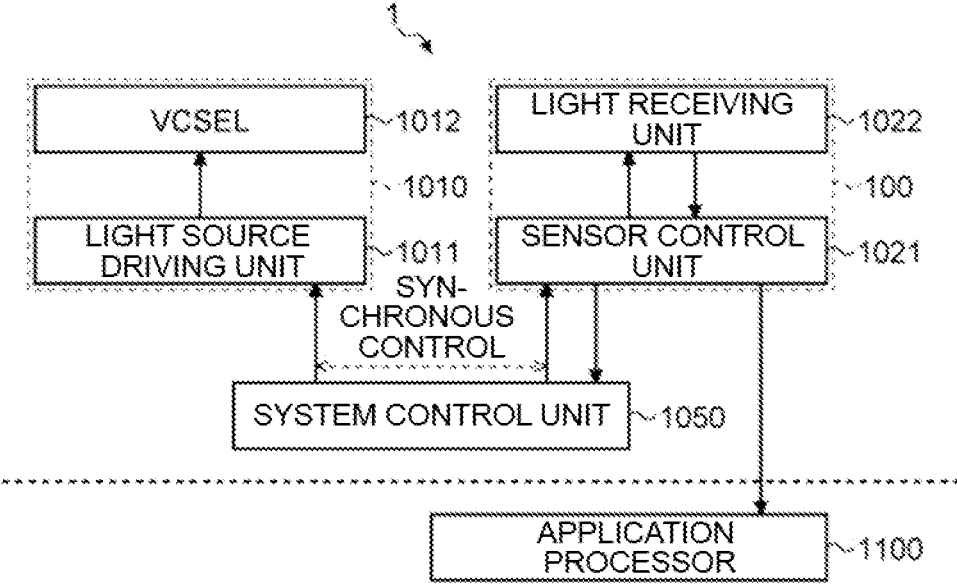
FIG. 2 is a block diagram depicting a schematic configuration example of a distance measuring device using an electronic apparatus according to one embodiment.

FIG. 1 is a schematic diagram depicting a schematic configuration example of an electronic apparatus according to the present embodiment, and FIG. 2 is a block diagram depicting a schematic configuration example of a distance measuring device using an electronic apparatus according to the present embodiment.

As depicted in FIG. 1, an electronic apparatus 1 according to the present embodiment includes a laser light source 1010, an irradiation lens 1030, an imaging lens 1040, an image sensor 100, and a system control unit 1050.

As depicted in FIG. 2, the laser light source 1010 includes, for example, a vertical cavity surface emitting laser (VCSEL) 1012 and a light source driving unit 1011 that drives the VCSEL 1012. However, the present invention is not limited to the VCSEL 1012, and various light sources such as a light emitting diode (LED) may be used. In addition, the laser light source 1010 may be any of a point light source, a surface light source, and a line light source. In the case of a surface light source or a line light source, the laser light source 1010 may have, for example, a configuration in which a plurality of point light sources (for example, VCSELs) is arranged one-dimensionally or two-dimensionally. Note that, in the present embodiment, the laser light source 1010 may emit light of a wavelength band different from the wavelength band of visible light, such as infrared (IR) light, for example.

The irradiation lens 1030 is disposed on an emission surface side of the laser light source 1010, and converts light emitted from the laser light source 1010 into irradiation light having a predetermined divergence angle.

The imaging lens 1040 is disposed on the light receiving surface side of the image sensor 100, and forms an image by incident light on the light receiving surface of the image sensor 100. The incident light can also include reflected light emitted from the laser light source 1010 and reflected by a subject 901.

As will be described in detail later, the image sensor 100 includes, for example, a light receiving unit 1022 in which a plurality of pixels is arranged in a two-dimensional lattice shape, and a sensor control unit 1021 that drives the light receiving unit 1022 to generate image data, as depicted in FIG. 2. The pixels disposed in the light receiving unit 1022 may include, for example, a pixel that detects light in a wavelength band of visible light, a pixel that detects light in a wavelength band other than visible light, for example, light in a wavelength band of infrared light, and the like. At this time, a pixel that detects light in a wavelength band other than visible light may be a pixel (for an image sensor) for generating image data of light in a wavelength band other than visible light, a pixel (for a ToF sensor) for measuring a distance to an object, or a pixel (for EVS) for detecting a luminance change. Hereinafter, for simplification of description, all data read out from each pixel of the light receiving unit 1022 and generated is referred to as image data.

The system control unit 1050 includes, for example, a processor (CPU), and drives the VCSEL 1012 via the light source driving unit 1011. In addition, the system control unit 1050 acquires image data by controlling the image sensor 100. At that time, the system control unit 1050 may acquire image data obtained by detecting reflected light of irradiation light emitted from the laser light source 1010 by controlling the image sensor 100 in synchronization with control of the laser light source 1010.

For example, the irradiation light emitted from the laser light source 1010 is projected onto the subject (also referred to as a measurement target or an object) 901 through the irradiation lens 1030. The projected light is reflected by the subject 901. Then, the light reflected by the subject 901 is incident on the image sensor 100 through the imaging lens 1040. The light receiving unit 1022 in the image sensor 100 receives the reflected light reflected by the subject 901 and generates image data. The image data generated by the image sensor 100 is supplied to an application processor 1100 of the electronic apparatus 1. The application processor 1100 can execute various types of processing such as recognition processing and arithmetic processing on the image data input from the image sensor 100.

1.2 Configuration Example of Solid-State Imaging Device

Figure 3:
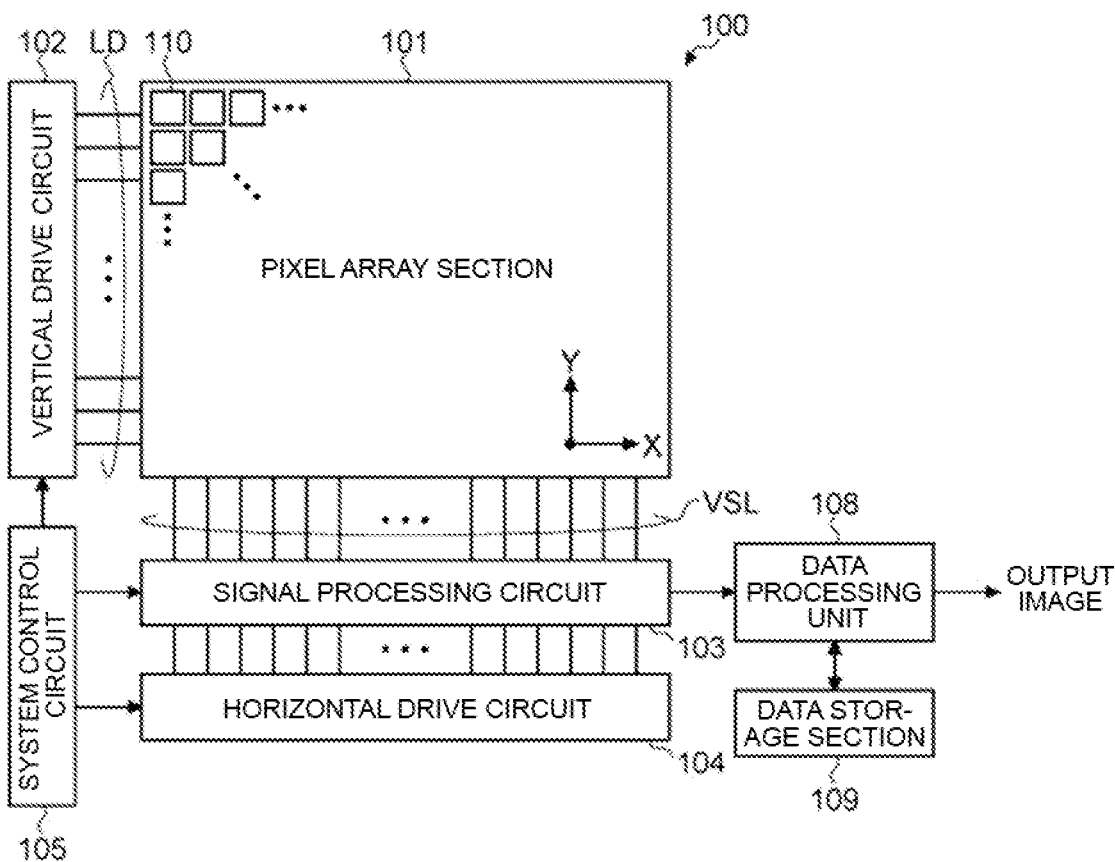
FIG. 3 is a block diagram depicting a schematic configuration example of an image sensor in one embodiment.

FIG. 3 is a block diagram depicting a schematic configuration example of an image sensor in the present embodiment. As depicted in FIG. 3, the image sensor 100 includes, for example, a pixel array section 101, a vertical drive circuit 102, a signal processing circuit 103, a horizontal drive circuit 104, a system control circuit 105, a data processing unit 108, and a data storage section 109. In the following description, the vertical drive circuit 102, the signal processing circuit 103, the horizontal drive circuit 104, the system control circuit 105, the data processing unit 108, and the data storage section 109 are also referred to as peripheral circuits.

The pixel array section 101 has a configuration in which pixels (hereinafter, referred to as a unit pixel) 110 having photoelectric conversion elements that generate and accumulate charges according to the amount of received light are disposed in a row direction and a column direction, that is, in a two-dimensional lattice shape (hereinafter, also referred to as a matrix). Here, the row direction refers to an arrangement direction of pixels in a pixel row (lateral direction in drawings), and the column direction refers to an arrangement direction of pixels in a pixel column (longitudinal direction in drawings).

In the pixel array section 101, a pixel drive line LD is wired along the row direction for each pixel row, and a vertical signal line VSL is wired along the column direction for each pixel column with respect to the matrix-like pixel array. The pixel drive line LD transmits a drive signal for driving when a signal is read out from a pixel. In FIG. 3, the pixel drive lines LD are depicted as wiring lines one by one, but are not limited to wiring lines one by one. One end of the pixel drive line LD is connected to an output terminal corresponding to each row of the vertical drive circuit 102.

The vertical drive circuit 102 includes a shift register, an address decoder, and the like, and drives each pixel of the pixel array section 101 simultaneously for all pixels or in units of rows. That is, the vertical drive circuit 102 includes a driving unit that controls the operation of each pixel of the pixel array section 101 together with the system control circuit 105 that controls the vertical drive circuit 102. Although a specific configuration of the vertical drive circuit 102 is not depicted, the vertical drive circuit 102 generally includes two scanning systems of a readout scanning system and a sweep scanning system.

In order to read out a signal from the each pixel of the unit pixel 110, the readout scanning system sequentially selects and scans each pixel of the unit pixel 110 of the pixel array section 101 in units of rows. The signal read out from each pixel of the unit pixel 110 is an analog signal. The sweep scanning system performs sweep scanning on a read row on which read scanning is performed by the readout scanning system prior to the readout scanning by an exposure time.

By the sweep scanning by the sweep scanning system, unnecessary charges are swept out from the photoelectric conversion element of each pixel of the unit pixel 110 of the read row, and the photoelectric conversion element is reset. Then, by sweeping out (resetting) unnecessary charges in the sweeping scanning system, a so-called electronic shutter operation is performed. Here, the electronic shutter operation refers to an operation of discarding charges of the photoelectric conversion element and newly starting exposure (starting accumulation of charges).

The signal read out by the readout operation by the readout scanning system corresponds to the amount of light received after the immediately preceding readout operation or electronic shutter operation. Then, a period from the readout timing by the immediately preceding readout operation or the sweep timing by the electronic shutter operation to the readout timing by the current readout operation is the charge accumulation period (exposure period) in each pixel of the unit pixel 110.

The signal output from each unit pixel 110 of the pixel row selectively scanned by the vertical drive circuit 102 is input to the signal processing circuit 103 through each of the vertical signal line VSL for each pixel column. The signal processing circuit 103 performs predetermined signal processing on the signal output from each unit pixel of the selected row through the vertical signal line VSL for each pixel column of the pixel array section 101, and temporarily holds the pixel signal after the signal processing.

Specifically, the signal processing circuit 103 performs at least noise removal processing, for example, correlated double sampling (CDS) processing as signal processing and double data sampling (DDS). For example, by the CDS processing, fixed pattern noise unique to pixels such as reset noise and threshold variation of the amplification transistor in the pixel is removed. The signal processing circuit 103 also has, for example, an analog-digital (AD) conversion function, converts an analog pixel signal read out from the photoelectric conversion element into a digital signal, and outputs the digital signal.

The horizontal drive circuit 104 includes a shift register, an address decoder, and the like, and sequentially selects a readout circuit (hereinafter, referred to as a pixel circuit) corresponding to the pixel column of the signal processing circuit 103. By the selective scanning by the horizontal drive circuit 104, the pixel signals subjected to the signal processing for each pixel circuit in the signal processing circuit 103 are sequentially output.

The system control circuit 105 includes a timing generator that generates various timing signals and the like, and performs drive control of the vertical drive circuit 102, the signal processing circuit 103, and the horizontal drive circuit 104 based on various timings generated by the timing generator.

The data processing unit 108 has at least an arithmetic processing function, and performs various types of signal processing such as arithmetic processing on the pixel signal output from the signal processing circuit 103. The data storage section 109 temporarily stores data necessary for signal processing in the data processing unit 108.

Note that the image data output from the data processing unit 108 may be subjected to predetermined processing in the application processor 1100 and the like in the electronic apparatus 1 equipped with the image sensor 100, or may be transmitted to the outside via a predetermined network, for example.

1.3 Stacked Structure Example of Solid-State Imaging Device

Figure 4:
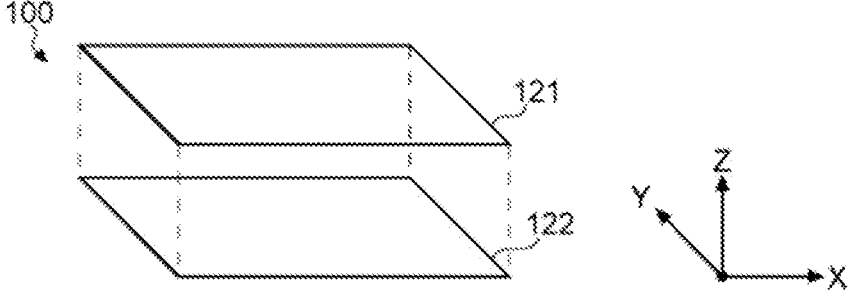
FIG. 4 is a diagram depicting a stacked structure example of the image sensor according to one embodiment.

FIG. 4 is a diagram depicting a stacked structure example of the image sensor according to the present embodiment. As depicted in FIG. 4, the image sensor 100 has a stack structure in which a light receiving chip 121 and a circuit chip 122 are vertically stacked. The light receiving chip 121 may be, for example, a semiconductor chip including a pixel array section 101 in which a plurality of unit pixels 110 are arranged in a matrix, and the circuit chip 122 may be, for example, a semiconductor chip including a peripheral circuit and the like in FIG. 3.

For bonding the light receiving chip 121 and the circuit chip 122, for example, so-called direct bonding can be used, in which the bonding surfaces are planarized and both are bonded to each other by an electronic force. However, the present invention is not limited to this, and for example, so-called Cu—Cu bonding in which copper (Cu) electrode pads formed on the bonding surfaces are bonded to each other, bump bonding, and the like can also be used.

In addition, the light receiving chip 121 and the circuit chip 122 are electrically connected via a connecting section such as a through-silicon via (TSV) penetrating the semiconductor substrate, for example. For the connection using the TSV, for example, a so-called twin TSV method in which two TSVs, that is, a TSV provided in the light receiving chip 121 and a TSV provided from the light receiving chip 121 to the circuit chip 122 are connected by an outer surface of the chip, a so-called shared TSV method in which both are connected by a TSV penetrating from the light receiving chip 121 to the circuit chip 122, and the like can be adopted.

However, in a case where Cu—Cu bonding or bump bonding is used for bonding the light receiving chip 121 and the circuit chip 122, both are electrically connected via a Cu—Cu bonding portion or a bump bonding portion.

1.4 Configuration Example of Unit Pixel

Next, a configuration example of the unit pixel 110 will be described. Note that, here, a case where the unit pixel 110 includes a pixel (hereinafter, also referred to as an RGB pixel 10) that detects each color component in the three primary colors of RGB and a pixel (hereinafter, also referred to as an IR pixel 20) that detects infrared (IR) light will be described as an example. Note that, in FIG. 5 and the following description, in a case where color filters 31r, 31g, and 31b that transmit the light of the respective color components constituting the three primary colors of RGB are not distinguished, the reference numeral is 31.

Figure 5:
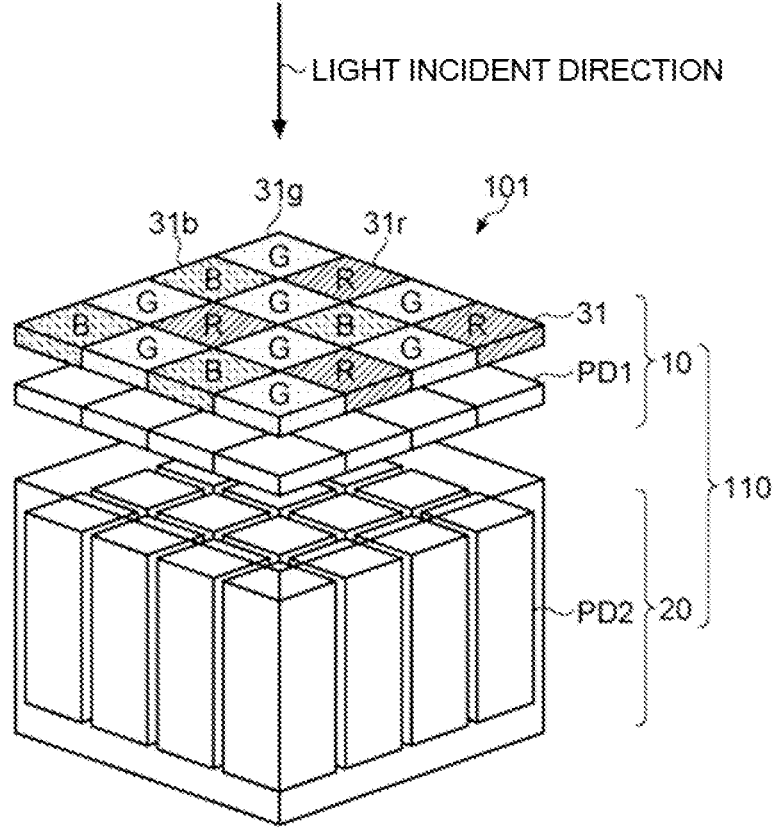
FIG. 5 is a schematic diagram depicting a schematic configuration example of a pixel array section according to one embodiment.

FIG. 5 is a schematic diagram depicting a schematic configuration example of a pixel array section according to the present embodiment. As depicted in FIG. 5, the pixel array section 101 has a configuration in which the unit pixels 110 having a structure in which the unit pixels 110 including the RGB pixels 10 and the IR pixels 20 are arranged along the light incident direction are arranged in a two-dimensional lattice shape. That is, in the present embodiment, the RGB pixels 10 and the IR pixels 20 are positioned in the direction vertical to the arrangement direction (plane direction) of the unit pixels 110, and the light transmitted through the RGB pixels 10 positioned on the upstream side in the optical path of the incident light is configured to be incident on the IR pixels 20 positioned on the downstream side of the RGB pixels 10. According to such a configuration, a photoelectric conversion section PD2 of the IR pixel 20 is disposed on the surface side opposite to the incident surface of the incident light in a photoelectric conversion section PD1 of the RGB pixel 10. As a result, in the present embodiment, the optical axes of the incident light of the RGB pixel 10 and the IR pixel 20 arranged along the light incident direction coincide or substantially coincide with each other.

Note that, in the present embodiment, a case where the photoelectric conversion section PD1 constituting the RGB pixel 10 is made of an organic material and the photoelectric conversion section PD2 constituting the IR pixel 20 is made of a semiconductor material such as silicon is exemplified, but the present invention is not limited to this. For example, both the photoelectric conversion section PD1 and the photoelectric conversion section PD2 may be made of a semiconductor material, both the photoelectric conversion section PD1 and the photoelectric conversion section PD2 may be made of an organic material, or the photoelectric conversion section PD1 may be made of a semiconductor material and the photoelectric conversion section PD2 may be made of an organic material. Alternatively, at least one of the photoelectric conversion section PD1 and the photoelectric conversion section PD2 may be made of a photoelectric conversion material different from the organic material and the semiconductor material.

1.5 Circuit Configuration Example of Unit Pixel

Figure 6:
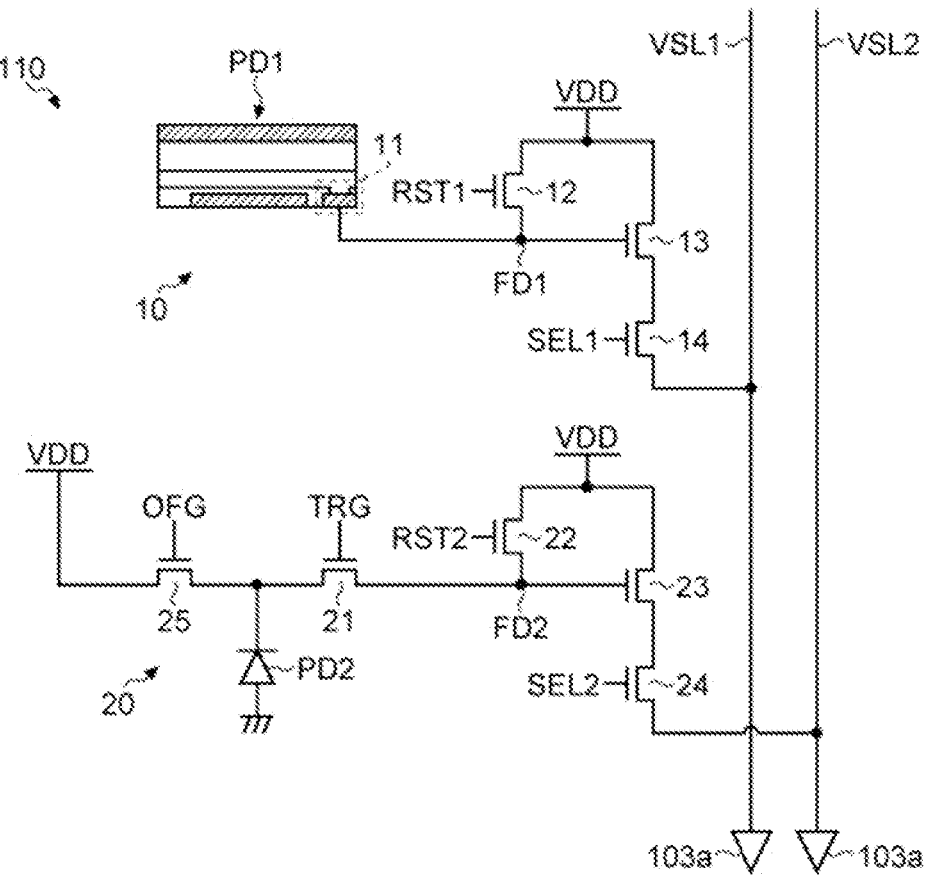
FIG. 6 is a circuit diagram depicting a schematic configuration example of a unit pixel according to one embodiment.

Next, a circuit configuration example of the unit pixel 110 will be described. FIG. 6 is a circuit diagram depicting a schematic configuration example of a unit pixel according to the present embodiment. As depicted in FIG. 6, in the present example, the unit pixel 110 includes one RGB pixel 10 and one IR pixel 20.

(RGB Pixel 10)

The RGB pixel 10 includes, for example, the photoelectric conversion section PD1, a transfer gate 11, a floating diffusion region FD1, a reset transistor 12, an amplification transistor 13, and a selection transistor 14.

A selection control line included in the pixel drive line LD is connected to the gate of the selection transistor 14, a reset control line included in the pixel drive line LD is connected to the gate of the reset transistor 12, and a transfer control line included in the pixel drive line LD is connected to an accumulation electrode (see an accumulation electrode 37 in FIG. 8 to be described later) to be described later of the transfer gate 11. In addition, a vertical signal line VSL1 having one end connected to the signal processing circuit 103 is connected to the drain of the amplification transistor 13 via the selection transistor 14.

In the following description, the reset transistor 12, the amplification transistor 13, and the selection transistor 14 are also collectively referred to as a pixel circuit. The pixel circuit may include the floating diffusion region FD1 and/or the transfer gate 11.

The photoelectric conversion section PD1 is made of, for example, an organic material, and photoelectrically converts incident light. The transfer gate 11 transfers the charges generated in the photoelectric conversion section PD1. The floating diffusion region FD1 accumulates the charges transferred by the transfer gate 11. The amplification transistor 13 causes a pixel signal having a voltage value corresponding to the charges accumulated in the floating diffusion region FD1 to appear in the vertical signal line VSL1. The reset transistor 12 releases the charges accumulated in the floating diffusion region FD1. The selection transistor 14 selects the RGB pixel 10 to be read out.

The anode of the photoelectric conversion section PD1 is grounded, and the cathode is connected to the transfer gate 11. Although the photoelectric conversion section PD1 will be described in detail later with reference to FIG. 8, for example, the accumulation electrode 37 is disposed close. At the time of exposure, a voltage for collecting charges generated in the photoelectric conversion section PD1 to a semiconductor layer 35 near the accumulation electrode 37 is applied to the accumulation electrode 37 via the transfer control line. At the time of reading, a voltage for causing charges collected in the semiconductor layer 35 near the accumulation electrode 37 to flow out through a readout electrode 36 is applied to the accumulation electrode 37 through the transfer control line.

The charges flowing out through the readout electrode 36 are accumulated in the floating diffusion region FD1 including a wiring structure connecting the readout electrode 36, the source of the reset transistor 12, and the gate of the amplification transistor 13. Note that the drain of the reset transistor 12 may be connected to, for example, a power supply voltage VDD or a power supply line to which a reset voltage lower than the power supply voltage VDD is supplied.

The source of the amplification transistor 13 may be connected to a power supply line via, for example, a constant current circuit (not depicted) and the like. The drain of the amplification transistor 13 is connected to the source of the selection transistor 14, and the drain of the selection transistor 14 is connected to the vertical signal line VSL1.

The floating diffusion region FD1 converts the accumulated charges into a voltage of a voltage value corresponding to the charge amount. Note that the floating diffusion region FD1 may be, for example, a ground capacity. However, the present invention is not limited to this, and the floating diffusion region FD1 may be a capacity and the like added by intentionally connecting a capacitor and the like to a node where the drain of the transfer gate 11, the source of the reset transistor 12, and the gate of the amplification transistor 13 are connected.

The vertical signal line VSL1 is connected to an analog-to-digital (AD) conversion circuit 103a provided for each column (that is, for each vertical signal line VSL1) in the signal processing circuit 103. The AD conversion circuit 103a includes, for example, a comparator and a counter, and converts an analog pixel signal into a digital pixel signal by comparing a reference voltage such as a single slope or a ramp shape input from an external reference voltage generation circuit (digital-to-analog converter (DAC)) with the pixel signal appearing in the vertical signal line VSL1. Note that the AD conversion circuit 103a may include, for example, a correlated double sampling (CDS) circuit and the like, and may be configured to be able to reduce kTC noise and the like.

(IR Pixel 20)

The IR pixel 20 includes, for example, the photoelectric conversion section PD2, a transfer transistor 21, a floating diffusion region FD2, a reset transistor 22, an amplification transistor 23, a selection transistor 24, and a discharge transistor 25. That is, in the IR pixel 20, the transfer gate 11 in the RGB pixel 10 is replaced with the transfer transistor 21, and the discharge transistor 25 is added.

The connection relationship among the floating diffusion region FD2, the reset transistor 22, and the amplification transistor 23 with respect to the transfer transistor 21 may be similar to the connection relationship among the floating diffusion region FD1, the reset transistor 12, and the amplification transistor 13 with respect to the transfer gate 11 in the RGB pixel 10. In addition, the connection relationship among the amplification transistor 23, the selection transistor 24, and a vertical signal line VSL2 may be similar to the connection relationship among the amplification transistor 13, the selection transistor 14, and the vertical signal line VSL1 in the RGB pixel 10.

The source of the transfer transistor 21 is connected to, for example, the cathode of the photoelectric conversion section PD2, and the drain is connected to the floating diffusion region FD2. In addition, the transfer control line included in the pixel drive line LD is connected to the gate of the transfer transistor 21.

The source of the discharge transistor 25 may be connected to, for example, the cathode of the photoelectric conversion section PD2, and the drain may be connected to the power supply voltage VDD or a power supply line to which a reset voltage lower than the power supply voltage VDD is supplied. In addition, the discharge control line included in the pixel drive line LD is connected to the gate of the discharge transistor 25.

In the following description, the reset transistor 22, the amplification transistor 23, and the selection transistor 24 are also collectively referred to as a pixel circuit. The pixel circuit may include one or more of the floating diffusion region FD2, the transfer transistor 21, and the discharge transistor 25.

The photoelectric conversion section PD2 is made of, for example, a semiconductor material, and photoelectrically converts incident light. The transfer transistor 21 transfers the charges generated in the photoelectric conversion section PD2. The floating diffusion region FD2 accumulates the charges transferred by the transfer transistor 21. The amplification transistor 23 causes a pixel signal having a voltage value corresponding to the charges accumulated in the floating diffusion region FD2 to appear in the vertical signal line VSL2. The reset transistor 22 releases the charges accumulated in the floating diffusion region FD2. The selection transistor 24 selects the IR pixel 20 to be read out.

The anode of the photoelectric conversion section PD2 is grounded, and the cathode is connected to the transfer transistor 21. The drain of the transfer transistor 21 is connected to the source of the reset transistor 22 and the gate of the amplification transistor 23, and a wiring structure connecting these components constitutes the floating diffusion region FD2. The charges flowing out from the photoelectric conversion section PD2 via the transfer transistor 21 are accumulated in the floating diffusion region FD2.

The floating diffusion region FD2 converts the accumulated charges into a voltage of a voltage value corresponding to the charge amount. Note that the floating diffusion region FD2 may be, for example, a ground capacity. However, the present invention is not limited to this, and the floating diffusion region FD2 may be a capacity and the like added by intentionally connecting a capacitor and the like to a node where the drain of the transfer transistor 21, the source of the reset transistor 22, and the gate of the amplification transistor 23 are connected.

The discharge transistor 25 is turned on when discharging the charges accumulated in the photoelectric conversion section PD2 and resetting the photoelectric conversion section PD2. As a result, the charges accumulated in the photoelectric conversion section PD2 flow out to the power supply line via the discharge transistor 25, and the photoelectric conversion section PD2 is reset to an unexposed state.

Similarly to the vertical signal line VSL1, the vertical signal line VSL2 is connected to the AD conversion circuit 103a provided for each column (that is, for each vertical signal line VSL2) in an IR signal processing circuit 103B

1.5.1 Modification of Circuit Configuration

Figure 7:
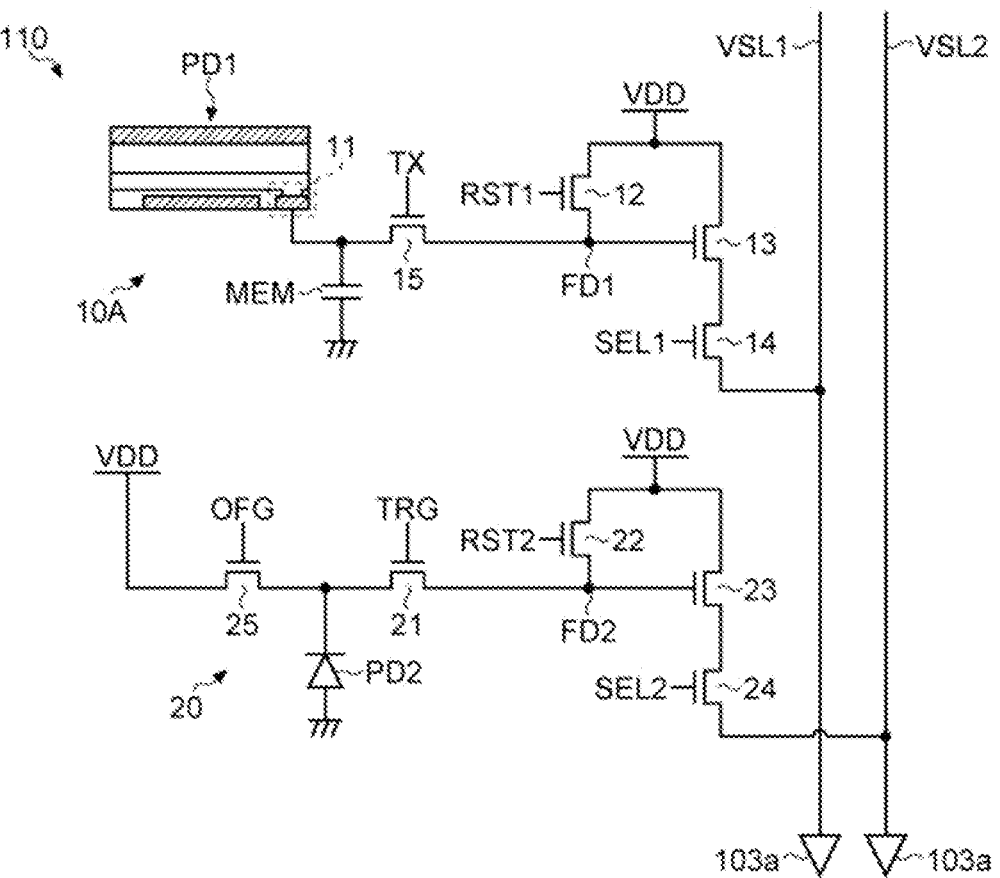
FIG. 7 is a circuit diagram depicting a schematic configuration example of a unit pixel according to a modification of one embodiment.

Here, a circuit configuration that enables so-called global shutter method readout drive for the RGB pixels 10 in the pixel array section 101 will be described as a modification. FIG. 7 is a circuit diagram depicting a schematic configuration example of a unit pixel according to a modification of the present embodiment. As depicted in FIG. 7, in the present modification, an RGB pixel 10A in each unit pixel 110 further includes a memory MEM and a transfer transistor 15.

The memory MEM is connected to the transfer gate 11 and temporarily holds the charges flowing out from the photoelectric conversion section PD1. The source of the transfer transistor 15 is connected to the memory MEM, and the drain is connected to the floating diffusion region FD1. The gate of the transfer transistor 15 is connected to a transfer control line which is one of the pixel drive lines LD, and transfers the charges held in the memory MEM to the floating diffusion region FD1 under the control of the vertical drive circuit 102.

At the time of charge transfer after exposure, the transfer gates 11 of all the RGB pixels 10 in the pixel array section 101 are simultaneously turned on. As a result, the charges generated in the photoelectric conversion section PD1 of each RGB pixel 10 during the same period are transferred to and held in the memory MEM of each RGB pixel 10. The readout of the pixel signal based on the charges held in the memory MEM may be similar to the so-called rolling shutter type readout drive.

1.6 Cross-Sectional Structure Example of Unit Pixel

Figure 8:
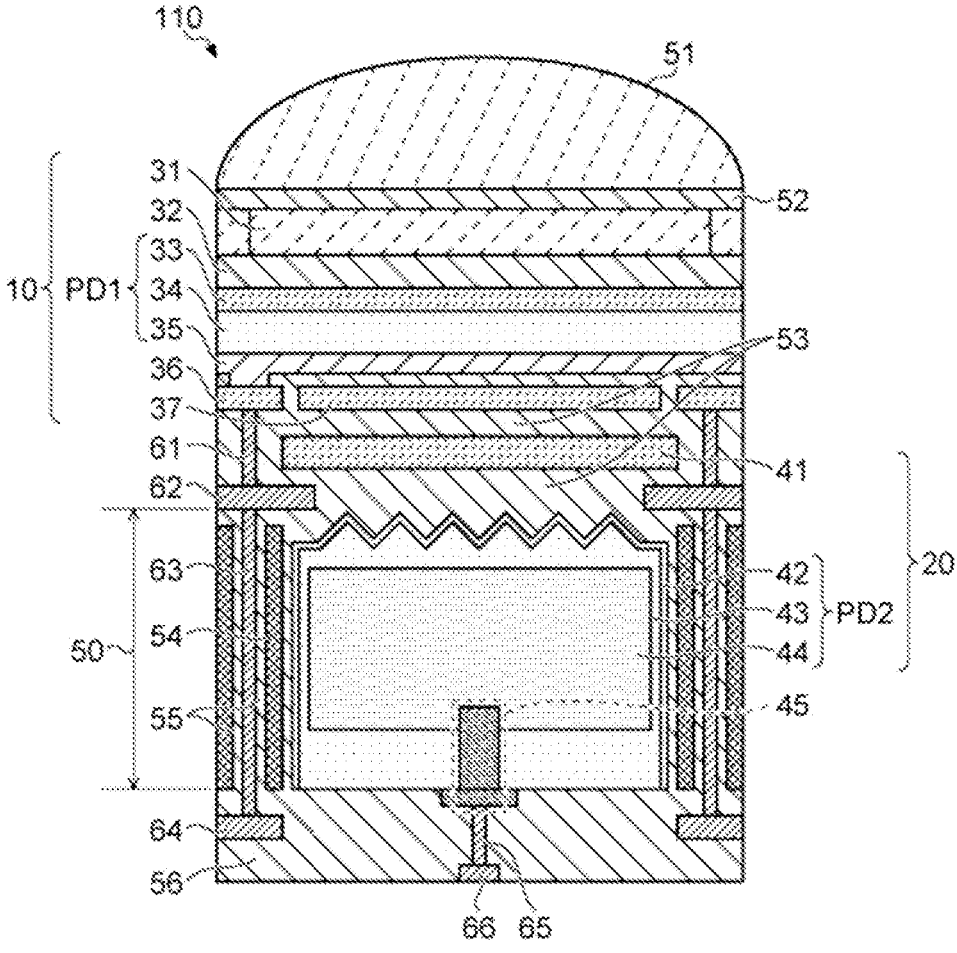
FIG. 8 is a cross-sectional diagram depicting a cross-sectional structure example of the image sensor according to one embodiment.

Next, with reference to FIG. 8, a cross-sectional structure example of the image sensor 100 according to one embodiment will be described. FIG. 8 is a cross-sectional diagram depicting a cross-sectional structure example of the image sensor according to the present embodiment. Here, a cross-sectional structure example will be described focusing on a semiconductor chip in which the photoelectric conversion sections PD1 and PD2 in the unit pixel 110 are formed.

In addition, in the following description, a so-called back surface irradiation type cross-sectional structure in which the light incident surface is on the back surface side (opposite side to the element formation surface) of a semiconductor substrate 50 is exemplified, but the present invention is not limited to this, and a so-called front surface irradiation type cross-sectional structure in which the light incident surface is on the front surface side (element formation surface side) of the semiconductor substrate 50 may be used. Furthermore, in the present description, a case where an organic material is used for the photoelectric conversion section PD1 of the RGB pixel 10 is exemplified, but as described above, one or both of an organic material and a semiconductor material (also referred to as an inorganic material) may be used as the photoelectric conversion material of each of the photoelectric conversion sections PD1 and PD2.

Note that, in a case where a semiconductor material is used for both the photoelectric conversion material of the photoelectric conversion section PD1 and the photoelectric conversion material of the photoelectric conversion section PD2, the image sensor 100 may have a cross-sectional structure in which the photoelectric conversion section PD1 and the photoelectric conversion section PD2 are built in the same semiconductor substrate 50, may have a cross-sectional structure in which a semiconductor substrate in which the photoelectric conversion section PD1 is built and a semiconductor substrate in which the photoelectric conversion section PD2 is built are bonded, or may have a cross-sectional structure in which one of the photoelectric conversion sections PD1 and PD2 is built in the semiconductor substrate 50 and the other is built in a semiconductor layer formed on the back surface or the front surface of the semiconductor substrate 50.

As depicted in FIG. 8, the present embodiment has a structure in which the photoelectric conversion section PD2 of the IR pixel 20 is formed on the semiconductor substrate 50, and the photoelectric conversion section PD1 of the RGB pixel 10 is provided on the back surface side (opposite side to an element formation surface) of the semiconductor substrate 50. Note that, in FIG. 8, for convenience of description, the back surface of the semiconductor substrate

50 is positioned on the upper side in the plane of the drawing, and the front surface is positioned on the lower side.

For the semiconductor substrate 50, for example, a semiconductor material such as silicon (Si) may be used. However, the semiconductor material is not limited to this, and various semiconductor materials including compound semiconductors such as GaAs, InGaAs, InP, AlGaAs, InGaP, AlGaInP, and InGaAsP may be used.

(RGB Pixel 10)

The photoelectric conversion section PD1 of the RGB pixel 10 is provided on the back surface side of the semiconductor substrate 50 with an insulating layer 53 sandwiched between. The photoelectric conversion section PD1 includes, for example, a photoelectric conversion film 34 made of an organic material, and a transparent electrode 33 and the semiconductor layer 35 disposed to sandwich the photoelectric conversion film 34. The transparent electrode 33 provided on the upper side (hereinafter, the upper side in the plane of the drawing is an upper surface side, and the lower side is a lower surface side) in the plane of the drawing with respect to the photoelectric conversion film 34 functions as, for example, an anode of the photoelectric conversion section PD1, and the semiconductor layer 35 provided on the lower surface side functions as a cathode of the photoelectric conversion section PD1.

The semiconductor layer 35 functioning as a cathode is electrically connected to the readout electrode 36 formed in an insulating layer 53. The readout electrode 36 is electrically drawn out to the front surface (lower surface) side of the semiconductor substrate 50 by being connected to wirings 61, 62, 63, and 64 penetrating the insulating layer 53 and the semiconductor substrate 50. Note that, although not depicted in FIG. 8, the wiring 64 is electrically connected to the floating diffusion region FD1 depicted in FIG. 6.

the accumulation electrode 37 is provided on the lower surface side of the semiconductor layer 35 functioning as a cathode with the insulating layer 53 sandwiched between. Although not depicted in FIG. 8, the accumulation electrode 37 is connected to the transfer control line in a pixel drive line LD1. As described above, at the time of exposure, a voltage for collecting charges generated in the photoelectric conversion section PD1 to the semiconductor layer 35 near the accumulation electrode 37 is applied, and at the time of readout, a voltage for causing charges collected in the semiconductor layer 35 near the accumulation electrode 37 to flow out via the readout electrode 36 is applied.

Similarly to the transparent electrode 33, the readout electrode 36 and the accumulation electrode 37 may be transparent conductive films. For example, a transparent conductive film such as indium tin oxide (ITO) or zinc oxide (IZO) may be used for the transparent electrode 33, the readout electrode 36, and the accumulation electrode 37. However, the present invention is not limited to this, and various conductive films may be used as long as the photoelectric conversion section PD2 is a conductive film capable of transmitting light in a wavelength band to be detected.

In addition, for the semiconductor layer 35, for example, a transparent semiconductor layer such as IGZO may be used. However, the present invention is not limited to this, and various semiconductor layers may be used as long as the photoelectric conversion section PD2 is a semiconductor layer capable of transmitting light in a wavelength band to be detected.

Furthermore, as the insulating layer 53, for example, an insulating film such as a silicon oxide film ($SiO_2$) or a silicon nitride film (SiN) may be used. However, the present invention is not limited to this, and various insulating films may be used as long as the photoelectric conversion section PD2 is an insulating film capable of transmitting light in a wavelength band to be detected.

A color filter 31 is provided on the upper surface side of the transparent electrode 33 functioning as an anode with a sealing film 32 sandwiched between. The sealing film 32 is made of, for example, an insulating material such as silicon nitride (SiN), and may include atoms of aluminum (Al), titanium (Ti), and the like in order to prevent the atoms from diffusing from the transparent electrode 33.

Although the arrangement of the color filters 31 will be described later, for example, a color filter 31 that selectively transmits light of a specific wavelength component is provided for one RGB pixel 10. However, in a case where a monochrome pixel that acquires luminance information is provided instead of the RGB pixel 10 that acquires color information, the color filter 31 may be omitted.

(IR Pixel 20)

The photoelectric conversion section PD2 of the IR pixel 20 includes, for example, a p-type semiconductor region 43 formed in a p-well region 42 in the semiconductor substrate 50 and an n-type semiconductor region 44 formed in the vicinity of the center of the p-type semiconductor region 43. The n-type semiconductor region 44 functions as, for example, a charge accumulation region that accumulates charges (electrons) generated by photoelectric conversion, and the p-type semiconductor region 43 functions as a region that forms a potential gradient for collecting the charges generated by photoelectric conversion into the n-type semiconductor region 44.

For example, an IR filter 41 that selectively transmits IR light is disposed on the light incident surface side of the photoelectric conversion section PD2. The IR filter 41 may be disposed, for example, in the insulating layer 53 provided on the back surface side of the semiconductor substrate 50. By disposing the IR filter 41 on the light incident surface of the photoelectric conversion section PD2, it is possible to suppress the incidence of visible light on the photoelectric conversion section PD2, and thus, it is possible to improve the S/N ratio of IR light to visible light. This makes it possible to obtain a more accurate detection result of IR light.

For example, a fine uneven structure is provided on the light incident surface of the semiconductor substrate 50 in order to suppress reflection of incident light (IR light in this example). This uneven structure may be a structure called a moth-eye structure, or may be an uneven structure having a size and a pitch different from those of the moth-eye structure.

A longitudinal transistor 45 functioning as the transfer transistor 21 is provided on the front surface (lower surface in the plane of the drawing) side of the semiconductor substrate 50, that is, the element formation surface side. The gate electrode of the longitudinal transistor 45 reaches the n-type semiconductor region 44 from the surface of the semiconductor substrate 50, and is connected to the vertical drive circuit 102 via wirings 65 and 66 (a part of the transfer control line of a pixel drive line LD2) formed in an interlayer insulating film 56.

The charges flowing out via the longitudinal transistor 45 are accumulated in the floating diffusion region FD2. The floating diffusion region FD2 is connected to the source of the reset transistor 22 and the gate of the amplification transistor 23 via wirings (not depicted) formed in the interlayer insulating film 56. Note that the floating diffusion region FD2, the reset transistor 22, the amplification transistor 23, and the selection transistor 24 may be provided on the element formation surface of the semiconductor substrate 50, or may be provided on a semiconductor substrate different from the semiconductor substrate 50.

Note that, in the present description, a case where the RGB pixels 10 positioned upstream with respect to the incident light generate the RGB image signal, and the IR pixels 20 positioned downstream generate the image signal based on the IR light has been exemplified, but the present invention is not limited to such a configuration. For example, an image signal based on light having a wavelength component corresponding to green may be generated in an upstream side pixel (corresponding to the RGB pixel 10), and an image signal based on light having a wavelength component corresponding to red and an image signal based on light having a wavelength component corresponding to blue may be generated in a downstream side pixel (corresponding to the IR pixel 20). In this case, a material that selectively absorbs a wavelength component corresponding to green is used for the photoelectric conversion film 34, and instead of the IR filter 41, a color filter that selectively transmits a wavelength component corresponding to red and a color filter that selectively transmits a wavelength component corresponding to blue can be arranged in a matrix. Furthermore, in this configuration, the color filter 31 can be omitted. With this configuration, the light receiving area of the pixel that detects the wavelength component of each of the three primary colors of RGB (which may be the three primary colors of CMY and the like) constituting the color image can be expanded, in a manner that the S/N ratio can be improved due to an increase in quantum efficiency.

(Pixel Isolation Structure)

The semiconductor substrate 50 is provided with a pixel isolation section 54 that electrically isolates the plurality of unit pixels 110 from each other, and the photoelectric conversion section PD2 is provided in each region partitioned by the pixel isolation section 54. For example, in a case where the image sensor 100 is viewed from the back surface (upper surface in the drawing) side of the semiconductor substrate 50, the pixel isolation section 54 has, for example, a lattice shape interposed between the plurality of unit pixels 110, and each photoelectric conversion section PD2 is formed in each region partitioned by the pixel isolation section 54.

For the pixel isolation section 54, for example, a reflection film that reflects light such as tungsten (W) or aluminum (Al) may be used. As a result, the incident light entering the photoelectric conversion section PD2 can be reflected by the pixel isolation section 54, in a manner that the optical path length of the incident light in the photoelectric conversion section PD2 can be increased. In addition, since the pixel isolation section 54 has a light reflection structure, it is possible to reduce leakage of light to adjacent pixels, and thus, it is also possible to further improve image quality, distance measurement accuracy, and the like. Note that the configuration in which the pixel isolation section 54 has the light reflection structure is not limited to the configuration using the reflection film, and can be realized, for example, by using a material having a refractive index different from that of the semiconductor substrate 50 for the pixel isolation section 54.

For example, a fixed charge film 55 is provided between the semiconductor substrate 50 and the pixel isolation section 54. The fixed charge film 55 is formed using, for example, a high dielectric having a negative fixed charge in a manner that a positive charge (hole) accumulation region is formed at an interface portion with the semiconductor substrate 50 and generation of a dark current is suppressed. Since the fixed charge film 55 is formed to have a negative fixed charge, an electric field is applied to the interface with a semiconductor substrate 138 by the negative fixed charge, and a positive charge (hole) accumulation region is formed.

The fixed charge film 55 can be formed of, for example, a hafnium oxide film ($HfO_2$ film). In addition, the fixed charge film 55 can be formed to contain at least one of oxides such as hafnium, zirconium, aluminum, tantalum, titanium, magnesium, yttrium, and lanthanoid elements, for example.

Note that FIG. 8 depicts a case where the pixel isolation section 54 has a so-called full trench isolation (FTI) structure reaching from the front surface to the back surface of the semiconductor substrate 50, but is not limited to this. For example, various element isolation structures such as a so-called deep trench isolation (DTI) structure in which the pixel isolation section 54 is formed from the back surface or the front surface of the semiconductor substrate 50 to the vicinity of the middle of the semiconductor substrate 50 can be adopted.

(Pupil Correction)

A planarization film 52 made of a silicon oxide film, a silicon nitride film, and the like is provided on the upper surface of the color filter 31. The upper surface of the planarization film 52 is planarized by, for example, chemical mechanical polishing (CMP), and an on-chip lens 51 for each unit pixel 110 is provided on the planarized upper surface. The on-chip lens 51 of each unit pixel 110 has such a curvature that incident light is collected in the photoelectric conversion sections PD1 and PD2. Note that the positional relationship among the on-chip lens 51, the color filter 31, the IR filter 41, and the photoelectric conversion section PD2 in each unit pixel 110 may be adjusted according to, for example, the distance (image height) from the center of the pixel array section 101 (pupil correction).

In addition, in the structure depicted in FIG. 8, a light shielding film for preventing obliquely incident light from leaking into the adjacent pixel may be provided. The light shielding film can be positioned above the pixel isolation section 54 provided inside the semiconductor substrate 50 (upstream side in the optical path of the incident light). However, in a case where pupil correction is performed, the position of the light shielding film may be adjusted according to, for example, the distance (image height) from the center of the pixel array section 101. Such a light shielding film may be provided, for example, in the sealing film 32 or the planarization film 52. In addition, as a material of the light shielding film, for example, a light shielding material such as aluminum (Al) or tungsten (W) may be used.

1.7 Material of Each Layer

In one embodiment, in a case where an organic semiconductor is used as the material of the photoelectric conversion film 34, the layer structure of the photoelectric conversion film 34 can have the following structure. However, in the case of the stacked structure, the stacking order can be appropriately changed.

(1) Single-layer structure of p-type organic semiconductor
(2) Single-layer structure of n-type organic semiconductor
(3-1) Stacked structure of p-type organic semiconductor layer/n-type organic semiconductor layer
(3-2) Stacked structure of p-type organic semiconductor layer/mixed layer (bulk heterostructure) of p-type organic semiconductor and n-type organic semiconductor/n-type organic semiconductor layer
(3-3) Stacked structure of p-type organic semiconductor layer/mixed layer (bulk heterostructure) of p-type organic semiconductor and n-type organic semiconductor
(3-4) Stacked structure of n-type organic semiconductor layer/mixed layer (bulk heterostructure) of p-type organic semiconductor and n-type organic semiconductor
(4) Mixed layer of p-type organic semiconductor and p-type organic semiconductor (bulk heterostructure)

Here, examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, and the like.

Examples of the n-type organic semiconductor include fullerene and a fullerene derivative <for example, fullerene such as C60, C70, and C74 (higher fullerenes, endohedral fullerenes, etc.), or a fullerene derivative (for example, fullerene fluoride, PCBM fullerene compound, fullerene multimer, and the like)>, an organic semiconductor having a larger (deeper) HOMO and LUMO than a p-type organic semiconductor, and a transparent inorganic metal oxide.

Specific examples of the n-type organic semiconductor include an organic molecule, an organometallic complex, and a subphthalocyanine derivative having a part of the molecular skeleton containing heterocyclic compounds containing a nitrogen atom, an oxygen atom, and a sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylenevinylene derivatives, polybenzothiadiazole derivatives, and polyfluorene derivatives.

Halogen atom as group and the like contained in fullerene derivative, the following derivatives can be mentioned: linear, branched, or cyclic alkyl or phenyl group; group having linear or condensed aromatic compound; group having halide; partial fluoroalkyl group; perfluoroalkyl group; silylalkyl group; silyl alkoxy group; arylsilyl group; arylsulfanyl group; alkylsulfanyl group; arylsulfonyl group; alkylsulfonyl group; aryl sulfide group; alkyl sulfide group; amino group; alkylamino group; arylamino group; hydroxy group; alkoxy group; acylamino group; acyloxy group; carbonyl group; carboxy group; carboxamide group; carboalkoxy group; acyl group; sulfonyl group; cyano group; nitro group; group having chalcogenide; phosphine group; and phosphon group.

The film thickness of the photoelectric conversion film 34 made of the organic material as described above is not limited to the following value, but may be, for example, $1\times10^{-8}$ m (meter) to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m. Note that the organic semiconductor is often classified into a p-type and an n-type, but the p-type means that holes are easily transported, and the n-type means that electrons are easily transported, and the organic semiconductor is not limited to the interpretation that it has holes or electrons as a majority carrier of thermal excitation like the inorganic semiconductor.

Examples of a material constituting the photoelectric conversion film 34 that photoelectrically converts light having a green wavelength include a rhodamine dye, a melacyanine dye, a quinacridone derivative, and a subphthalocyanine dye (subphthalocyanine derivative).

In addition, examples of a material constituting the photoelectric conversion film 34 that photoelectrically converts blue light include a coumaric acid dye, tris-8-hydroxyquinoline aluminum (Alq3), a melacyanine dye, and the like.

Furthermore, examples of a material constituting the photoelectric conversion film 34 that photoelectrically converts red light include a phthalocyanine dye and a subphthalocyanine dye (subphthalocyanine derivative).

Furthermore, as the photoelectric conversion film 34, a panchromatic photosensitive organic photoelectric conversion film that is sensitive to substantially all visible light from the ultraviolet region to the red region can be used.

On the other hand, as the material constituting the semiconductor layer 35, a material having a large band gap value (for example, a value of a band gap of 3.0 eV (electron volt) or more) and having higher mobility than the material constituting the photoelectric conversion film 34 is preferably used. Specific examples include oxide semiconductor materials such as IGZO, transition metal dichalcogenides, silicon carbides, diamond, graphene, carbon nanotubes, and organic semiconductor materials such as fused polycyclic hydrocarbon compounds and fused heterocyclic compounds.

Alternatively, in a case where the charges generated in the photoelectric conversion film 34 are electrons, a material having an ionization potential larger than the ionization potential of the material constituting the photoelectric conversion film 34 can be used as the material constituting the semiconductor layer 35. On the other hand, in a case where the charge is a hole, a material having an electron affinity smaller than the electron affinity of the material constituting the photoelectric conversion film 34 can be used as the material constituting the semiconductor layer 35.

Note that the impurity concentration in the material constituting the semiconductor layer 35 is preferably $1\times10^{18}$ cm$^{-3}$ or less. In addition, the photoelectric conversion film 34 and the semiconductor layer 35 can be made of the same material as long as the photoelectric conversion performance and the mobility performance can be satisfied.

Furthermore, a transparent material is desirably used as a material of each of the transparent electrode 33, the readout electrode 36, the semiconductor layer 35, and the accumulation electrode 37. Specifically, a material made of Al—Nd (alloy of aluminum and neodymium) or ASC (alloy of aluminum, samarium, and copper) can be used.

In addition, the band gap energy of the transparent conductive material is desirably 2.5 eV or more, and preferably 3.1 eV or more.

On the other hand, in a case where the transparent electrode 33, the readout electrode 36, and the accumulation electrode 37 are transparent electrodes, examples of the transparent conductive material constituting them include conductive metal oxides.

Specifically, indium oxide, indium-tin oxide (indium tin oxide (ITO), Sn-doped $In_2O_3$, crystalline ITO, and amorphous ITO are included), indium-zinc oxide (IZO) obtained by adding indium as a dopant to zinc oxide, indium-gallium oxide (IGO) obtained by adding indium as a dopant to gallium oxide, indium-gallium-zinc oxide (IGZO (In—$GaZnO_4$)) obtained by adding indium and gallium as dopants to zinc oxide, indium-tin-zinc oxide (ITZO) obtained by adding indium and tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) obtained by adding aluminum as a dopant to zinc oxide, gallium-zinc oxide (GZO) obtained by adding gallium as a dopant to zinc oxide, titanium oxide ($TiO_2$), niobium-titanium oxide (TNO) obtained by adding niobium as a dopant to titanium oxide, antimony oxide, spinel type oxide, and oxide having a $YbFe_2O_4$ structure can be exemplified.

Alternatively, a transparent electrode using gallium oxide, titanium oxide, niobium oxide, nickel oxide, and the like as a parent layer can also be exemplified.

Furthermore, the thickness of the transparent electrode may be $2\times10^{-8}$ m to $2\times10^{-7}$ m, preferably $3\times10^{-8}$ m to $1\times10^{-7}$ m.

1.8 Modification of Unit Pixel

In the above description, the case where one unit pixel includes one RGB pixel 10 and one IR pixel 20 has been exemplified, but the present invention is not limited to such a configuration. That is, each unit pixel 110 may include N (N is an integer of 1 or more) RGB pixels 10 and M (M is an integer of 1 or more) IR pixels 20. In this case, the N RGB pixels 10 may share a part of the pixel circuit, and similarly, the M IR pixels 20 may share a part of the pixel circuit.

1.8.1 Configuration Example of Unit Pixel

Figure 9:
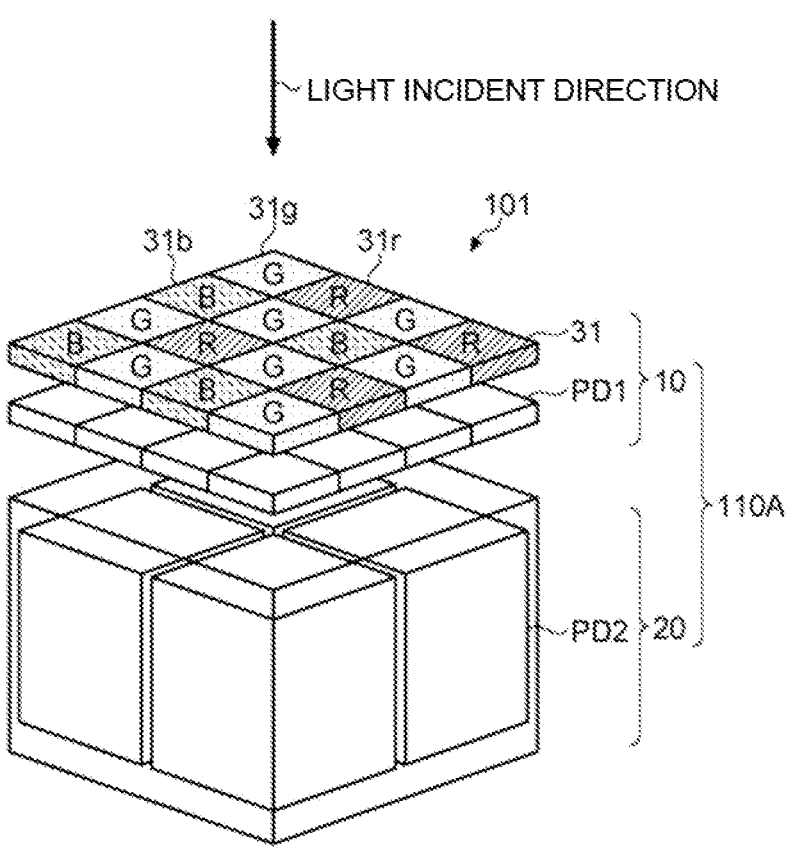
FIG. 9 is a schematic diagram depicting a schematic configuration example of a unit pixel according to a modification of one embodiment.

FIG. 9 is a schematic diagram depicting a schematic configuration example of a unit pixel according to a modification of the present embodiment. As depicted in FIG. 9, a unit pixel 110A has a structure in which one IR pixel 20 is disposed in the light incident direction with respect to four RGB pixels 10 arranged in two rows and two columns. That is, in the present modification, one IR pixel 20 for four RGB pixels 10 positioned in the direction vertical to the arrangement direction (plane direction) of the unit pixels 110A, and the light transmitted through four RGB pixels 10 positioned on the upstream side in the optical path of the incident light is configured to be incident on one IR pixel 20 positioned on the downstream side of four RGB pixels 10. Therefore, in the present modification, the optical axes of the incident light of the unit array of the Bayer array including four RGB pixels 10 and the IR pixel 20 coincide or substantially coincide with each other.

1.8.2 Circuit Configuration Example of Unit Pixel

Figure 10:
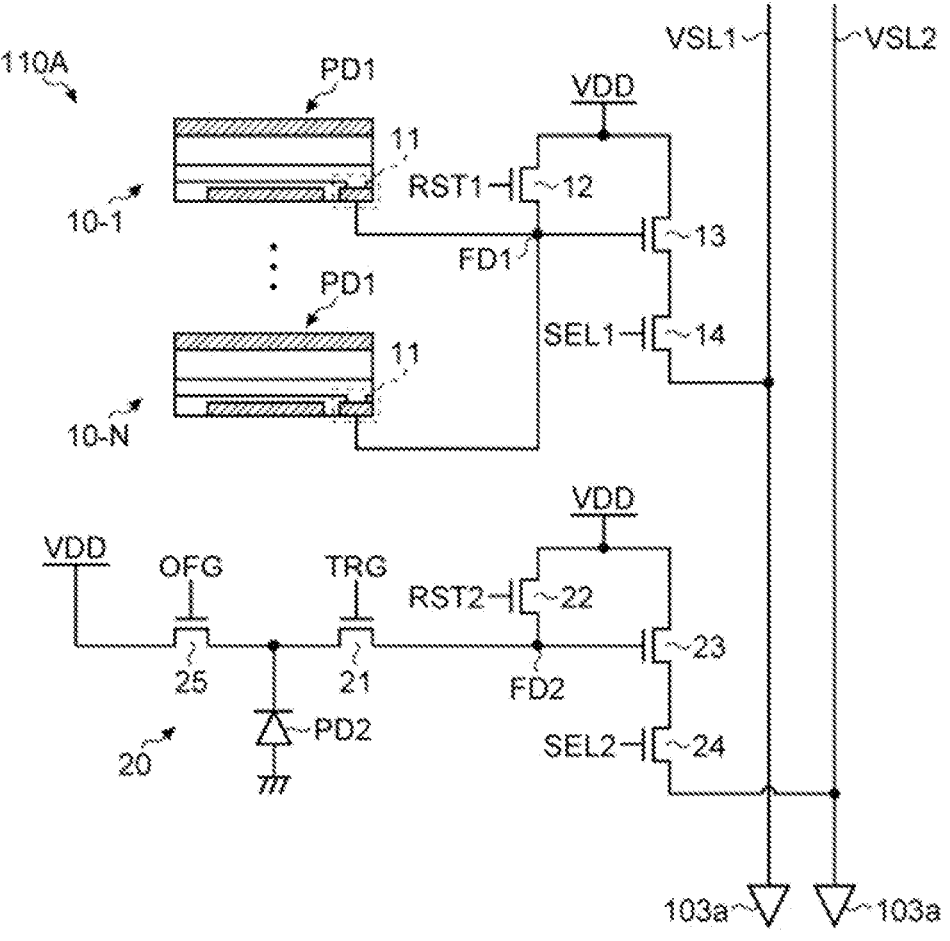
FIG. 10 is a circuit diagram depicting a schematic configuration example of a unit pixel according to a modification of one embodiment.

FIG. 10 is a circuit diagram depicting a schematic configuration example of a unit pixel according to a modification of the present embodiment. As depicted in FIG. 10, the unit pixel 110A includes the plurality of RGB pixels 10-1 to 10-N (in FIG. 10, N is 4) and one IR pixel 20. As described above, in a case where one unit pixel 110A includes the plurality of RGB pixels 10, one pixel circuit (reset transistor 12, floating diffusion region FD1, amplification transistor 13, and selection transistor 14) can be shared by the plurality of RGB pixels 10 (pixel sharing). Therefore, in the present modification, the plurality of RGB pixels 10-1 to 10-N shares a pixel circuit including the reset transistor 12, the floating diffusion region FD1, the amplification transistor 13, and the selection transistor 14. That is, in the present modification, the plurality of photoelectric conversion sections PD1 and the transfer gate 11 are connected to the common floating diffusion region FD1.

1.8.3 Cross-Sectional Structure Example of Unit Pixel

Figure 11:
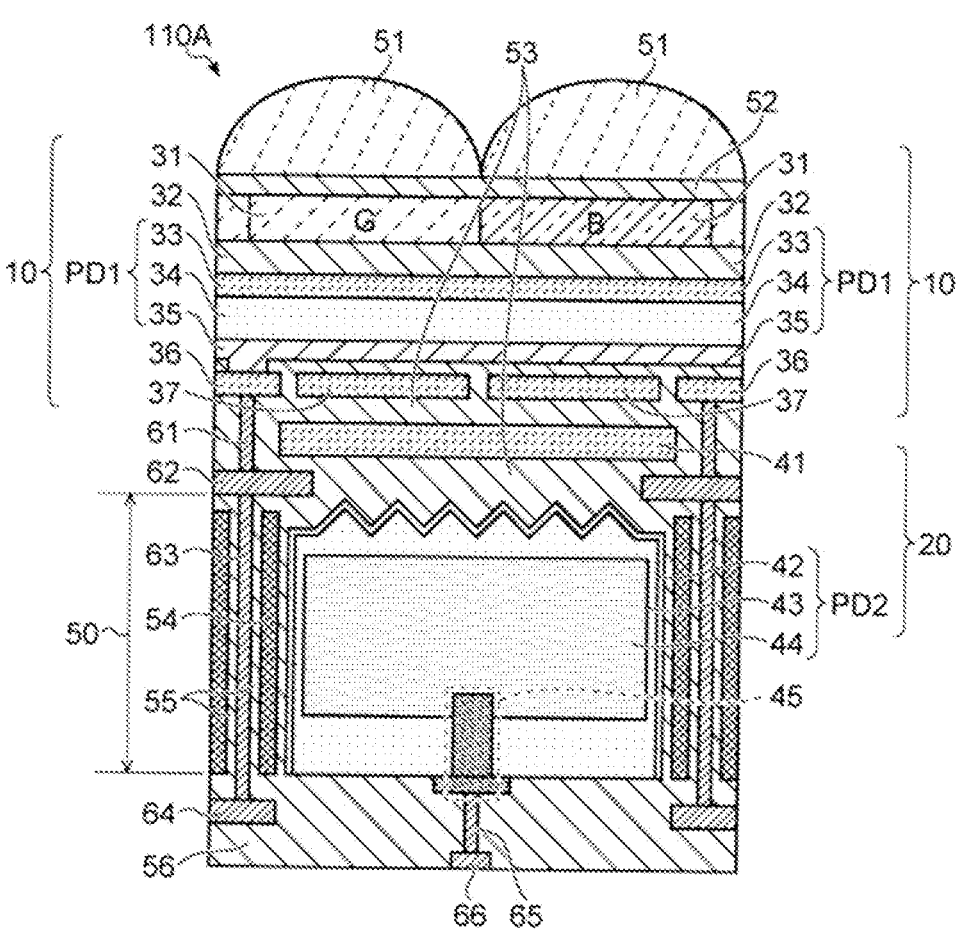
FIG. 11 is a cross-sectional diagram depicting a cross-sectional structure example of an image sensor according to a modification of one embodiment.

FIG. 11 is a cross-sectional diagram depicting a cross-sectional structure example of an image sensor according to a modification of the present embodiment. Note that, in the present description, similarly to FIG. 8, a case where each unit pixel 110A includes four RGB pixels 10 arranged in two rows and two columns and one IR pixel 20 will be described as an example. In addition, in the following description, similarly to FIG. 8, a cross-sectional structure example will be described focusing on a semiconductor chip in which the photoelectric conversion sections PD1 and PD2 in the unit pixel 110A are formed. Furthermore, in the following description, structures similar to the cross-sectional structure of the image sensor 100 described with reference to FIG. 8 are cited, and redundant description is omitted.

As depicted in FIG. 11, in the present modification, in a cross-sectional structure similar to the cross-sectional structure depicted in FIG. 8, the on-chip lens 51, the color filter 31, and the accumulation electrode 37 are divided into four in two rows and two columns (however, two out of four are depicted in FIG. 11), configuring four RGB pixels 10. Note that the four RGB pixels 10 in each unit pixel 210 may constitute a basic array of the Bayer array.

1.9 Improvement of Quantum Efficiency

Subsequently, in the unit pixel 110 (or the unit pixel 110A, and the same applies hereinafter) having the basic configuration as described above, a configuration for increasing the quantum efficiency will be described with some examples. Note that, in the following, for clarification, attention is paid to a pixel in which the photoelectric conversion section includes an organic photoelectric conversion film (in this example, the RGB pixel 10), and illustration and description of the pixel in which the photoelectric conversion section includes a semiconductor (in the present example, the IR pixel 20) are omitted. In addition, in order to simplify the description, in the cross-sectional structure of the RGB pixel 10, a configuration above the color filter 31 and a configuration below the readout electrode 36 will not be depicted and described. Furthermore, in the following description, the RGB pixel 10 is also simply referred to as a pixel 10. Furthermore, in the following description, the readout electrode 36 electrically connected to the floating diffusion region FD1 will be described as a part of the floating diffusion region FD1. Furthermore, in the following description, a case where the charge generated by photoelectric conversion of the photoelectric conversion film 34 is a negative charge (that is, electrons) will be exemplified. However, the charge generated by the photoelectric conversion of the photoelectric conversion film 34 may be a positive charge (that is, a hole). Furthermore, the structure and effect described in each example may be similar to other examples if not specifically mentioned.

1.9.1 First Example

Figure 12:
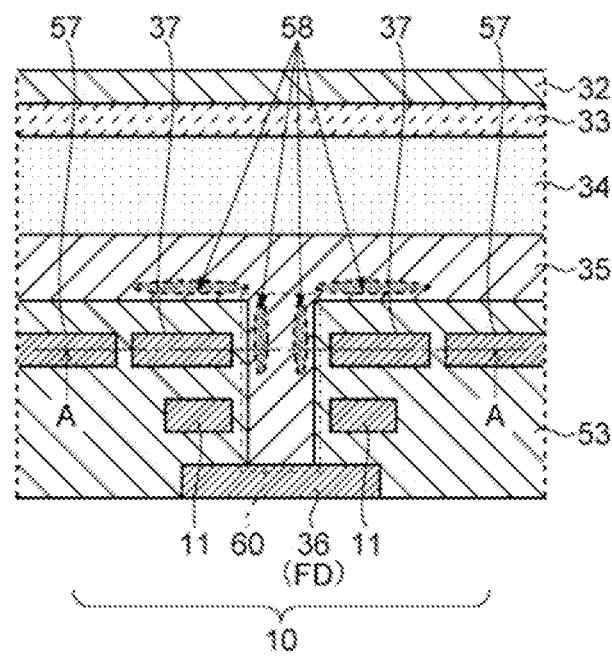
FIG. 12 is a vertical cross-sectional diagram depicting a cross-sectional structure of a pixel according to a first example of one embodiment.
Figure 13:
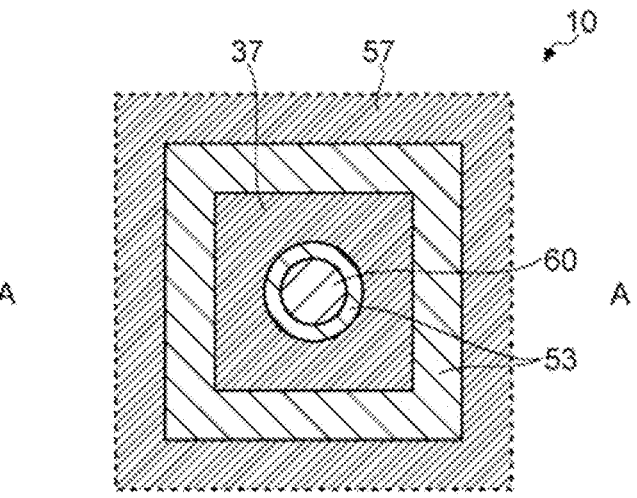
FIG. 13 is a horizontal cross-sectional diagram depicting an A-A cross section in FIG. 12.

FIG. 12 is a vertical cross-sectional diagram depicting a cross-sectional structure of a pixel according to the first example of the present embodiment. FIG. 13 is a horizontal cross-sectional diagram depicting an A-A cross section in FIG. 12. Note that, here, the term "vertical" means vertical to the element formation surface of the semiconductor substrate 50, and the term "horizontal" means horizontal to the element formation surface.

As depicted in FIGS. 12 and 13, in the pixel 10 according to the first example, a part of the semiconductor layer 35 positioned immediately below the photoelectric conversion film 34 protrudes to the opposite side to the photoelectric conversion film 34 and is connected to the readout electrode 36. In the following description, this protruding portion is referred to as a semiconductor wiring 60.

On the side of the semiconductor layer 35 of the semiconductor wiring 60, the accumulation electrode 37 having the center is opened is disposed to surround the semiconductor wiring 60. The accumulation electrode 37 and the semiconductor wiring 60 are electrically isolated from each other with the insulating layer 53 interposed between.

In addition, the transfer gate 11 is disposed on the side of the readout electrode 36 of the semiconductor wiring 60. Similarly to the accumulation electrode 37, the gate electrode of the transfer gate 11 has a shape having the center is opened, and is disposed to surround the semiconductor wiring 60. The gate electrode of the transfer gate 11 and the semiconductor wiring 60 are electrically isolated from each other with the insulating layer 53 interposed between. Note that, in the following description, the gate electrode of the transfer gate 11 may be simply referred to as the transfer gate 11 for simplification.

Note that, in a case where the unit pixel 110 has a pixel sharing configuration that shares a part of the pixel circuit as depicted in FIG. 11, the accumulation electrode 37 and the transfer gate 11 disposed with respect to the semiconductor wiring 60 may be divided for each pixel 10.

In such a structure, for example, in a case where the charges generated in the photoelectric conversion section PD1 are electrons, a drive signal (also referred to as a control voltage) for lowering the potential in the semiconductor layer 35 near the accumulation electrode 37 is applied from the vertical drive circuit 102 to the accumulation electrode 37 during the exposure period. On the on the other hand, in a case where the charges generated in the photoelectric conversion section PD1 are holes, a drive signal for lowering the potential in the semiconductor layer 35 near the accumulation electrode 37 is applied from the vertical drive circuit 102 to the accumulation electrode 37 during the exposure period. Therefore, charges 58 generated in the photoelectric conversion film 34 and entering the semiconductor layer 35 are accumulated in a region near the accumulation electrode 37 in the semiconductor layer 35. At that time, by turning off the transfer gate 11 and forming a potential barrier in the semiconductor wiring 60 between the region where the charges are accumulated and the transfer gate 11, it is possible to suppress leakage of the accumulated charges to the side of the readout electrode 36. This makes it possible to improve the quantum efficiency. Note that, in the following description, a case where the charges generated by photoelectric conversion by the photoelectric conversion sections PD1 and PD2 are electrons is exemplified, but the present invention is not limited to this. Even in a case where the charges are holes, the technology according to the present disclosure can be similarly applied by reversing the direction of potential control.

In addition, in the first example, a shield electrode (ASE) 57 is disposed to surround the periphery of the accumulation electrode (SLD) 37 of each pixel 10. The shield electrode 57 is connected to the vertical drive circuit 102 via a wiring (not depicted) which is one of the pixel drive lines LD. In a case where each pixel 10 is individually driven, the vertical drive circuit 102 applies a drive signal to the shield electrode 57 to form a potential barrier in the semiconductor layer 35 positioned between the adjacent pixels 10. As a result, since the charges generated in the photoelectric conversion film 34 of a certain pixel 10 and entering the semiconductor layer 35 are suppressed from flowing out to the adjacent pixel 10, the quantum efficiency of the pixel 10 can be further improved.

Figure 14:
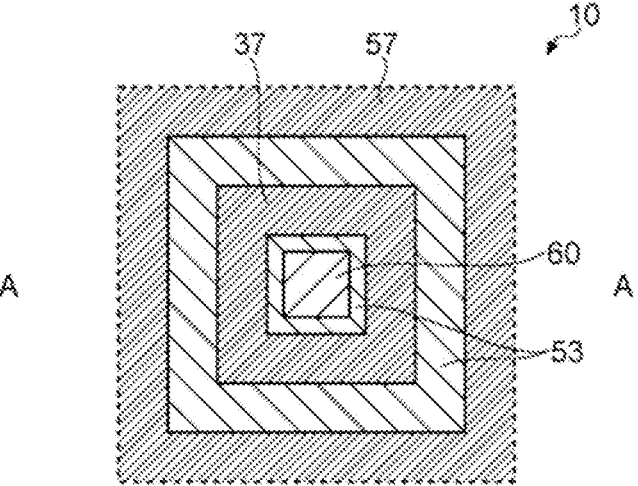
FIG. 14 is a horizontal cross-sectional diagram depicting another example of the A-A cross section in FIG. 12.
Figure 15:
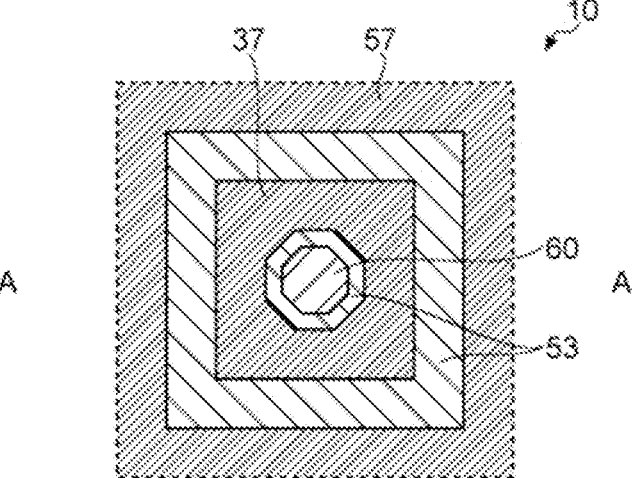
FIG. 15 is a horizontal cross-sectional diagram depicting still another example of the A-A cross section in FIG. 12.

Note that, in FIG. 13, a case where the horizontal cross section of the semiconductor wiring 60 and the opening shape of the accumulation electrode 37 and the transfer gate 11 are circular has been exemplified. However, for example, as depicted in FIGS. 14 and 15, the horizontal cross section and the opening shape may be changed to various shapes such as a polygon such as a quadrangle and a regular octagon and an ellipse. The same applies to other examples to be described later.

1.9.2 Second Example

Figure 16:
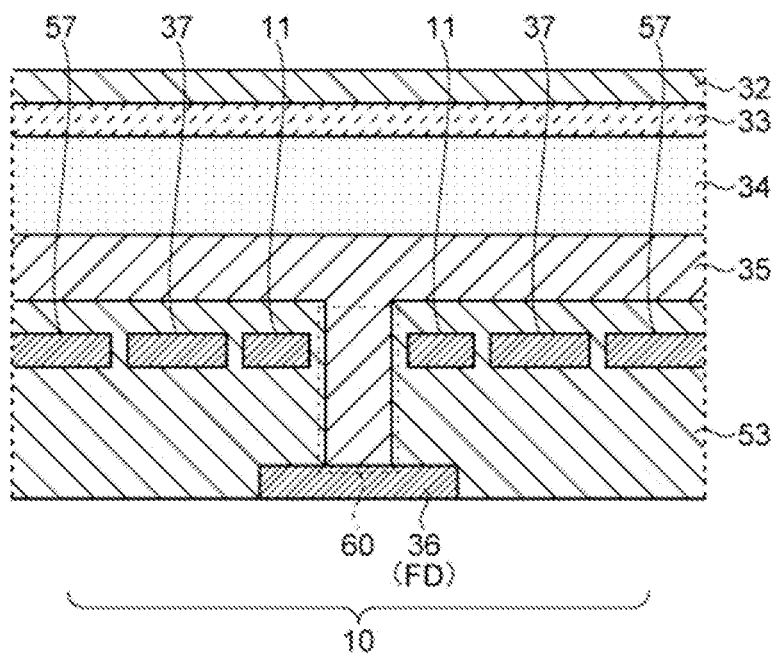
FIG. 16 is a vertical cross-sectional diagram depicting a cross-sectional structure of a pixel according to a second example of one embodiment.

FIG. 16 is a vertical cross-sectional diagram depicting a cross-sectional structure of a pixel according to the second example of the present embodiment. As depicted in FIG. 16, the pixel 10 according to the second example has a structure in which the transfer gate 11 is disposed inside the accumulation electrode 37 in a cross-sectional structure similar to that of the pixel 10 according to the first example described above with reference to FIG. 12. That is, in the second example, the opening of the accumulation electrode 37 is enlarged in diameter, and the transfer gate 11 is disposed on the same surface as the accumulation electrode 37.

According to such a structure, since the length of the semiconductor wiring 60 can be shortened, the height of the image sensor 100 can be reduced, and the size of the image sensor can be reduced.

1.9.3 Third Example

Figure 17:
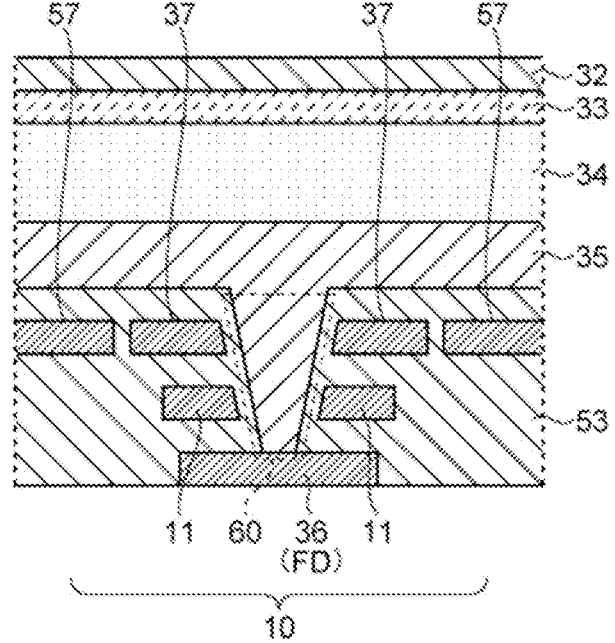
FIG. 17 is a vertical cross-sectional diagram depicting a cross-sectional structure of a pixel according to a third example of one embodiment.

FIG. 17 is a vertical cross-sectional diagram depicting a cross-sectional structure of a pixel according to the third example of the present embodiment. As depicted in FIG. 17, the pixel 10 according to the third example has a tapered shape in which the semiconductor wiring 60 becomes thinner toward the readout electrode 36 in a cross-sectional structure similar to that of the pixel 10 according to the first example described above with reference to FIG. 12.

According to such a structure, since the diameter of the semiconductor wiring 60 on the side of the semiconductor layer 35 is increased, the charges accumulated in the semiconductor layer 35 can be smoothly transferred to the side of the readout electrode 36.

In addition, since the diameter of the semiconductor wiring 60 on the side of the readout electrode 36 is reduced, the contact area with the readout electrode 36 is reduced, in a manner that the readout electrode 36 can be reduced. As a result, it is possible to increase the amount of light propagating to the layer below the readout electrode 36, and thus, for example, it is possible to further increase the quantum efficiency of the IR pixel 20 in a case where the photoelectric conversion section PD2 of the IR pixel 20 is disposed below the pixel 10.

1.9.4 Fourth Example

Figure 18:
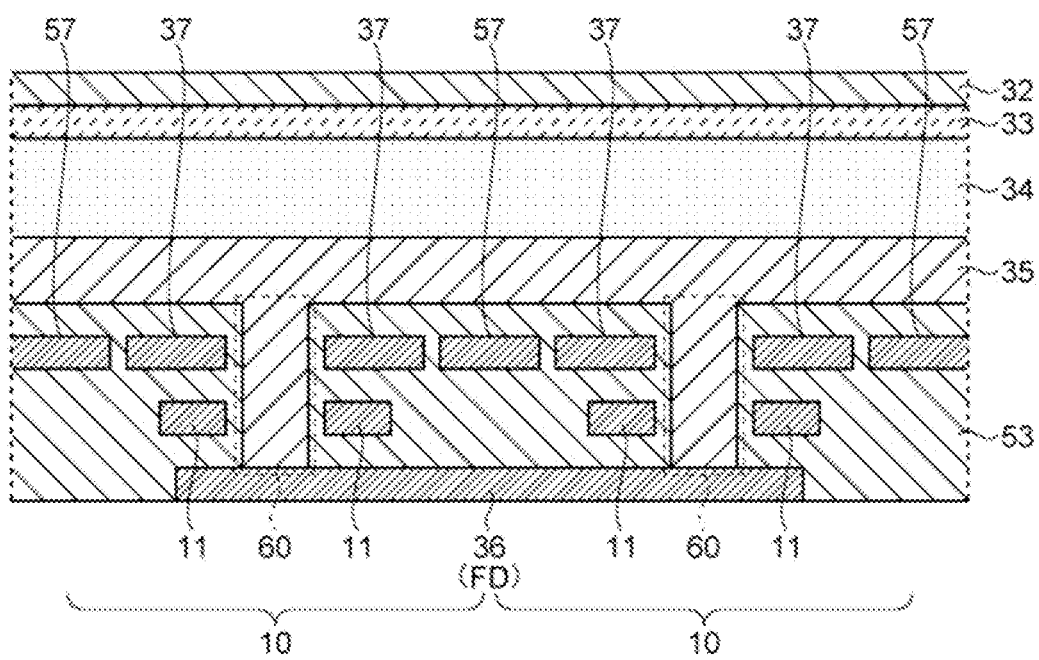
FIG. 18 is a vertical cross-sectional diagram depicting a cross-sectional structure of a pixel according to a fourth example of one embodiment.

FIG. 18 is a vertical cross-sectional diagram depicting a cross-sectional structure of a pixel according to the fourth example of the present embodiment. As depicted in FIG. 18, the pixel 10 according to the fourth example has a structure in which the readout electrode 36 (and the floating diffusion region FD) is shared between adjacent pixels 10 in a cross-sectional structure similar to that of the pixel 10 according to the first example described above with reference to FIG. 12.

As described above, according to the structure in which the readout electrode 36 and the floating diffusion region FD are shared and the transfer of the charges from each pixel 10 to the floating diffusion region FD can be controlled using the transfer gate 11, it is possible to switch between reading for each pixel 10 and simultaneous reading from the plurality of pixels 10.

1.9.5 Fifth Example

Figure 19:
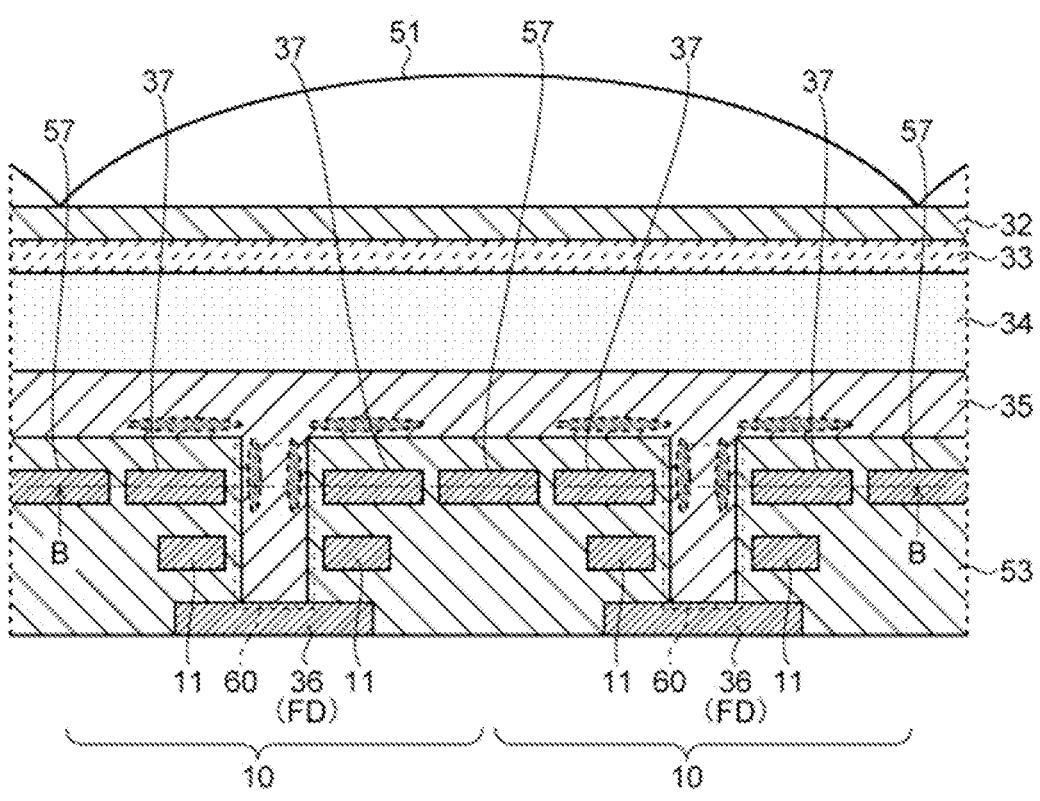
FIG. 19 is a vertical cross-sectional diagram depicting a cross-sectional structure of a pixel according to a fifth example of one embodiment.
Figure 20:
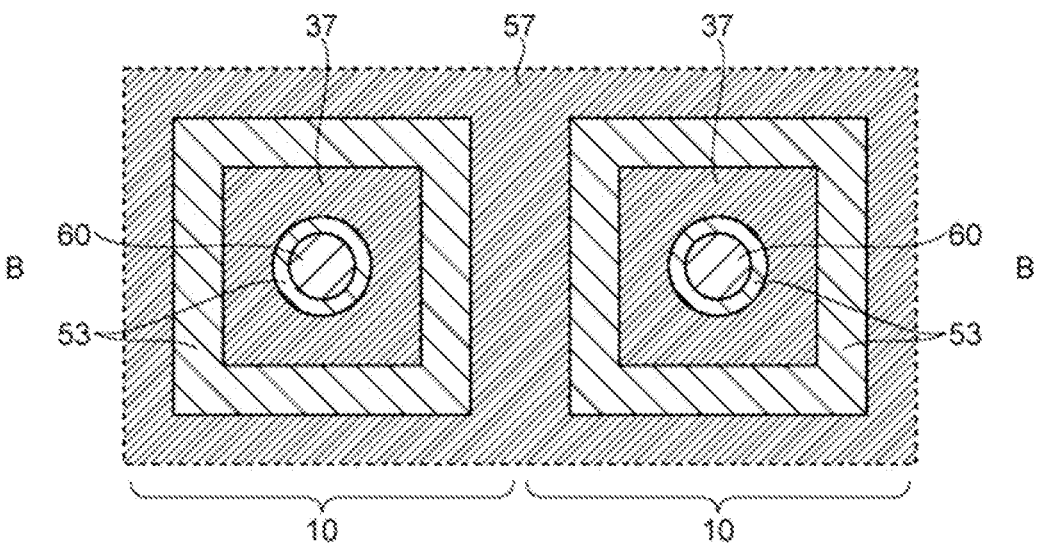
FIG. 20 is a horizontal cross-sectional diagram depicting a B-B cross section in FIG. 19.

FIG. 19 is a vertical cross-sectional diagram depicting a cross-sectional structure of a pixel according to the fifth example of the present embodiment. FIG. 20 is a horizontal cross-sectional diagram depicting a B-B cross section in FIG. 19. Note that FIG. 19 depicts a configuration above the color filter 31 for convenience of description.

As depicted in FIGS. 19 and 20, the pixel 10 according to the fifth example has a structure in which one on-chip lens 51 is provided for a plurality of (two in this example) pixels 10 in a cross-sectional structure similar to that of the pixel 10 according to the first example described above with reference to FIG. 12.

According to such a structure, it is possible to acquire the image-plane phase difference information between the pixels 10 sharing one on-chip lens 51, and thus, it is possible to execute control such as autofocus based on the image-plane phase difference information in the system control unit 1050 that controls the image sensor 100.

1.9.6 Sixth Example

Figure 21:
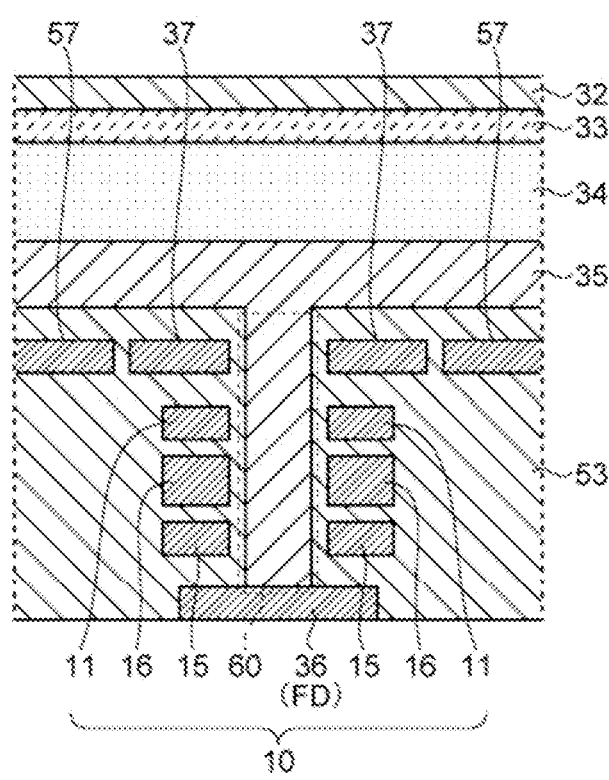
FIG. 21 is a vertical cross-sectional diagram depicting a cross-sectional structure of a pixel according to a sixth example of one embodiment.

In the sixth example, the pixel 10 capable of readout drive by the global shutter method depicted in FIG. 7 will be described. FIG. 21 is a vertical cross-sectional diagram depicting a cross-sectional structure of a pixel according to the sixth example of the present embodiment. As depicted in FIG. 21, the pixel 10 according to the sixth example has a structure in which a memory electrode 16 and the transfer transistor 15 constituting the memory MEM are sequentially disposed between the transfer gate 11 and the readout electrode 36 in a cross-sectional structure similar to that of the pixel 10 according to the first example described above with reference to FIG. 12.

The transfer transistor 15 is disposed on the side of the semiconductor wiring 60 closest to the readout electrode 36. Similarly to the accumulation electrode 37, the gate electrode of the transfer transistor 15 has a shape having the center is opened, and is disposed to surround the semiconductor wiring 60. The gate electrode of the transfer transistor 15 and the semiconductor wiring 60 are electrically isolated from each other with the insulating layer 53 interposed between. Note that, in the following description, the gate electrode of the transfer transistor 15 may be simply referred to as the transfer transistor 15 for simplification.

The memory electrode 16 is disposed between the transfer gate 11 and the transfer transistor 15. In addition, similarly to the accumulation electrode 37, the memory electrode 16 has a shape having the center is opened, and is disposed to surround the semiconductor wiring 60.

According to such a structure, the charges transferred from the semiconductor layer 35 via the transfer gate 11 can be temporarily held in the region near the memory electrode 16 in the semiconductor wiring 60. As a result, global shutter method readout drive becomes possible.

1.9.7 Seventh Example

Figure 22:
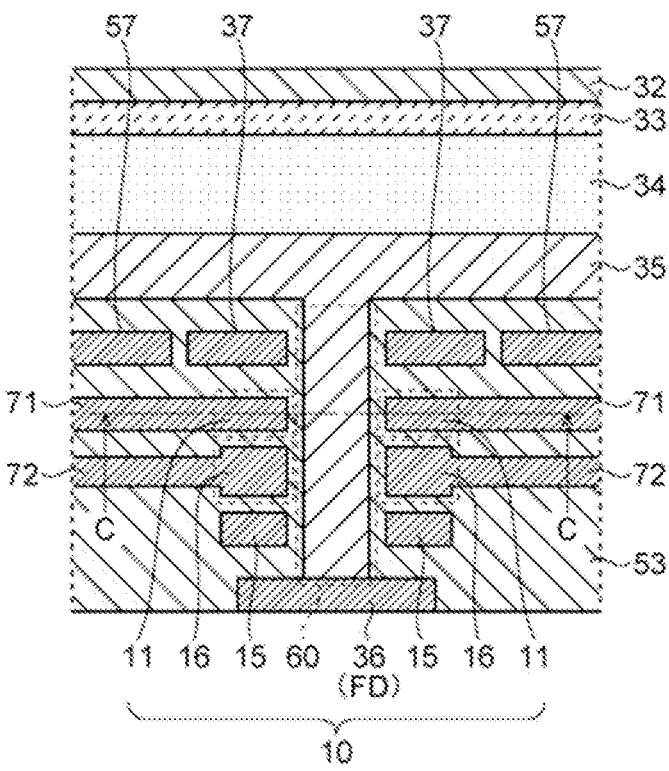
FIG. 22 is a vertical cross-sectional diagram depicting a cross-sectional structure of a pixel according to a seventh example of one embodiment.
Figure 23:
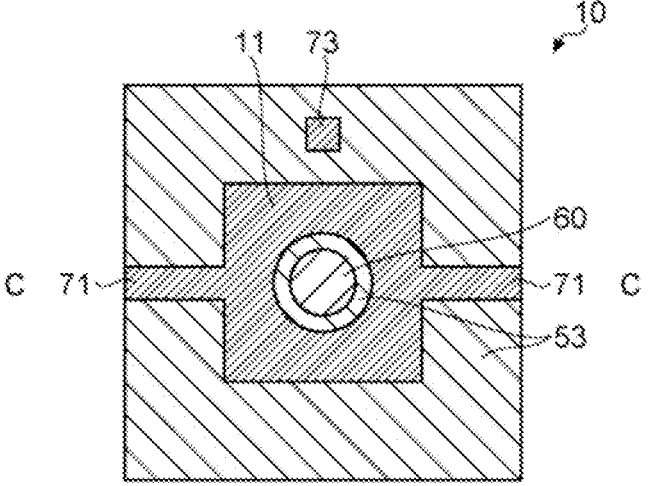
FIG. 23 is a horizontal cross-sectional diagram depicting a C-C cross section in FIG. 22.

In the seventh example, the wiring example in the pixel 10 capable of readout drive by the global shutter method described in the sixth example will be described. FIG. 22 is a vertical cross-sectional diagram depicting a cross-sectional structure of a pixel according to the seventh example of the present embodiment. FIG. 23 is a horizontal cross-sectional diagram depicting a C-C cross section in FIG. 22.

In the case of the global shutter method readout drive, the transfer gates 11 in all the pixels 10 are simultaneously driven. Therefore, as depicted in FIGS. 22 and 23, the transfer gates 11 of all the pixels 10 in the pixel array section 101 may be coupled by wirings 71. Similarly, the memory electrodes 16 of all the pixels 10 in the pixel array section 101 may also be coupled by the wirings 72. Note that the accumulation electrodes 37 of all the pixels 10 in the pixel array section 101 may also be coupled to each other via wirings 73.

1.9.8 Eighth Example

Figure 24:
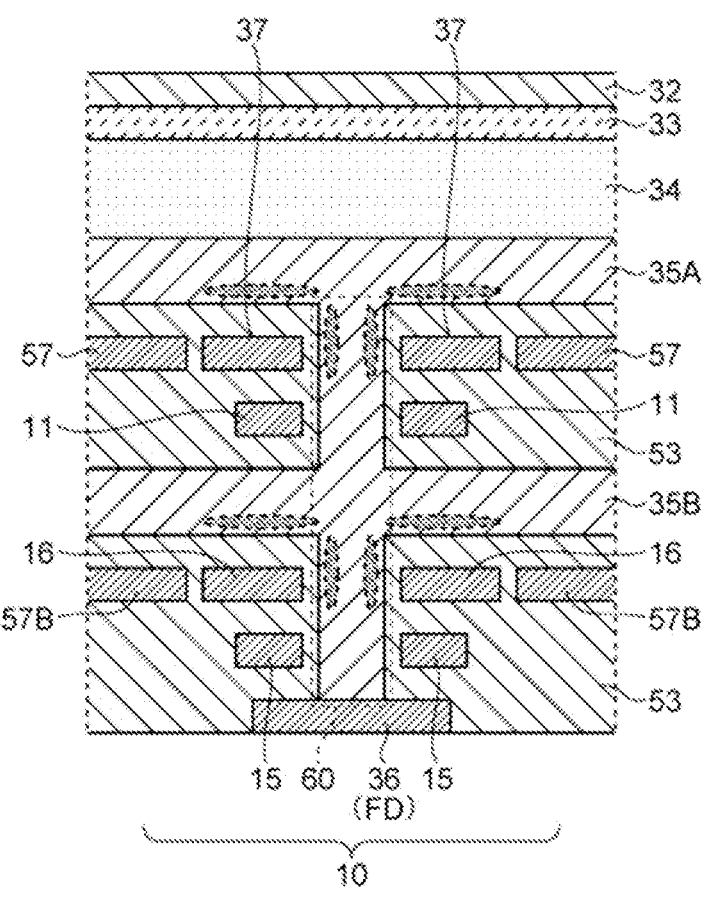
FIG. 24 is a vertical cross-sectional diagram depicting a cross-sectional structure of a pixel according to an eighth example of one embodiment.

In the eighth example, another cross-sectional structure example of the pixel 10 capable of readout drive of the global shutter method will be described. FIG. 24 is a vertical cross-sectional diagram depicting a cross-sectional structure of a pixel according to the eighth example of the present embodiment.

As depicted in FIG. 24, the pixel 10 according to the eighth example has a structure in which the semiconductor layer 35 is divided into two layers of a first semiconductor layer 35A and a second semiconductor layer 35B in a cross-sectional structure similar to that of the pixel 10 according to the sixth example described above with reference to FIG. 21. The insulating layer 53 is interposed between the first semiconductor layer 35A and the second semiconductor layer 35B. The semiconductor wiring 60 penetrates through the first semiconductor layer 35A to the second semiconductor layer 35B and reaches the readout electrode 36.

Similarly to the sixth example, the accumulation electrode 37, the transfer gate 11, and the shield electrode 57 are disposed in the insulating layer 53 between the first semiconductor layer 35A and the second semiconductor layer 35B. On the other hand, the memory electrode 16 and the transfer transistor 15 are disposed in the insulating layer 53 between the second semiconductor layer 35B and the readout electrode 36. More specifically, the memory electrode 16 is disposed on the side of the second semiconductor layer 35B in the semiconductor wiring 60 between the second semiconductor layer 35B and the readout electrode 36, and the gate electrode of the transfer transistor 15 is disposed on the side of the readout electrode 36 in the semiconductor wiring 60 between the second semiconductor layer 35B and the readout electrode 36.

In addition, in the eighth example, in order to suppress the charges held in the region near the memory electrode 16 in the second semiconductor layer 35B from flowing out to the adjacent pixel 10, a shield electrode 57B similar to the shield electrode 57 is provided between the memory electrodes 16 of the adjacent pixels 10. The shield electrode 57B is connected to the vertical drive circuit 102 via a wiring (not depicted) which is one of the pixel drive lines LD. In a case where each pixel 10 is individually driven, the vertical drive circuit 102 applies a drive signal to the shield electrode 57 to form a potential barrier in the second semiconductor layer 35B positioned between the adjacent pixels 10. As a result, since the charges held in the memory MEM of a certain pixel 10 are suppressed from flowing out to the memory MEM of the adjacent pixel 10, the quantum efficiency of the pixel 10 can be further improved.

1.9.9 Ninth Example

In the ninth example, a drive example of the global shutter method will be described. Note that, in the present example, a drive example of the pixel 10 described in the sixth example with reference to FIG. 21 will be described, but the present invention is not limited to this, and can be similarly applied to other examples in which global shutter method drive (hereinafter, referred to as global shutter drive) is possible.

Figure 25:
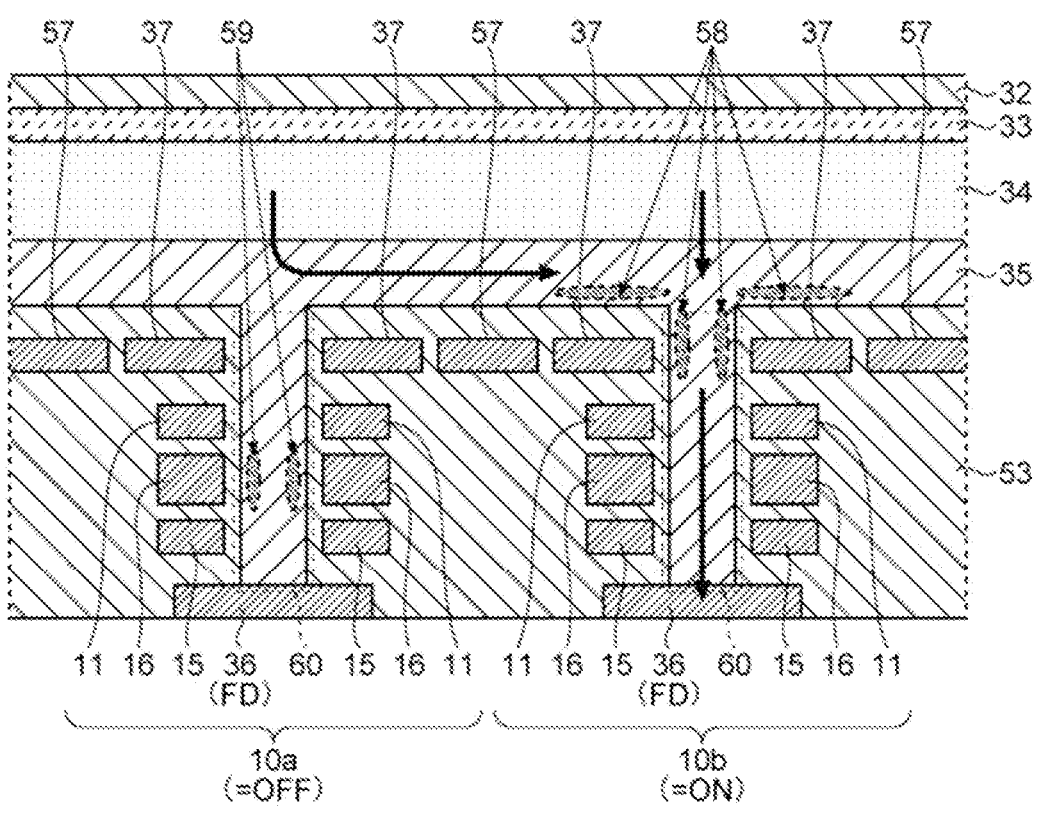
FIG. 25 is a vertical cross-sectional diagram depicting a cross-sectional structure of a pixel according to a ninth example of one embodiment.

FIG. 25 is a vertical cross-sectional diagram depicting a cross-sectional structure of a pixel according to the ninth example of the present embodiment. As depicted in FIG. 25, in the global shutter drive according to the ninth example, the exposure operation is not executed in the other pixel 10 while one pixel 10 of two adjacent pixels 10a and 10b executes the exposure operation. Note that each of the two pixels 10a and 10b may have a configuration similar to that of the pixel 10 described above.

Specifically, for example, while the pixel 10b is executing the exposure operation, the accumulation electrode 37 of the pixel 10b is turned on, and the accumulation electrode 37 of the pixel 10a is turned off. In addition, the shield electrode 57 positioned between the two pixels 10a and 10b is turned off. Furthermore, the transfer gate 11 and the transfer transistor 15 of the pixel 10a, and the transfer gate 11, the memory electrode 16, and the transfer transistor 15 of the pixel 10b are turned off, and the memory electrode 16 of the pixel 10a is turned on. Note that the ON state of the accumulation electrode 37, the shield electrode 57, and the memory electrode 16 refers to a state in which a drive signal is supplied from the vertical drive circuit 102 to each electrode, and the OFF state refers to a state in which a drive signal is not supplied from the vertical drive circuit 102.

In such a state, the charges 58 generated in the photoelectric conversion film 34 corresponding to the photoelectric conversion section PD1 of each of the pixels 10a and 10b are attracted to the accumulation electrode 37 of the pixel 10b. As a result, the charges 58 generated in the photoelectric conversion film 34 are accumulated in the semiconductor layer 35 near the accumulation electrode 37 in the pixel 10b. Note that the outflow destination of the charges 58 overflowing from the semiconductor layer 35 near the accumulation electrode 37 in the pixel 10b may be the floating diffusion region FD connected to the readout electrode 36 of the pixel 10b.

On the other hand, in the pixel 10a, the charges 59 accumulated in the semiconductor layer 35 near the accumulation electrode 37 in the previous frame are held in the memory MEM. The charges 59 accumulated in the memory MEM are sequentially read out by the readout operation for the pixel 10a executed in parallel during the exposure of the pixel 10b, and are used for generation of a pixel signal.

By executing the operation as described above, it is possible to suppress a decrease in parasitic light receiving sensitivity due to the charges overflowing from the accumulation region by the accumulation electrode 37 in the semiconductor layer 35 flowing into the memory MEM.

1.9.10 10th Example

Figure 26:
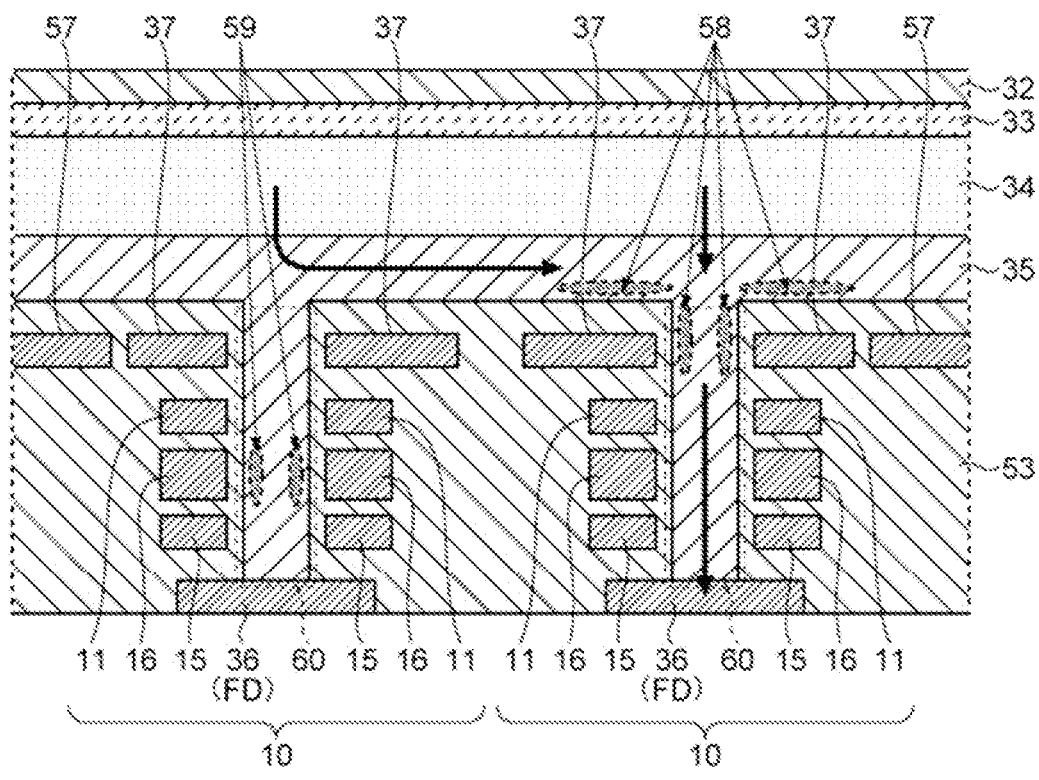
FIG. 26 is a vertical cross-sectional diagram depicting a cross-sectional structure of a pixel according to a 10th example of one embodiment.

In the 10th example, a modification of the pixel 10 for realizing the global shutter drive exemplified in the ninth example will be described. FIG. 26 is a vertical cross-sectional diagram depicting a cross-sectional structure of a pixel according to the 10th example of the present embodiment. In the above-described ninth example, during the execution of the global shutter drive, the shield electrode 57 positioned between the two pixels 10a and 10b forming a pair is turned off. On the other hand, in the 10th example, as depicted in FIG. 26, the shield electrode 57 between the two pixels 10a and 10b forming a pair is omitted. As a result, since the configuration for driving the shield electrode 57 can be omitted, effects such as miniaturization by omitting the shield electrode 57 and the pixel drive line LD for driving the shield electrode 57 and reduction in power consumption at the time of global shutter drive can be obtained.

1.9.11 11th Example

Figure 27:
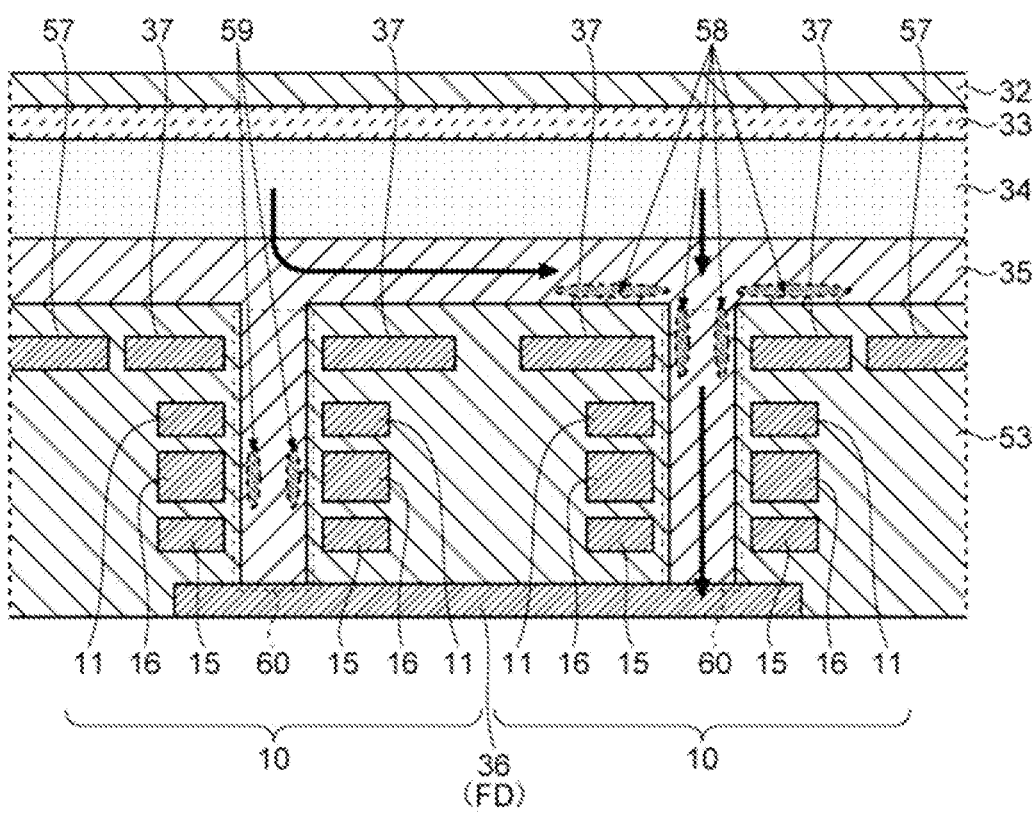
FIG. 27 is a vertical cross-sectional diagram depicting a cross-sectional structure of a pixel according to a 11th example of one embodiment.

In the 11th example, another modification of the pixel 10 for realizing the global shutter drive exemplified in the ninth example will be described. FIG. 27 is a vertical cross-sectional diagram depicting a cross-sectional structure of a pixel according to the 11th example of the present embodiment. As depicted in FIG. 27, in the 11th example, the readout electrodes 36 and the floating diffusion regions FD of the two pixels 10a and 10b forming a pair are made common. As described above, even in a case where the readout electrode 36 and the floating diffusion region FD are shared by the two pixels 10a and 10b forming a pair, global shutter drive can be realized by the driving described in the ninth example.

1.9.12 12th Example

Figure 28:
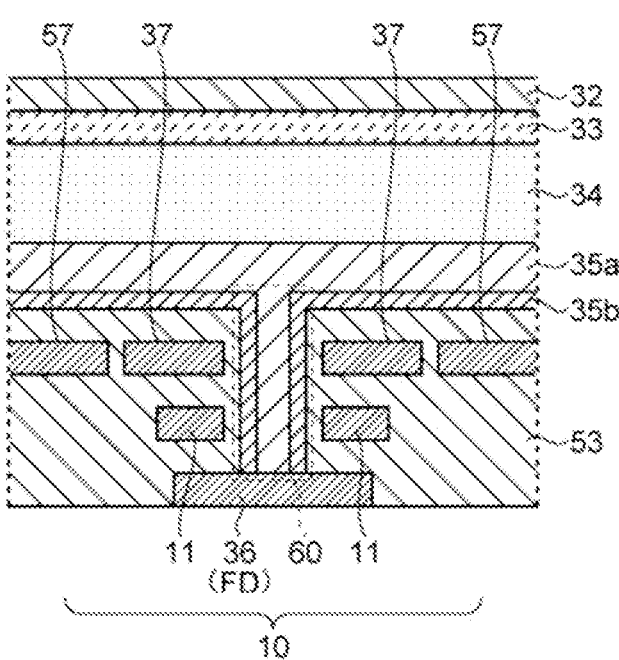
FIG. 28 is a vertical cross-sectional diagram depicting a cross-sectional structure example of a pixel according to a 12th example of one embodiment.

FIG. 28 is a vertical cross-sectional diagram depicting a cross-sectional structure example of the pixel according to the 12th example of the present embodiment. As depicted in FIG. 28, the semiconductor layer 35 (including the first semiconductor layer 35A and the second semiconductor layer 35B described in the eighth example) in each of the examples described above and below may include two layers of a first layer 35a and a second layer 35b. The second layer 35b is provided, for example, on a surface of the semiconductor layer 35 in contact with the insulating layer 53.

The second layer 35b may be a film provided for the purpose of reducing the interface trap level formed between the insulating layer 53 and the first layer 35a. In addition, as a material constituting each of the first layer 35a and the second layer 35b, for example, the same material as the semiconductor layer 35 described above may be used. However, the first layer 35a and the second layer 35b may have different properties depending on, for example, a difference in composition and the like.

As described above, by providing the second layer 35b for reducing the interface trap level between the insulating layer 53 and the first layer 35a, the interface trap level formed between the insulating layer 53 and the first layer 35a is reduced, in a manner that the afterimage generated between the frames can be reduced.

1.9.13 13th Example

Figure 29:
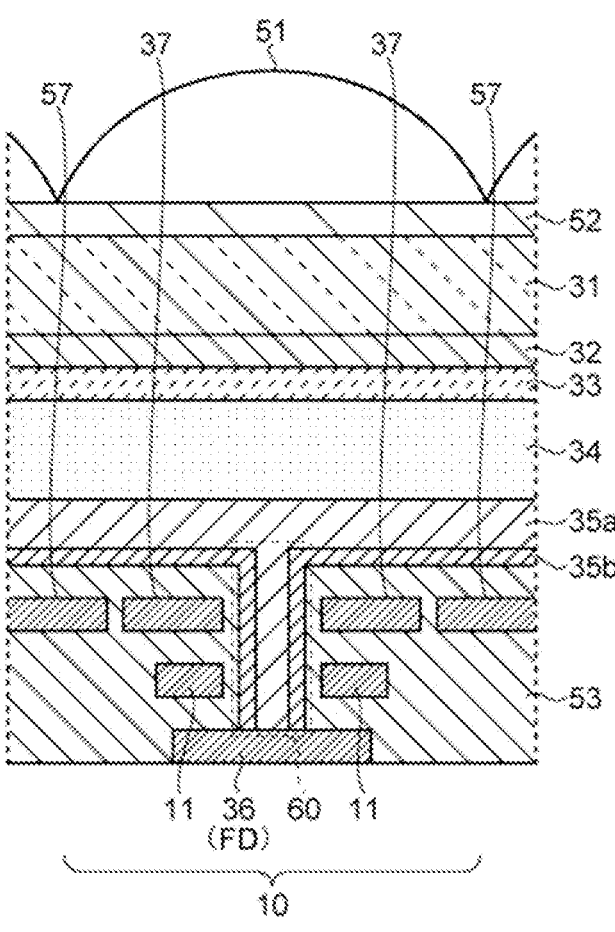
FIG. 29 is a vertical cross-sectional diagram depicting a cross-sectional structure example of a pixel according to a 13th example of one embodiment.
Figure 30:
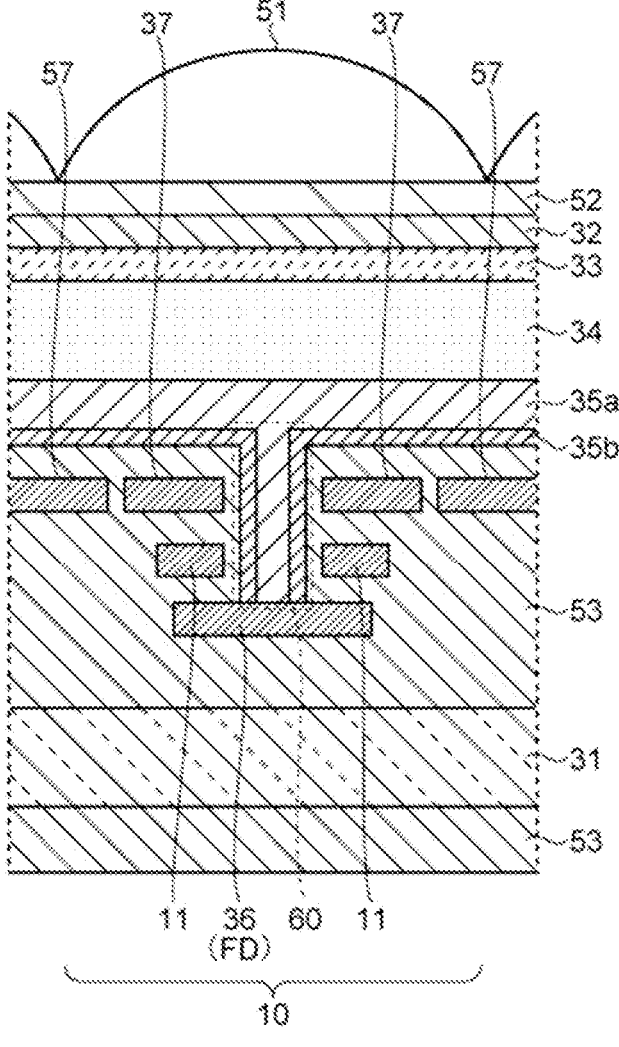
FIG. 30 is a vertical cross-sectional diagram depicting another cross-sectional structure example of a pixel according to the 13th example of one embodiment.

In the 13th example, some examples will be given of the position of the color filter 31 in each example described above or below. In each of the examples described above or described below, the color filter 31 may be disposed on the side of the light incident surface (the side of the on-chip lens 51) with respect to the photoelectric conversion film 34 as depicted in FIG. 29, or may be disposed on the side (the side of the circuit chip 122 (not depicted)) opposite to the light incident surface with respect to the photoelectric conversion film 34 as depicted in FIG. 30. In a case where the color filter 31 is disposed on the side opposite to the light incident surface with respect to the photoelectric conversion film 34, the color filter 31 may be disposed, for example, in the insulating layer 53 as depicted in FIG. 30.

1.9.14 14th Example

In each of the above-described examples, the configuration in which the shield electrode 57 (and the shield electrode 57B) is disposed between the pixels 10 in order to prevent leakage (blooming) of charges between the pixels 10 has been exemplified. On the other hand, in the 14th example, a configuration will be described in which a fixed charge film having the same polarity as the charge is disposed between the pixels 10 instead of the shield electrode 57 (and the shield electrode 57B) to prevent leakage (blooming) of the charges between the pixels 10. Note that, in the following, a case where the pixel 10 described in the first example is used as a base will be described, but the base pixel 10 is not limited to the pixel 10 according to the first example, and may be a pixel 10 according to another example. Similarly to the fixed charge film 55, the material of the fixed charge film can be formed to contain a hafnium oxide film ($HfO_2$ film) or at least one of oxides such as hafnium, zirconium, aluminum, tantalum, titanium, magnesium, yttrium, and lanthanoid elements, for example.

Figure 31:
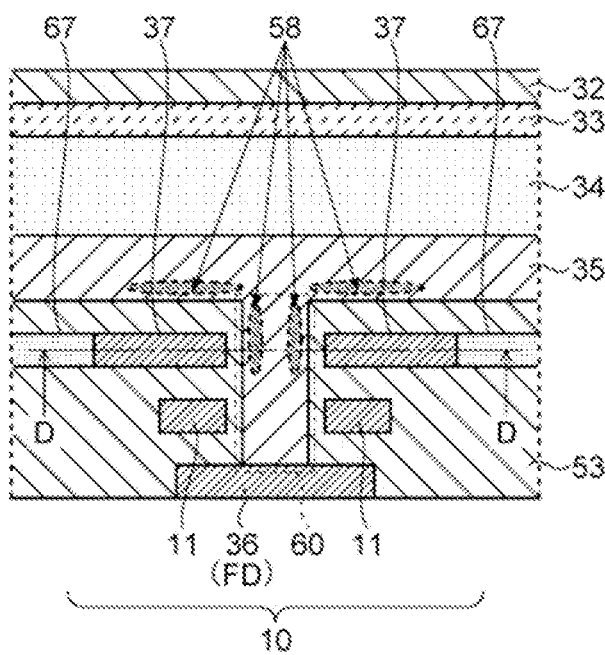
FIG. 31 is a vertical cross-sectional diagram depicting a cross-sectional structure of a pixel according to a 14th example of one embodiment.
Figure 32:
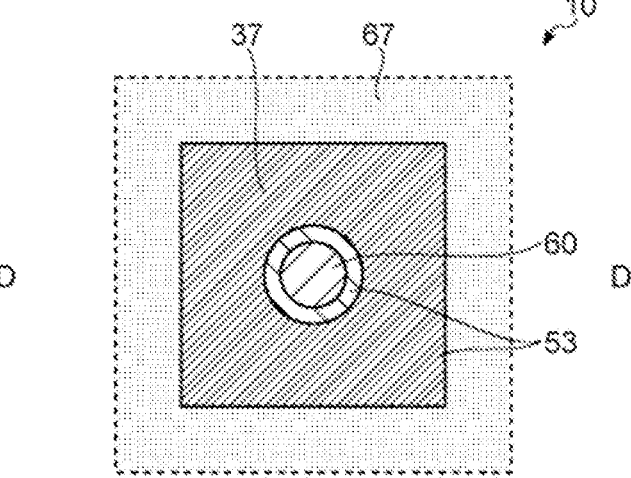
FIG. 32 is a horizontal cross-sectional diagram depicting a D-D cross section in FIG. 31.

FIG. 31 is a vertical cross-sectional diagram depicting a cross-sectional structure of the pixel according to the 14th example of the present embodiment. FIG. 32 is a horizontal cross-sectional diagram depicting a D-D cross section in FIG. 31. As depicted in FIGS. 31 and 32, in the pixel 10 according to the 14th example, a shield charge film 67 is disposed between the adjacent pixels 10. The shield charge film 67 may include a fixed charge film having the same polarity as the charges generated in the photoelectric conversion film 34. In the 14th example, the shield charge film 67 is disposed on the same surface as the surface on which the accumulation electrode 37 is disposed. Note that the shield charge film 67 may be in contact with the side surface of the accumulation electrode 37 or may be separated from the side surface of the accumulation electrode 37.

Also with such a structure, since the charges generated in the photoelectric conversion film 34 of a certain pixel 10 and entering the semiconductor layer 35 are suppressed from flowing out to the adjacent pixel 10, the quantum efficiency of the pixel 10 can be further improved.

In addition, according to the present example, since the configuration for driving the shield electrode 57 can be omitted, it is possible to reduce the size by omitting the shield electrode 57 and the pixel drive line LD for driving the shield electrode 57. Furthermore, in 14th example, since it is not necessary to separate the accumulation electrode 37 from the shield charge film 67, the accumulation electrode 37 can be enlarged. As a result, charges can be efficiently collected by the semiconductor layer 35 near the accumulation electrode 37, in a manner that further improvement in quantum efficiency can be expected.

In the following example, a modification of the position of the shield charge film 67 will be described.

1.9.15 15th Example

Figure 33:
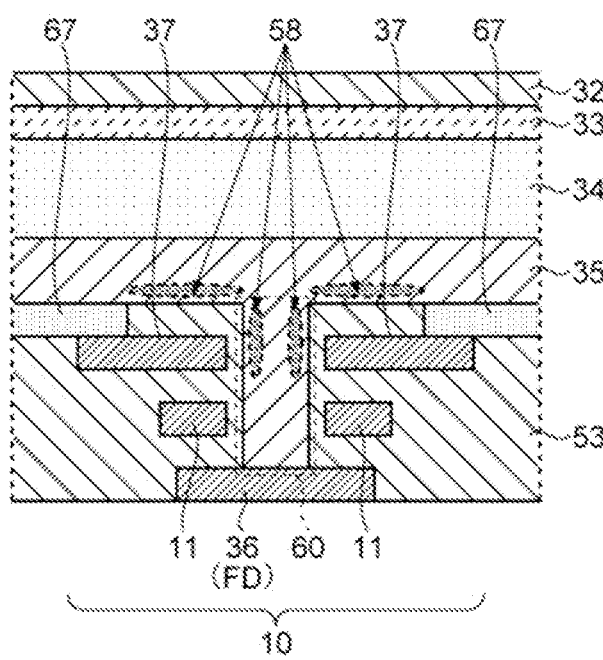
FIG. 33 is a vertical cross-sectional diagram depicting a cross-sectional structure of a pixel according to a 15th example of one embodiment.

FIG. 33 is a vertical cross-sectional diagram depicting a cross-sectional structure of the pixel according to the 15th example of the present embodiment. As depicted in FIG. 33, the shield charge film 67 may be disposed between a surface of the insulating layer 53 on which the upper surface of the accumulation electrode 37 is disposed and the lower surface of the semiconductor layer 35 (other than the semiconductor wiring 60), which is a boundary portion between the adjacent pixels 10. At that time, the region around the opening in the shield charge film 67 may overlap the outer peripheral portion of the accumulation electrode 37 in the vertical direction.

1.9.16 16th Example

Figure 34:
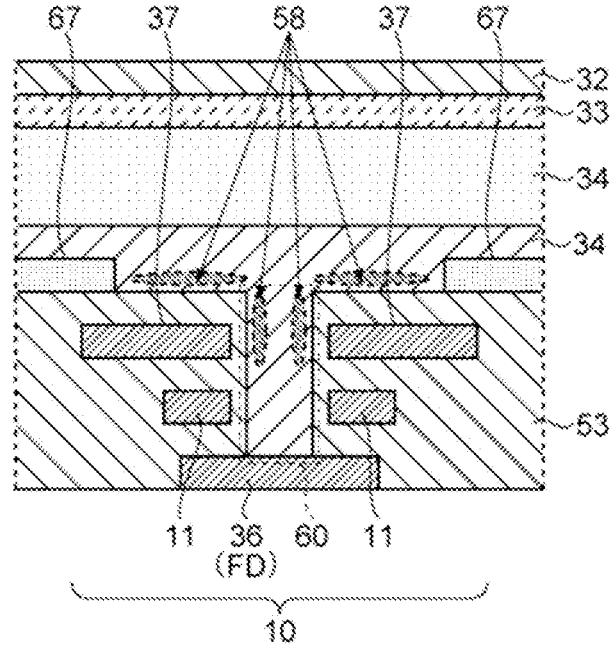
FIG. 34 is a vertical cross-sectional diagram depicting a cross-sectional structure of a pixel according to a 16th example of one embodiment.

FIG. 34 is a vertical cross-sectional diagram depicting a cross-sectional structure of the pixel according to the 16th example of the present embodiment. As depicted in FIG. 34, the shield charge film 67 may be disposed in the lower layer portion of the semiconductor layer 35, that is, a region in contact with the insulating layer 53 in the semiconductor layer 35, which is a boundary portion between the adjacent pixels 10. At that time, the region around the opening in the shield charge film 67 may overlap the outer peripheral portion of the accumulation electrode 37 in the vertical direction.

1.9.17 17th Example

Figure 35:
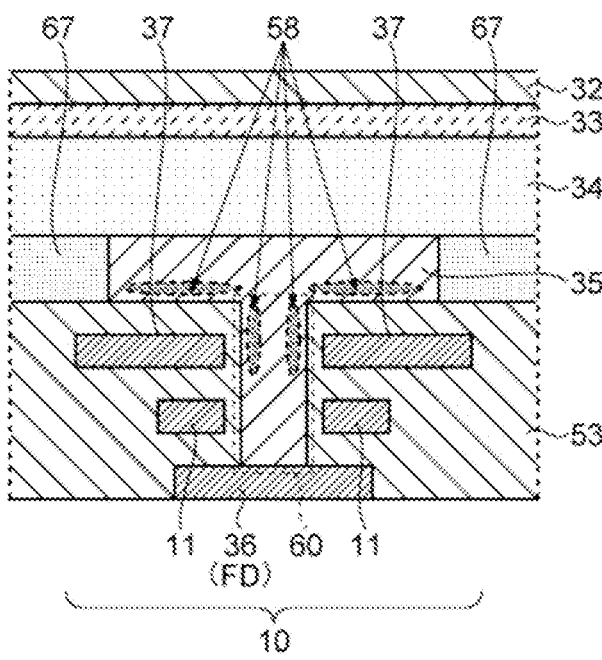
FIG. 35 is a vertical cross-sectional diagram depicting a cross-sectional structure of a pixel according to a 17th example of one embodiment.

FIG. 35 is a vertical cross-sectional diagram depicting a cross-sectional structure of the pixel according to the 17th example of the present embodiment. As depicted in FIG. 35, the shield charge film 67 may be disposed at a boundary portion between the adjacent pixels 10 to replace the semiconductor layer 35 in this portion. At that time, the region around the opening in the shield charge film 67 may overlap the outer peripheral portion of the accumulation electrode 37 in the vertical direction.

1.9.18 18th Example

Figure 36:
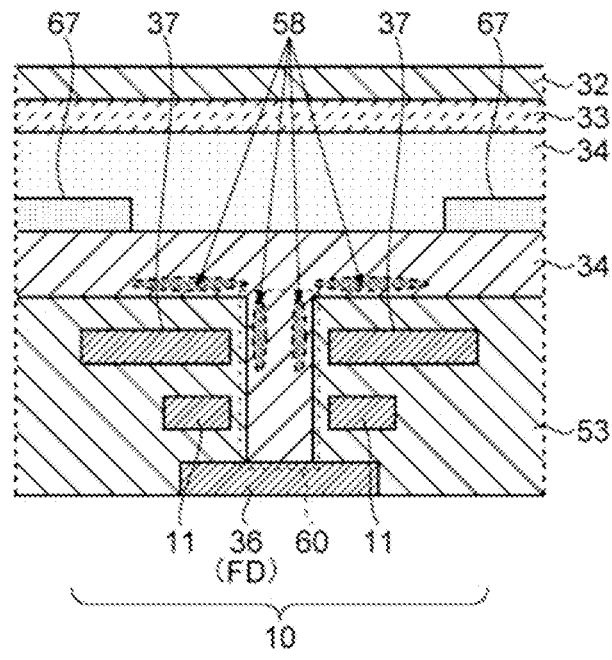
FIG. 36 is a vertical cross-sectional diagram depicting a cross-sectional structure of a pixel according to an 18th example of one embodiment.

FIG. 36 is a vertical cross-sectional diagram depicting a cross-sectional structure of the pixel according to the 18th example of the present embodiment. As depicted in FIG. 36, the shield charge film 67 may be disposed in the lower layer portion of the photoelectric conversion film 34, that is, a region in contact with the semiconductor layer 35 in the photoelectric conversion film 34, which is a boundary portion between the adjacent pixels 10 At that time, the region around the opening in the shield charge film 67 may overlap the outer peripheral portion of the accumulation electrode 37 in the vertical direction.

1.9.19 19th Example

Figure 37:
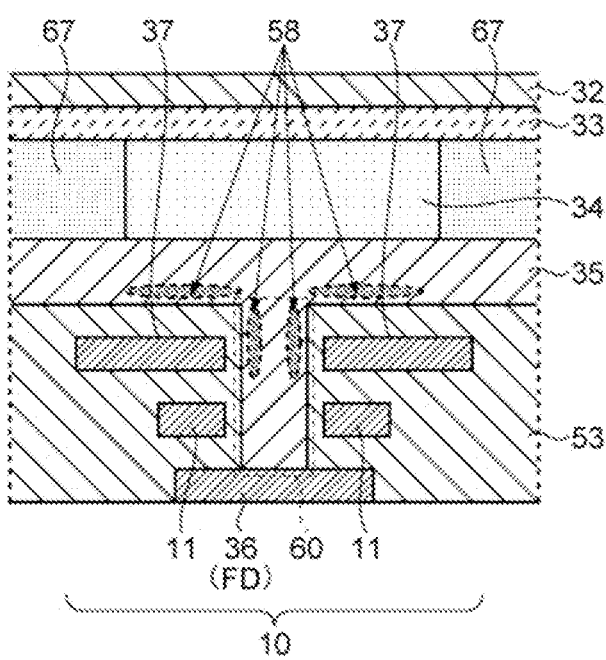
FIG. 37 is a vertical cross-sectional diagram depicting a cross-sectional structure of a pixel according to a 19th example of one embodiment.

FIG. 37 is a vertical cross-sectional diagram depicting a cross-sectional structure of the pixel according to the 19th example of the present embodiment. As depicted in FIG. 37, the shield charge film 67 may be disposed at a boundary portion between the adjacent pixels 10 to replace the photoelectric conversion film 34 in this portion. At that time, the region around the opening in the shield charge film 67 may overlap the outer peripheral portion of the accumulation electrode 37 in the vertical direction.

1.9.20 20th Example

Figure 38:
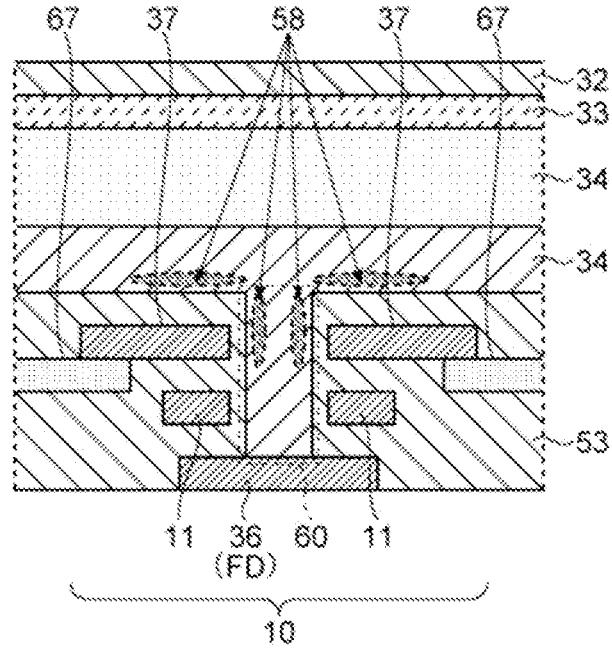
FIG. 38 is a vertical cross-sectional diagram depicting a cross-sectional structure of a pixel according to a 20th example of one embodiment.
Figure 39:
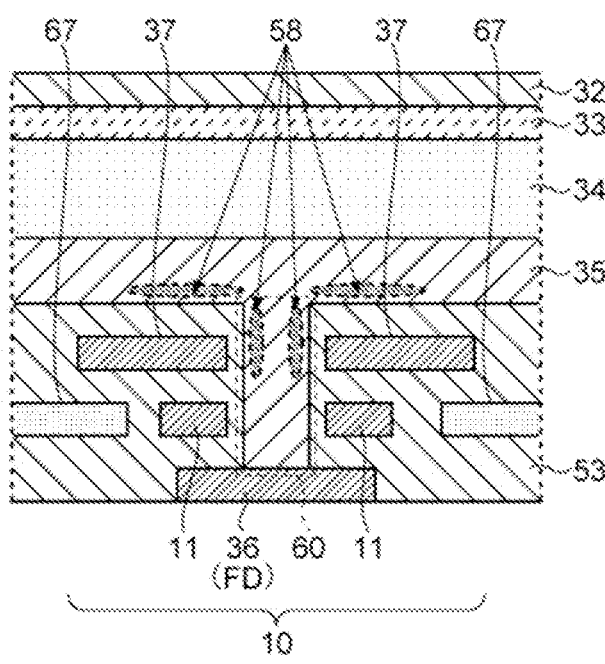
FIG. 39 is a vertical cross-sectional diagram depicting another cross-sectional structure of a pixel according to the 20th example of one embodiment.

FIGS. 38 and 39 are vertical cross-sectional diagrams depicting a cross-sectional structure of the pixel according to the 20th example of the present embodiment. As depicted in FIGS. 38 and 39, the shield charge film 67 may be disposed below the lower surface of the accumulation electrode 37 in the insulating layer 53 (on the side of the readout electrode 36), which is a boundary portion between the adjacent pixels 10. At that time, the region around the opening in the shield charge film 67 may overlap the outer peripheral portion of the accumulation electrode 37 in the vertical direction. In addition, the region around the opening in the shield charge film 67 and the outer peripheral portion of the accumulation electrode 37 may be in contact with each other as depicted in FIG. 38, or may be separated from each other in the vertical direction as depicted in FIG. 39.

1.10 Pixel Drive Example

Next, a method of driving the above-described pixel 10 will be described with some examples.

1.10.1 First Drive Example

First, a drive example of the pixel 10 that does not include the memory MEM for global shutter drive will be described. In the present description, the method of driving the pixel 10 according to the first example described above with reference to FIG. 12 is exemplified, but the driving method is not limited to the first example, and a similar driving method can be applied to the pixel 10 according to another example.

Figure 40:
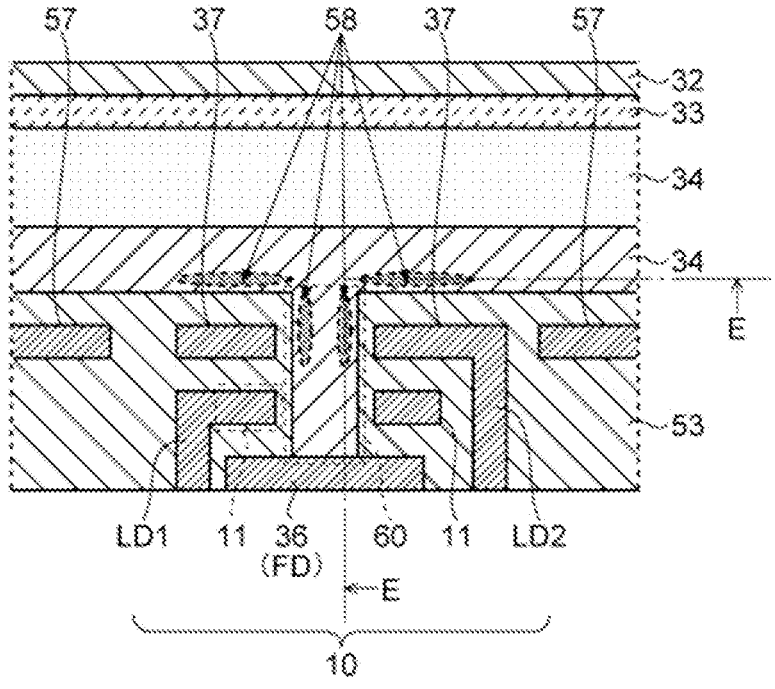
FIG. 40 is a vertical cross-sectional diagram depicting a cross-sectional structure example of a pixel cited for describing a first drive example of one embodiment.
Figure 41:
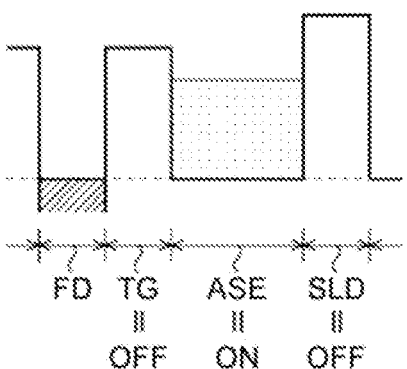
FIG. 41 is a band diagram depicting a potential for each driving step along an E-E surface in FIG. 40 (part 1).
Figure 42:
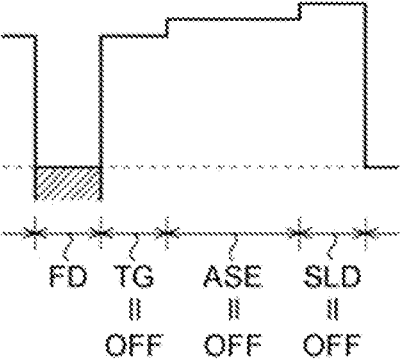
FIG. 42 is a band diagram depicting a potential for each driving step along the E-E surface in FIG. 40 (part 2).
Figure 43:
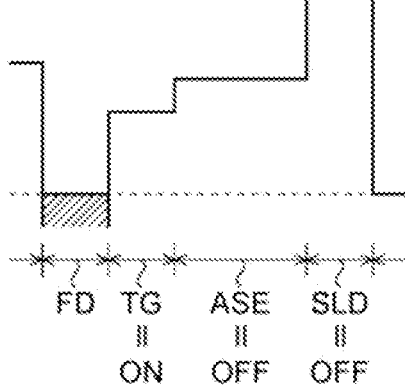
FIG. 43 is a band diagram depicting a potential for each driving step along the E-E surface in FIG. 40 (part 2-2).

FIG. 40 is a vertical cross-sectional diagram depicting a cross-sectional structure example of the pixel cited for describing the first drive example. The cross-sectional structure of the pixel 10 depicted in FIG. 40 may be similar to the cross-sectional structure of the pixel 10 according to the first example described above with reference to FIG. 12. In addition, FIGS. 41 to 43 are band diagrams depicting a potential for each driving step along the E-E surface in FIG. 40. Note that, in FIGS. 41 to 43, the vertical axis represents the potential, and the horizontal axis represents the position along the E-E surface. In addition, in FIGS. 41 to 43 and a drive example to be described later, a region (also referred to as a gate region) of the semiconductor wiring 60 having potential controlled by the transfer gate 11 is denoted as 'TG', a region (also referred to as an accumulation region) of the semiconductor layer 35 having potential controlled by the accumulation electrode 37 is denoted as 'ASE', and a region (also referred to as a shield region) of the semiconductor layer 35 having potential controlled by the shield electrode 57 is denoted as 'SLD'.

In the structure depicted in FIG. 40, during the exposure period (exposure step) of the pixel 10, as depicted in FIG. 41, the transfer gate 11 is turned off (OFF), and the accumulation electrode 37 is turned on (ON). As a result, the potential of an accumulation region ASE is lowered, and a high potential barrier is formed in a gate region TG. As a result, the charges 58 generated in the photoelectric conversion film 34 and entering the semiconductor layer 35 are accumulated in the accumulation region ASE. At that time, by keeping the shield electrode 57 in the OFF state, it is possible to suppress leakage of the charges 58 to the adjacent pixel via a shield region SLD. Note that the potential of the shield region SLD when the shield electrode 57 is in the OFF state is desirably higher than the potential of the gate region TG when the transfer gate 11 is in the OFF state.

Next, during a period during which the charges 58 accumulated in the accumulation region ASE in the exposure step are transferred to the floating diffusion region FD (transfer step), the accumulation electrode 37 is turned off as depicted in FIG. 42. The potential of the accumulation region ASE when the accumulation electrode 37 is in the OFF state may be set to a potential higher than the potential of the gate region TG when the transfer gate 11 is in the OFF state and lower than the potential of the shield region SLD when the shield electrode 57 is in the OFF state. As a result, the charges 58 accumulated in the accumulation region ASE can flow out to the floating diffusion region FD via the gate region TG. Note that, in this drive example, since the transfer gate 11 maintains the OFF state, control at the time of charge transfer can be facilitated.

In addition, as depicted in FIG. 43, in the transfer step, the transfer gate 11 may be turned on. As a result, the charges 58 can be more smoothly transferred from the accumulation region ASE to the floating diffusion region FD. In addition, it is also possible to lower the potential of the accumulation region ASE when the accumulation electrode 37 is in the OFF state and to reduce the amount of change in the potential of the accumulation region ASE when the accumulation electrode 37 is in the ON state.

1.10.2 Second Drive Example

Next, a drive example of the pixel 10 capable of global shutter drive will be described. In the present description, the method of driving the pixel 10 according to the sixth example described above with reference to FIG. 21 is exemplified, but the driving method is not limited to the sixth example, and a similar driving method can be applied to the pixel 10 according to another example including the memory MEM.

Figure 44:
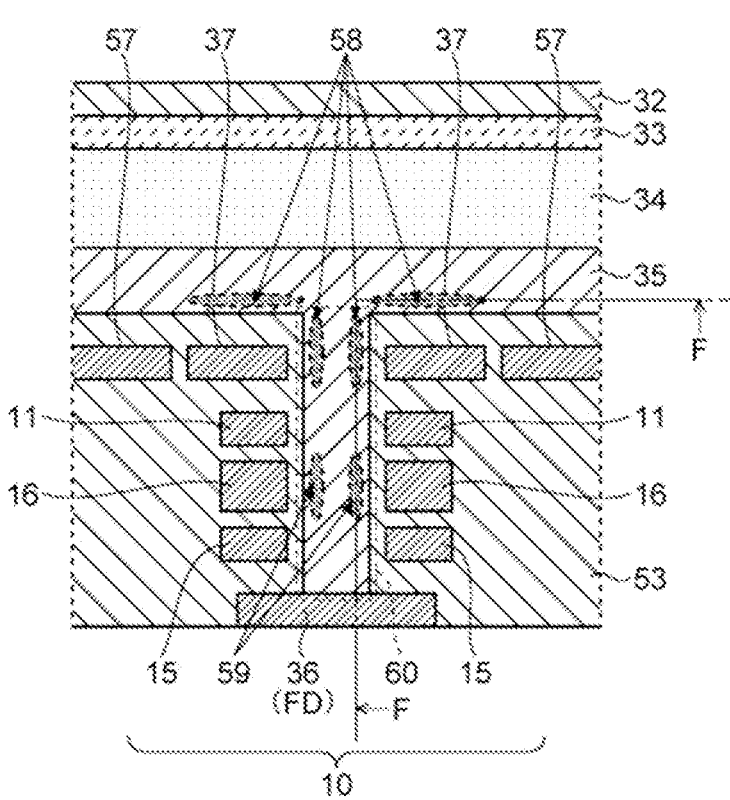
FIG. 44 is a vertical cross-sectional diagram depicting a cross-sectional structure example of a pixel cited for describing a second drive example of one embodiment.

FIG. 44 is a vertical cross-sectional diagram depicting a cross-sectional structure example of the pixel cited for describing the second drive example. The cross-sectional structure of the pixel 10 depicted in FIG. 44 may be similar to the cross-sectional structure of the pixel 10 according to the sixth example described above with reference to FIG. 21. In addition, FIGS. 45 to 48 are band diagrams depicting a potential for each driving step along the F-F surface in FIG. 44. Note that, in FIGS. 45 to 48, the vertical axis represents the potential, and the horizontal axis represents the position along the F-F surface. In addition, in FIGS. 44 to 48 and a drive example to be described later, a region of the semiconductor wiring 60 having potential controlled by the memory electrode 16 (corresponding to the memory MEM, and also referred to as a memory region) is represented as 'MEM', and a region of the semiconductor wiring 60 having potential controlled by the transfer transistor 15 is represented as 'TX'.

Figure 45:
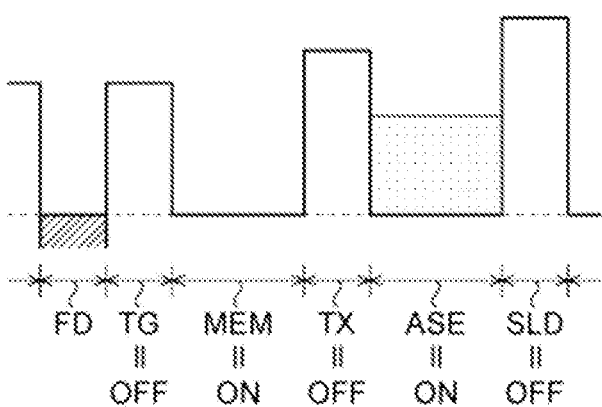
FIG. 45 is a band diagram depicting a potential for each driving step along an F-F surface in FIG. 44 (part 1).

In the structure depicted in FIG. 44, during the exposure period (exposure step) of the pixel 10, as depicted in FIG. 45, the transfer gate 11 and the transfer transistor 15 are turned off (OFF), and the accumulation electrode 37 and the memory MEM are turned on (ON). As a result, the potential of the accumulation region ASE and a memory region MEM is lowered, and a high potential barrier is formed in the gate regions TG and TX. As a result, the charges 58 generated in the photoelectric conversion film 34 and entering the semiconductor layer 35 are accumulated in the accumulation region ASE. At that time, by keeping the shield electrode 57 in the OFF state, it is possible to suppress leakage of the charges 58 to the adjacent pixel via a shield region SLD. Note that the potential of the shield region SLD when the shield electrode 57 is in the OFF state is desirably higher than the potential of the gate region TX when the transfer transistor 15 is in the OFF state.

Figure 46:
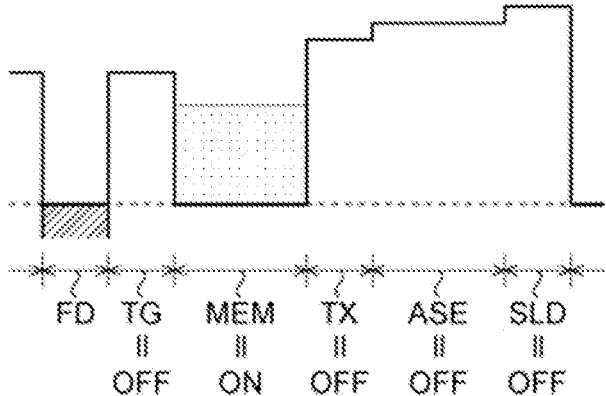
FIG. 46 is a band diagram depicting a potential for each driving step along the F-F surface in FIG. 44 (part 2).

Next, during a period during which the charges 58 accumulated in the accumulation region ASE in the exposure step are transferred to the memory MEM (transfer step), the accumulation electrode 37 is turned off as depicted in FIG. 46. The potential of the accumulation region ASE when the accumulation electrode 37 is in the OFF state may be set to a potential higher than the potential of the gate region TX when the transfer transistor 15 is in the OFF state and lower than the potential of the shield region SLD when the shield electrode 57 is in the OFF state. As a result, the charges 58 accumulated in the accumulation region ASE can flow out to the memory MEM via the gate region TX.

Figure 47:
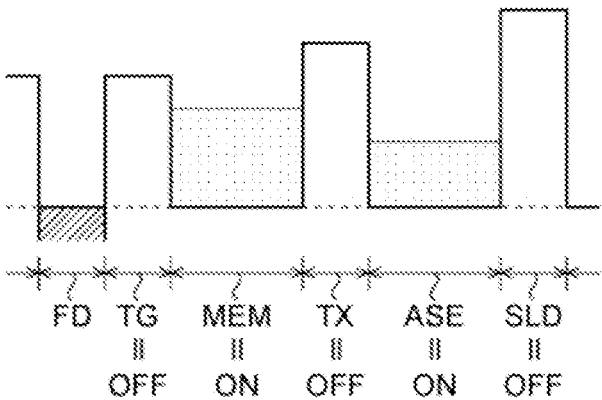
FIG. 47 is a band diagram depicting a potential for each driving step along the F-F surface in FIG. 44 (part 3).

Next, as depicted in FIG. 47, by turning on the accumulation electrode 37 again, the charges 59 generated in the photoelectric conversion film 34 and entering the semiconductor layer 35 are stored in the accumulation region ASE.

Figure 48:
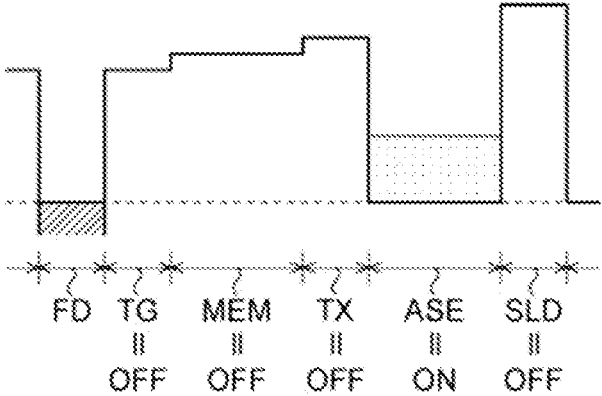
FIG. 48 is a band diagram depicting a potential for each driving step along the F-F surface in FIG. 44 (part 4).

Next, as depicted in FIG. 48, the memory MEM is turned off while the accumulation electrode 37 is maintained in the ON state. As a result, it is possible to transfer the charges 59 held in the memory MEM to the floating diffusion region FD while continuing the exposure operation.

1.10.3 Third Drive Example

Next, a modification of the second drive example will be described below as a third drive example. In the present description, similarly to the second drive example, the method of driving the pixel 10 according to the sixth example is exemplified, but the driving method is not limited to the sixth example, and a similar driving method can be applied to the pixel 10 according to another example including the memory MEM. In addition, the cross-sectional structure example of the pixel 10 cited for describing the third drive example may be similar to the cross-sectional structure of the pixel 10 depicted in FIG. 44.

In the third drive example, the exposure step of storing the charges generated in the photoelectric conversion film 34 in the accumulation region ASE may be similar to the operation described with reference to FIG. 45 in the second drive example.

Figure 49:
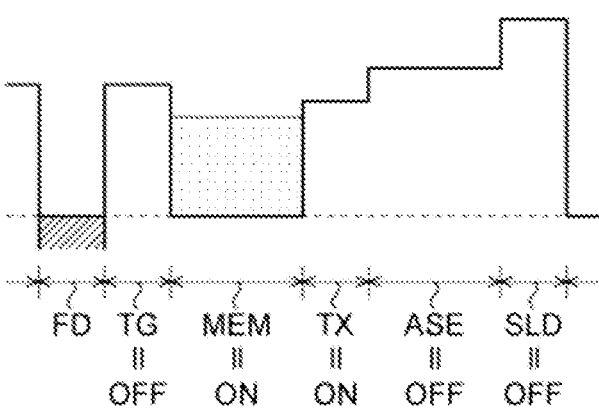
FIG. 49 is a band diagram depicting a potential for each driving step along the F-F surface in FIG. 44 (part 2-2).

Next, in the transfer step during which the charges 58 accumulated in the accumulation region ASE in the exposure step are transferred to the memory MEM, the accumulation electrode 37 is turned off and the transfer gate 11 is turned on as depicted in FIG. 49. As a result, the charges 58 can be more smoothly transferred from the accumulation region ASE to the memory MEM. In addition, it is also possible to lower the potential of the accumulation region ASE when the accumulation electrode 37 is in the OFF state and to reduce the amount of change in the potential of the accumulation region ASE when the accumulation electrode 37 is in the ON state.

Next, similarly to the drive described with reference to FIG. 47 in the second drive example, by turning on the accumulation electrode 37 again, the charges 58 generated in the photoelectric conversion film 34 and entering the semiconductor layer 35 are stored in the accumulation region ASE. Note that, in the present drive, the transfer gate 11 is switched from the ON state to the OFF state.

Figure 50:
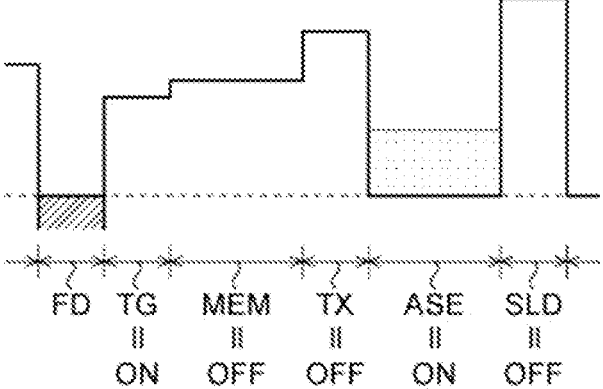
FIG. 50 is a band diagram depicting a potential for each driving step along the F-F surface in FIG. 44 (part 4-2).

Next, as depicted in FIG. 50, the memory MEM is turned off and the transfer transistor is turned on while the accumulation electrode 37 is maintained in the ON state. As a result, it is possible to transfer the charges 59 held in the memory MEM to the floating diffusion region FD while continuing the exposure operation. In addition, the charges 59 can be more smoothly transferred from the floating memory MEM to the floating diffusion region FD. Furthermore, it is also possible to lower the potential of the memory region MEM when the memory MEM is in the OFF state and to reduce the amount of change in the potential of the memory region MEM when the memory MEM is in the ON state.

1.11 Summary

As described above, according to the present embodiment, the potential barrier between the accumulation electrode 37 and the readout electrode 36 is controlled using the transfer gate 11. As a result, it is possible to suppress leakage of the charges accumulated in the semiconductor layer 35 near the accumulation electrode 37 to the side of the readout electrode 36, and thus, it is possible to improve the quantum efficiency. In addition, the potential barrier between the adjacent pixels 10 is controlled using the shield electrode 57 or the shield charge film 67. As a result, since the charges generated in the photoelectric conversion film 34 of a certain pixel 10 and entering the semiconductor layer 35 are suppressed from flowing out to the adjacent pixel 10 (blooming), the quantum efficiency of the pixel 10 can be further improved.

2. Variation of Cross-Sectional Structure

Here, some variations of the cross-sectional structure of the image sensor 100 according to the above-described embodiment will be described. Note that a structure that is not particularly limited in the following description may be the same as the cross-sectional structure described above.

2.1 First Variation

Figure 51:
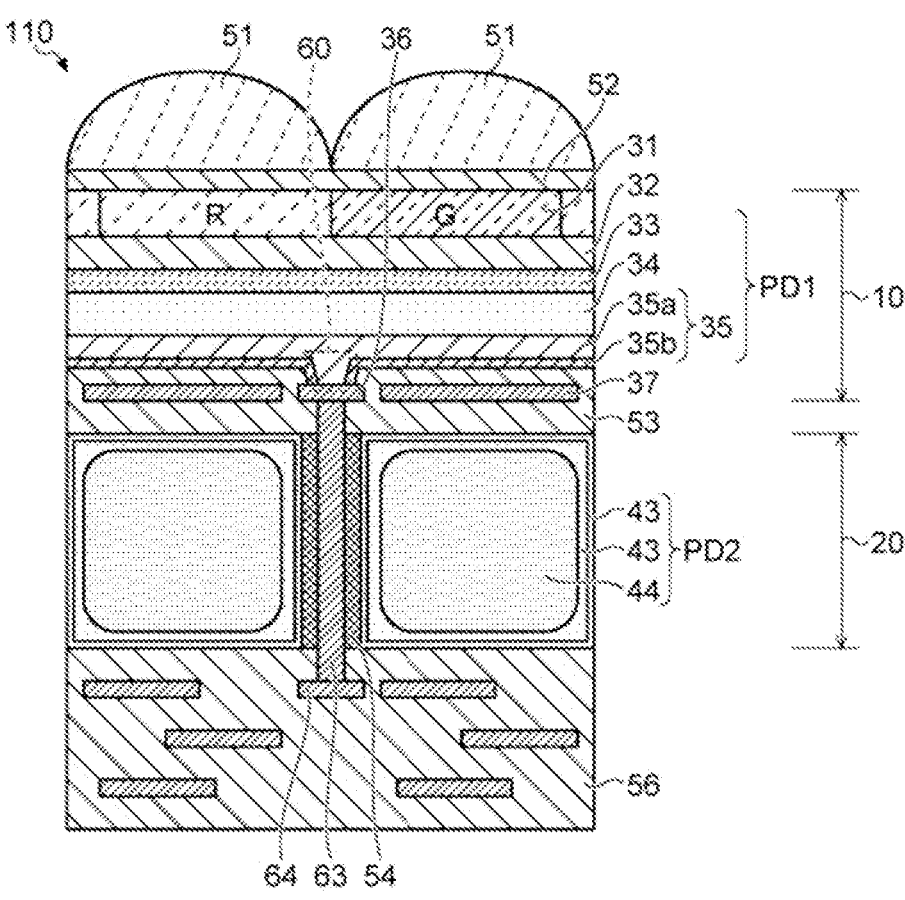
FIG. 51 is a vertical cross-sectional diagram depicting a cross-sectional structure example of an image sensor according to a first variation of the present disclosure.
Figure 52:
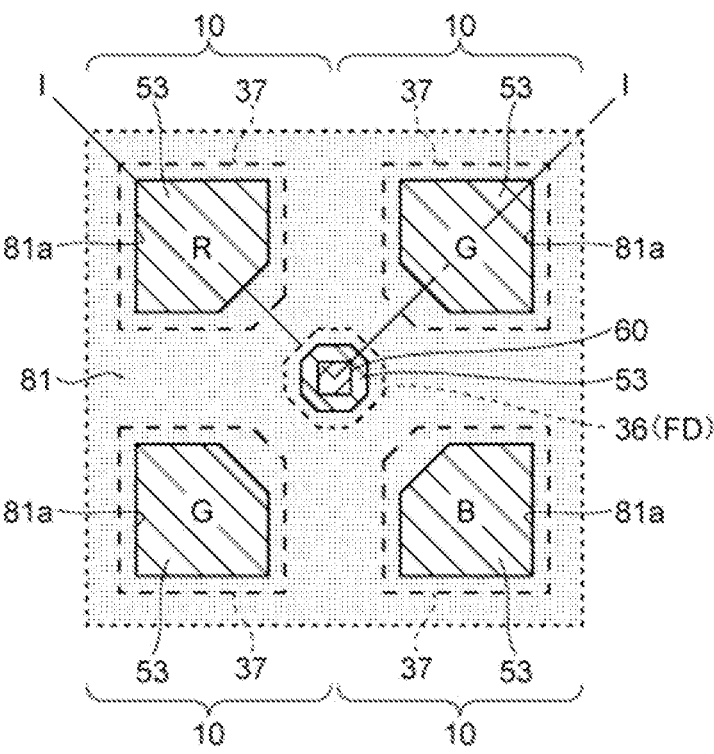
FIG. 52 is a horizontal cross-sectional diagram depicting an I-I cross section in FIG. 51.

FIG. 51 is a vertical cross-sectional diagram depicting a cross-sectional structure example of the image sensor according to the first variation. FIG. 52 is a horizontal cross-sectional diagram depicting the I-I cross section in FIG. 51. As depicted in FIGS. 51 and 52, the image sensor 100 is, for example, a stacked-type imaging element in which RGB pixels 10 disposed on the upstream side with respect to incident light and IR pixels 20 disposed on the downstream side are stacked. On the upstream side, for example, four RGB pixels 10 of one RGB pixel 10 including the color filter 31r that selectively transmits red light (R), two RGB pixels 10 including the color filter 31g that selectively transmits green light (G), and one RGB pixel 10 including the color filter 31b that selectively transmits blue light (B) are disposed to form a unit array of 2 rows×2 columns in the Bayer array. In the pixel array section 101, this unit array is a repeating unit, and is repeatedly disposed in an array including a row direction and a column direction.

In a unit array including four RGB pixels 10 disposed in 2 rows×2 columns, two color filters 31g that selectively transmit green light (G) are disposed on a diagonal line, and color filters 31r and 31b that selectively transmit red light (R) and blue light (B) are disposed one by one on an orthogonal diagonal line. The photoelectric conversion film 34 of each of the RGB pixels 10 provided with one of the color filters 31r, 31g, and 31b photoelectrically converts color light corresponding to each of the color filters 31 to generate charges.

Of the light transmitted through the color filters 31, light in the visible light region (red light (R), green light (G) and blue light (B)) is absorbed by the photoelectric conversion film 34 of the RGB pixel 10 provided with each color filter 31, and other light, for example, light in the infrared light region (for example, 700 nm or more and 1000 nm or less) (IR light) is transmitted through the photoelectric conversion film 34. The IR light transmitted through the photoelectric conversion film 34 is detected by the photoelectric conversion section PD1 of the IR pixel 20 disposed downstream with respect to each RGB pixel 10. As described above, the image sensor 100 according to the first variation can simultaneously generate both the visible light image and the infrared light image.

2.2 Second Variation

Figure 53:
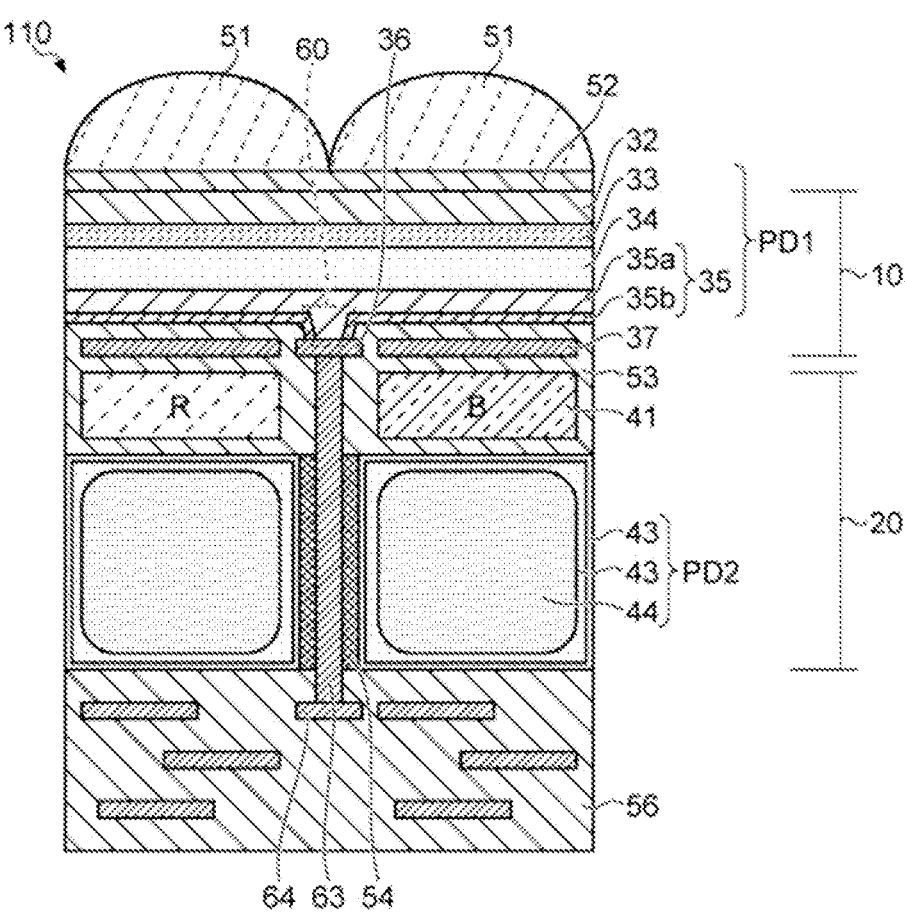
FIG. 53 is a vertical cross-sectional diagram depicting a cross-sectional structure example of an image sensor according to a second variation of the present disclosure.
Figure 54:
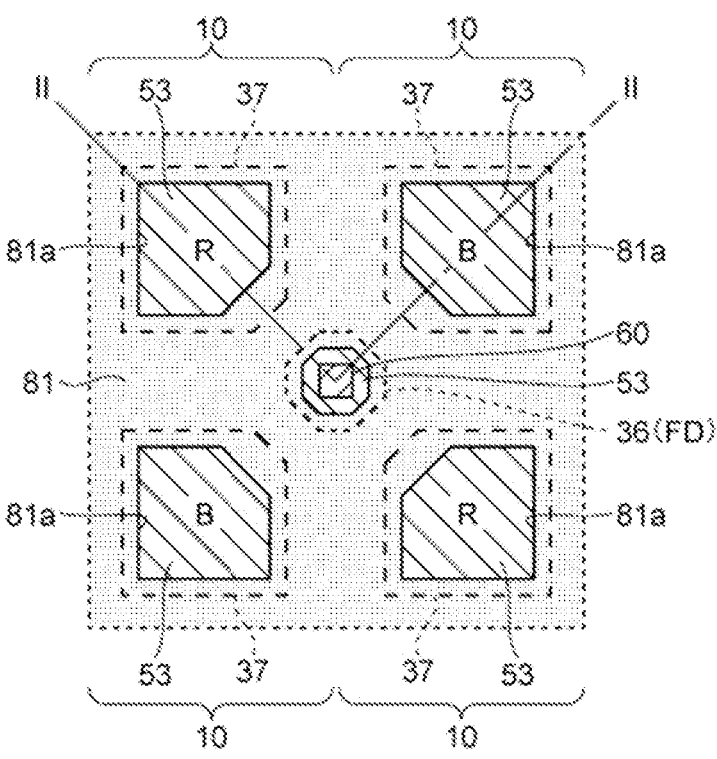
FIG. 54 is a horizontal cross-sectional diagram depicting an II-II cross section in FIG. 53.

FIG. 53 is a vertical cross-sectional diagram depicting a cross-sectional structure example of the image sensor according to the second variation. FIG. 54 is a horizontal cross-sectional diagram depicting the II-II cross section in FIG. 53. In the first variation described above, an example has been described in which the color filter 31 that selectively transmits the red light (R), the green light (G), and the blue light (B) is provided above the photoelectric conversion film 34 (light incident side), but the color filter 31 may be provided between the photoelectric conversion section PD1 and the photoelectric conversion section PD2, for example, as depicted in FIG. 53.

In the second variation, for example, the color filter 31 has a configuration in which the color filter 31r that selectively transmits at least red light (R) and the color filter 31b that selectively transmits at least blue light (B) are disposed diagonally to each other. The photoelectric conversion film 34 positioned on the upstream side with respect to the incident light is configured to selectively absorb a wavelength corresponding to green light, for example. As a result, signals corresponding to the three primary colors of RGB can be acquired in the photoelectric conversion section PD1 on the upstream side and the photoelectric conversion section PD2 on the downstream side disposed below the color filters 31r and 31b, respectively. In the second variation, since the light receiving areas of the photoelectric conversion sections PD1 and PD2 of the three primary colors of RGB can be enlarged as compared with an imaging element having a general Bayer array, the S/N ratio can be improved.

3. Configuration Example of Imaging Device

Figure 55:
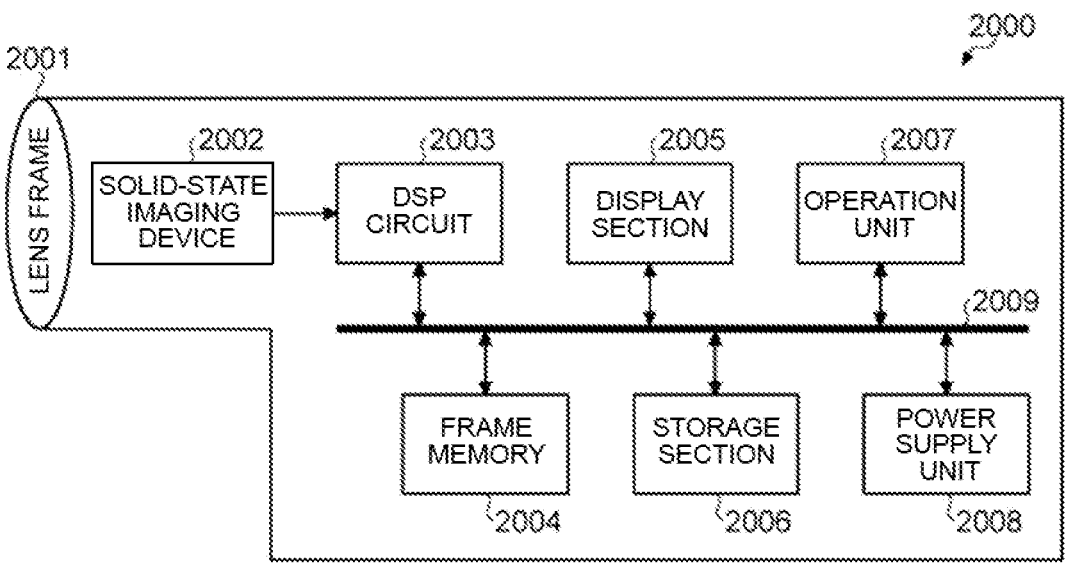
FIG. 55 is a block diagram depicting a configuration example of an embodiment of an imaging device as an electronic apparatus to which the present disclosure is applied.

FIG. 55 is a block diagram depicting a configuration example of an embodiment of an imaging device as an electronic apparatus to which the present disclosure is applied.

An imaging device 2000 in FIG. 55 is a video camera, a digital still camera, and the like. The imaging device 2000 includes a lens group 2001, a solid-state imaging device 2002, a DSP circuit 2003, a frame memory 2004, a display section 2005, a recording unit 2006, an operation unit 2007, and a power supply unit 2008. The DSP circuit 2003, the frame memory 2004, the display section 2005, the recording unit 2006, the operation unit 2007, and the power supply unit 2008 are mutually connected via a bus line 2009.

The lens group 2001 captures incident light (image light) from a subject and forms an image on the imaging surface of the solid-state imaging device 2002. The solid-state imaging device 2002 may be the image sensor 100 according to the above-described embodiment. The solid-state imaging device 2002 converts the light amount of the incident light imaged on the imaging surface by the lens group 2001 into an electric signal in units of pixels and supplies the electric signal to the DSP circuit 2003 as a pixel signal.

The DSP circuit 2003 performs predetermined image processing on the pixel signal supplied from the solid-state imaging device 2002, supplies the image signal after the image processing to the frame memory 2004 in units of frames, and temporarily stores the image signal.

The display section 2005 includes, for example, a panel type display device such as a liquid crystal panel or an organic electro luminescence (EL) panel, and displays an image on the basis of the pixel signal in frame units temporarily stored in the frame memory 2004.

The recording unit 2006 includes a digital versatile disk (DVD), a flash memory, and the like, and reads and records the pixel signals in units of frames temporarily stored in the frame memory 2004.

The operation unit 2007 issues operation commands for various functions of the imaging device 2000 under operation by the user. The power supply unit 2008 appropriately supplies power to the DSP circuit 2003, the frame memory 2004, the display section 2005, the recording unit 2006, and the operation unit 2007.

The electronic apparatus to which the present technology is applied may be an apparatus using an image sensor as an image capturing unit (photoelectric conversion section), and examples include a mobile terminal apparatus having an imaging function, a copying machine using an image sensor as an image reading unit, and the like, in addition to the imaging device 2000.

4. Application Example to Mobile Body

The technology according to the present disclosure (the present technology) can be applied to various products. For example, the technology according to the present disclosure may be realized by devices mounted on any type of mobile body such as an automobile, an electric car, a hybrid electric car, a motorcycle, a bicycle, a personal mobility, an airplane, a drone, a ship, and a robot.

FIG. 56 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 56, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 56, an audio speaker 12061, a display section 12062, and an instrument panel 12063 are illustrated as the output device. The display section 12062 may, for example, include at least one of an on-board display and a head-up display.

Figure 57:
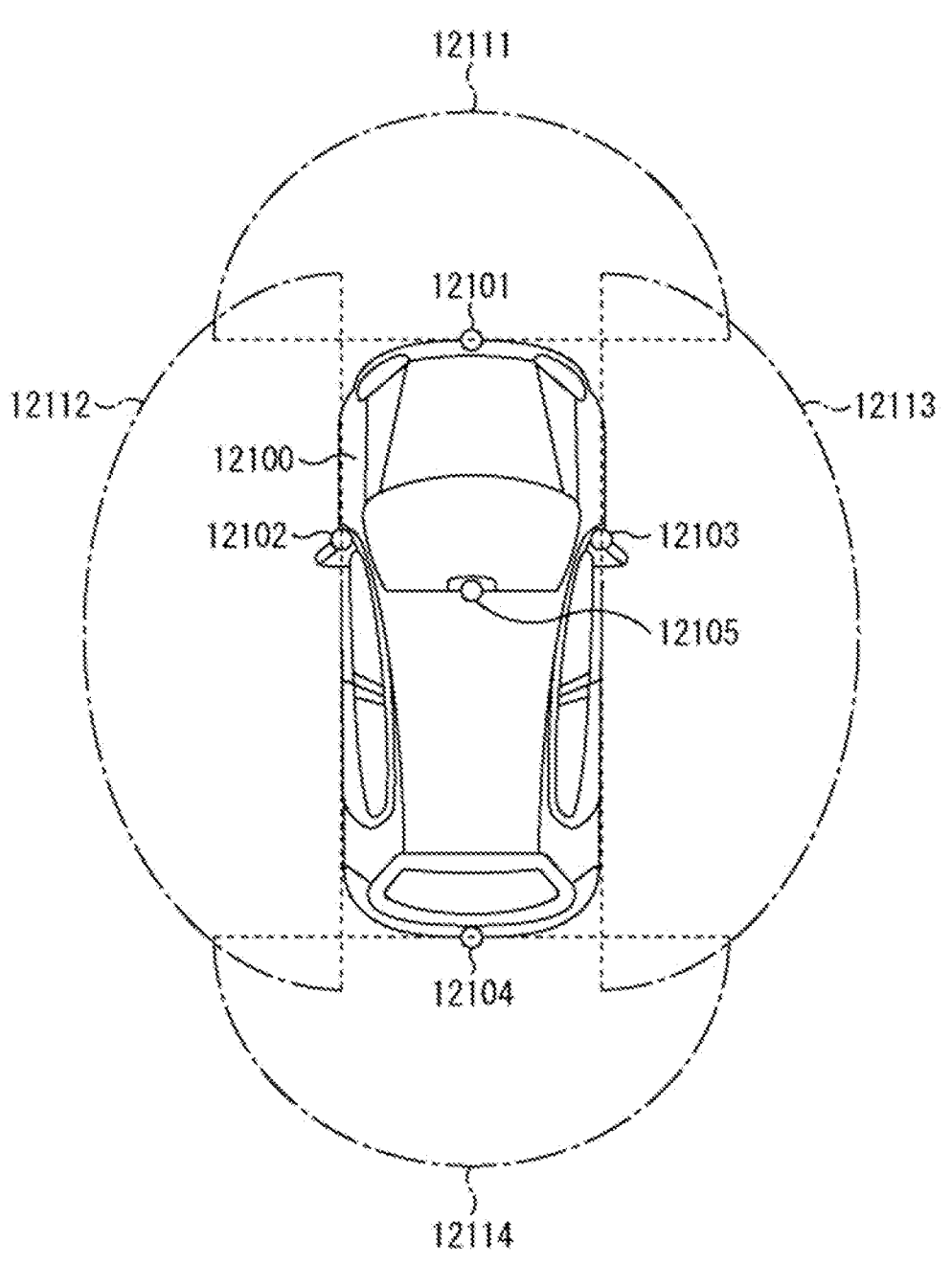
FIG. 57 is a diagram of assistance in explaining an example of installation positions of an outside-vehicle information detecting section and an imaging section.

FIG. 57 is a diagram depicting an example of the installation position of the imaging section 12031.

In FIG. 57, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 57 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure may be applied to, for example, the imaging section 12031 and the like among the above-described configurations. The imaging sections 12101, 12102, 12103, 12104, 12105, and the like depicted in FIG. 57 may be mounted on the vehicle 12100. By applying the technology according to the present disclosure to the imaging sections 12101, 12102, 12103, 12104, 12105, and the like, the sensitivity of the imaging section 12031 can be improved. Therefore, not only a clearer image can be displayed on the driver and the like, but also the accuracy of various types of processing using the image acquired by the imaging section 12031 can be improved.

5. Application Example to Endoscopic Surgery System

The technology according to the present disclosure (the present technology) can be applied to various products. For example, the technology according to the present disclosure may be applied to an endoscopic surgery system.

Figure 58:
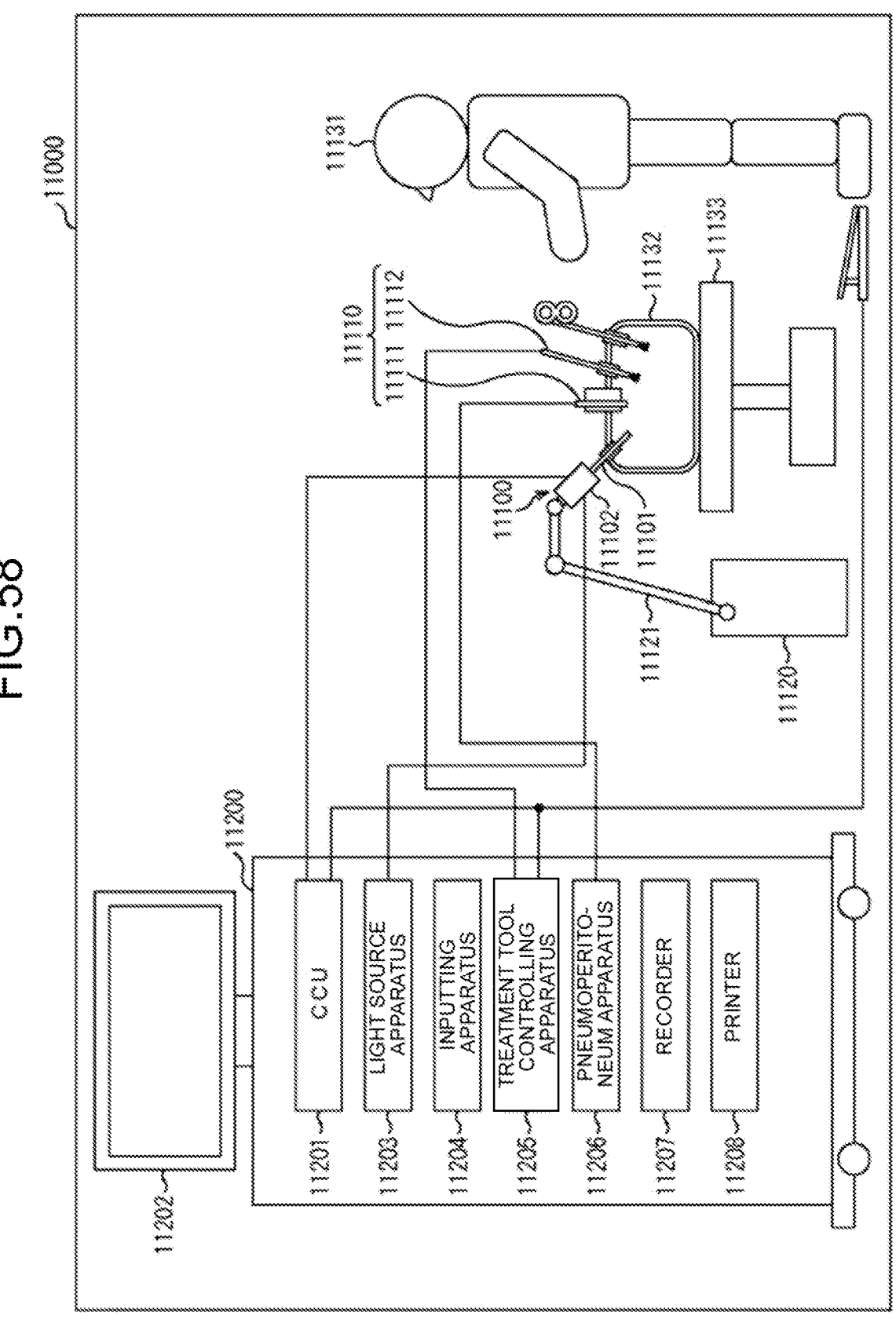
FIG. 58 is a view depicting an example of a schematic configuration of an endoscopic surgery system.

FIG. 58 is a view depicting an example of a schematic configuration of an endoscopic surgery system to which the technology according to an embodiment of the present disclosure (present technology) can be applied.

In FIG. 58, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 59:
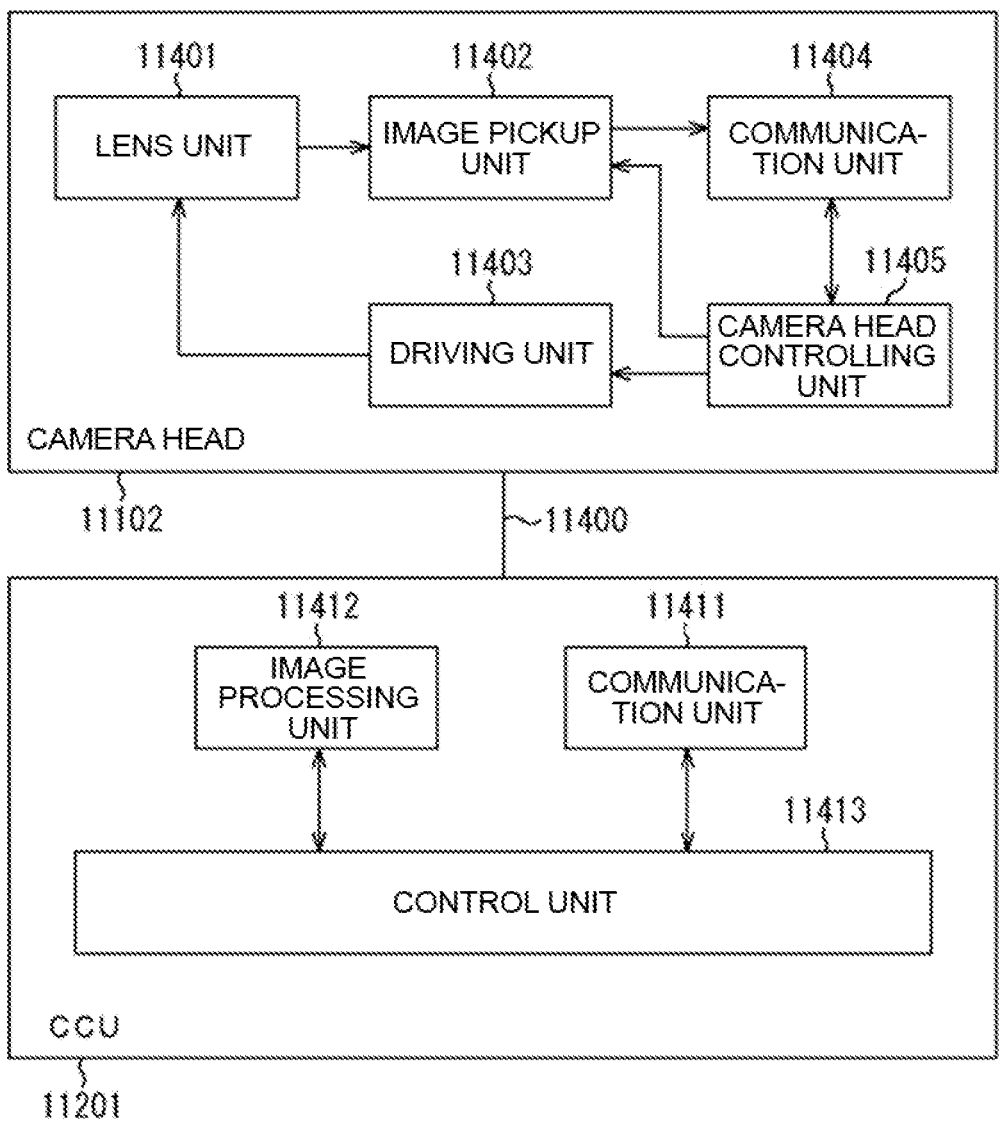
FIG. 59 is a block diagram depicting an example of a functional configuration of a camera head and a camera control unit (CCU).

FIG. 59 is a block diagram depicting an example of a functional configuration of the camera head 11102 and the CCU 11201 depicted in FIG. 58.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit

11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described. The technology according to the present disclosure may be applied to, for example, the endoscope 11100 and (the image pickup unit 11402) of the camera head 11102, (the image processing unit 11412) of the CCU 11201, and the like among the above-described configurations. By applying the technology according to the present disclosure to these configurations, it is possible to obtain an effect that a clearer image can be displayed to the operator.

Note that, here, the endoscopic surgery system has been described as an example, but the technology according to the present disclosure may be applied to, for example, a microscopic surgery system and the like.

Although the embodiments of the present disclosure have been described above, the technical scope of the present disclosure is not limited to the above-described embodiments as it is, and various modifications can be made without departing from the gist of the present disclosure. In addition, components of different embodiments and modifications may be appropriately combined.

In addition, the effects of the embodiments described in the present specification are merely examples and are not limited, and other effects may be provided.

Note that the present technology can also have the configuration below.

(1)

A solid-state imaging device including:

a plurality of pixels arranged in a matrix, wherein each of the pixels includes a first semiconductor layer, a photoelectric conversion section disposed on the first semiconductor layer on a side of a first surface, an accumulation electrode disposed on the first semiconductor layer close to a side of a second surface on a side opposite to the first surface, a wiring extending from the second surface of the first semiconductor layer, a floating diffusion region connected to the first semiconductor layer via the wiring, and a first gate electrode disposed close to the wiring.

(2)

The solid-state imaging device according to (1), wherein the accumulation electrode is disposed closer to the first semiconductor layer than the first gate electrode.

(3)

The solid-state imaging device according to (1), wherein the accumulation electrode and the first gate electrode are disposed on a same plane.

(4)

The solid-state imaging device according to any one of (1) to (3), wherein adjacent pixels among the plurality of pixels are connected to a common floating diffusion region.

(5)

The solid-state imaging device according to any one of (1) to (4), wherein each of the pixels further includes a second gate electrode disposed close to the wiring at a position closer to the floating diffusion region than the first gate electrode, and a memory electrode disposed close to the wiring at a position between the first gate electrode and the second gate electrode.

(6)

The solid-state imaging device according to (5), wherein the first gate electrode is connected between the plurality of pixels, and the memory electrode is connected between the plurality of pixels.

(7)

The solid-state imaging device according to (5) or (6), wherein each of the pixels further includes a second semiconductor layer positioned between the first semiconductor layer and the floating diffusion region, the wiring includes a first wiring extending from the first semiconductor layer and connected to the second semiconductor layer, and a second wiring extending from the second semiconductor layer and connected to the floating diffusion region, the first gate electrode is disposed close to the first wiring, the memory electrode is disposed close to the second semiconductor layer, and the second gate electrode is disposed close to the second wiring.

(8)

The solid-state imaging device according to any one of (1) to (7), wherein the first gate electrode is disposed at a position surrounding a side surface of the wiring.

(9)

The solid-state imaging device according to any one of (1) to (8), wherein the accumulation electrode is disposed at a position surrounding a side surface of the wiring.

(10)

The solid-state imaging device according to any one of (1) to (9), wherein a cross section of the wiring is circular or polygonal.

(11)

The solid-state imaging device according to any one of (1) to (10), wherein the wiring has a tapered shape having diameter decreasing from the first semiconductor layer to the floating diffusion region.

(12)

The solid-state imaging device according to any one of (1) to (11), wherein a plurality of on-chip lenses disposed on a side opposite to the first semiconductor layer with respect to the photoelectric conversion section, and at least one of the plurality of on-chip lenses is disposed to straddle at least two adjacent pixels among the plurality of pixels.

(13)

The solid-state imaging device according to any one of (1) to (12), wherein each of the pixels further includes a color filter disposed on a side of a light incident surface of the photoelectric conversion section.

(14)

The solid-state imaging device according to any one of (1) to (12), wherein each of the pixels further includes a color filter disposed on a side opposite to the photoelectric conversion section sandwiching the first semiconductor layer.

(15)

The solid-state imaging device according to any one of (1) to (14), wherein the photoelectric conversion section is an organic film.

(16)

The solid-state imaging device according to any one of (1) to (15), wherein the first semiconductor layer includes a first layer in contact with the photoelectric conversion section, and a second layer positioned on a side opposite to the photoelectric conversion section sandwiching the first layer.

(17)

The solid-state imaging device according to any one of (1) to (16), wherein each of the pixels further includes a shield electrode disposed at a boundary with an adjacent pixel.

(18)

The solid-state imaging device according to any one of (1) to (16), wherein each of the pixels further includes a fixed charge film disposed at a boundary with an adjacent pixel.

(19)

The solid-state imaging device according to (18), wherein the fixed charge film has a same polarity as a polarity of a charge generated by photoelectric conversion by the photoelectric conversion section.

(20)

An electronic apparatus including:

the solid-state imaging device according to any one of (1) to (19);

a lens that forms an image of incident light on the solid-state imaging device; and a processing circuit that executes predetermined processing on a signal output from the solid-state imaging device.

REFERENCE SIGNS LIST

1 ELECTRONIC APPARATUS
10-1 to 10-N, 10a, 10b RGB PIXEL (PIXEL)
11 TRANSFER GATE
12, 22 RESET TRANSISTOR
13, 23 AMPLIFICATION TRANSISTOR
14, 24 SELECTION TRANSISTOR
21 TRANSFER TRANSISTOR
16 MEMORY ELECTRODE
20 IR PIXEL
25 DISCHARGE TRANSISTOR
31, 31r, 31g, 31b COLOR FILTER
32 SEALING FILM

33 TRANSPARENT ELECTRODE
34 PHOTOELECTRIC CONVERSION FILM
35 SEMICONDUCTOR LAYER
35A FIRST SEMICONDUCTOR LAYER
35B SECOND SEMICONDUCTOR LAYER
35a FIRST LAYER
35b SECOND LAYER
36 READOUT ELECTRODE
37 ACCUMULATION ELECTRODE
41 IR FILTER
42 p-WELL REGION
43 p-TYPE SEMICONDUCTOR REGION
44 n-TYPE SEMICONDUCTOR REGION
45 LONGITUDINAL TRANSISTOR
50 SEMICONDUCTOR SUBSTRATE
51 ON-CHIP LENS
52 PLANARIZATION FILM
53 INSULATING LAYER
54 PIXEL ISOLATION SECTION
55 FIXED CHARGE FILM
56 INTERLAYER INSULATING FILM
57, 57B SHIELD ELECTRODE
58, 59 CHARGE
60 SEMICONDUCTOR WIRING
61 to 66, 71, 72, 73 WIRING
67 SHIELD CHARGE FILM
100 IMAGE SENSOR
101 PIXEL ARRAY SECTION
102 VERTICAL DRIVE CIRCUIT
103 SIGNAL PROCESSING CIRCUIT
103a AC CONVERSION CIRCUIT
104 HORIZONTAL DRIVE CIRCUIT
105 SYSTEM CONTROL CIRCUIT
108 DATA PROCESSING UNIT
109 DATA STORAGE SECTION
110, 110A UNIT PIXEL
121 LIGHT RECEIVING CHIP
122 CIRCUIT CHIP
901 SUBJECT
1010 LASER LIGHT SOURCE
1011 LIGHT SOURCE DRIVING UNIT
1012 VCSEL
1021 SENSOR CONTROL UNIT
1022 LIGHT RECEIVING SECTION
1030 IRRADIATION LENS
1040 IMAGING LENS
1050 SYSTEM CONTROL SECTION
1100 APPLICATION PROCESSOR
ASE ACCUMULATION REGION
LD, LD1, LD2 PIXEL DRIVE LINE
MEM MEMORY (MEMORY REGION)
PD1, PD2 PHOTOELECTRIC CONVERSION SECTION
SLD SHIELD REGION
TG, TX GATE REGION
VSL, VSL1, VSL2 VERTICAL SIGNAL LINE

What is claimed is:

1. A solid-state imaging device, including:

a plurality of pixels arranged in a matrix, wherein each of the pixels includes:

a first semiconductor layer;

a photoelectric conversion section disposed above the first semiconductor layer on a side of a first surface of the first semiconductor layer;

an accumulation electrode disposed below the first semiconductor layer close to a side of a second surface of the first semiconductor layer on a side opposite to the first surface of the first semiconductor layer;

a readout electrode, wherein at least a portion of the accumulation electrode is disposed between the readout electrode and the photoelectric conversion section;

a semiconductor wiring extending from the second surface of the first semiconductor layer to the readout electrode, wherein the semiconductor wiring is a part of the first semiconductor layer;

a floating diffusion region connected to the first semiconductor layer via at least the semiconductor wiring and the readout electrode; and a first gate electrode disposed close to the semiconductor wiring.

2. The solid-state imaging device according to claim 1, wherein the accumulation electrode is disposed closer to the first semiconductor layer than the first gate electrode.

3. The solid-state imaging device according to claim 1, wherein the accumulation electrode and the first gate electrode are disposed on a same plane.

4. The solid-state imaging device according to claim 1, wherein adjacent pixels among the plurality of pixels are connected to a common floating diffusion region.

5. The solid-state imaging device according to claim 1, wherein each of the pixels further includes a second gate electrode disposed close to the semiconductor wiring at a position closer to the floating diffusion region than the first gate electrode, and a memory electrode disposed close to the semiconductor wiring at a position between the first gate electrode and the second gate electrode.

6. The solid-state imaging device according to claim 5, wherein the first gate electrode is connected between the plurality of pixels, and the memory electrode is connected between the plurality of pixels.

7. The solid-state imaging device according to claim 5, wherein each of the pixels further includes a second semiconductor layer positioned between the first semiconductor layer and the floating diffusion region, the semiconductor wiring includes a first wiring extending from the first semiconductor layer and connected to the second semiconductor layer, and a second wiring extending from the second semiconductor layer and connected to the floating diffusion region, the first gate electrode is disposed close to the first wiring, the memory electrode is disposed close to the second semiconductor layer, and the second gate electrode is disposed close to the second wiring.

8. The solid-state imaging device according to claim 1, wherein the first gate electrode is disposed at a position surrounding a side surface of the semiconductor wiring.

9. The solid-state imaging device according to claim 1, wherein the accumulation electrode is disposed at a position surrounding a side surface of the semiconductor wiring.

10. The solid-state imaging device according to claim 1, wherein a cross section of the semiconductor wiring is circular or polygonal.

11. The solid-state imaging device according to claim 1, wherein the semiconductor wiring has a tapered shape having diameter decreasing from the first semiconductor layer to the floating diffusion region.

12. The solid-state imaging device according to claim 1, wherein a plurality of on-chip lenses disposed on a side opposite to the first semiconductor layer with respect to the photoelectric conversion section, and at least one of the plurality of on-chip lenses is disposed to straddle at least two adjacent pixels among the plurality of pixels.

13. The solid-state imaging device according to claim 1, wherein each of the pixels further includes a color filter disposed on a side of a light incident surface of the photoelectric conversion section.

14. The solid-state imaging device according to claim 1, wherein each of the pixels further includes a color filter disposed on a side opposite to the photoelectric conversion section sandwiching the first semiconductor layer.

15. The solid-state imaging device according to claim 1, wherein the photoelectric conversion section is an organic film.

16. The solid-state imaging device according to claim 1, wherein the first semiconductor layer includes a first layer in contact with the photoelectric conversion section, and a second layer positioned on a side opposite to the photoelectric conversion section sandwiching the first layer.

17. The solid-state imaging device according to claim 1, wherein each of the pixels further includes a shield electrode disposed at a boundary with an adjacent pixel.

18. The solid-state imaging device according to claim 1, wherein each of the pixels further includes a fixed charge film disposed at a boundary with an adjacent pixel.

19. The solid-state imaging device according to claim 18, wherein the fixed charge film has a same polarity as a polarity of a charge generated by photoelectric conversion by the photoelectric conversion section.

20. An electronic apparatus, including:

the solid-state imaging device according to claim 1;

a lens that forms an image of incident light on the solid-state imaging device; and a processing circuit that executes predetermined processing on a signal output from the solid-state imaging device.

* * * * *